(12) United States Patent
Chen et al.

(10) Patent No.: US 12,489,077 B2
(45) Date of Patent: *Dec. 2, 2025

(54) SEMICONDUCTOR STRUCTURE AND METHOD MANUFACTURING THE SAME

(71) Applicant: Taiwan Semiconductor Manufacturing Company, Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 439 days.

This patent is subject to a terminal disclaimer.

(21) Appl. No.: 17/872,008

(22) Filed: Jul. 25, 2022

(65) Prior Publication Data

US 2022/0359449 A1 Nov. 10, 2022

Related U.S. Application Data

(63) Continuation of application No. 16/843,860, filed on Apr. 8, 2020.

(60) Provisional application No. 62/865,325, filed on Jun. 24, 2019.

(51) Int. Cl.
*H01L 23/31* (2006.01)
*H01L 21/56* (2006.01)
(Continued)

(52) U.S. Cl.
CPC .............. *H01L 24/20* (2013.01); *H01L 21/56* (2013.01); *H01L 23/3107* (2013.01);
(Continued)

(58) Field of Classification Search
None
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Bilkis Jahan
(74) *Attorney, Agent, or Firm* — JCIPRNET

(57) ABSTRACT

A semiconductor structure includes a first semiconductor device, a second semiconductor device, a connection device and a redistribution circuit structure. The first semiconductor device is bonded on the second semiconductor device. The connection device is bonded on the second semiconductor device and arranged aside of the first semiconductor device, wherein the connection device includes a first substrate and conductive vias penetrating through the first substrate and electrically connected to the second semiconductor device. The redistribution circuit structure is located over the second semiconductor device, wherein the first semiconductor device and the connection device are located between the redistribution circuit structure and the second semiconductor device. The redistribution circuit structure and the first semiconductor device are electrically connected to the second semiconductor device through the conductive vias of the connection device.

20 Claims, 47 Drawing Sheets

(51) Int. Cl.
*H01L 23/00* (2006.01)
*H01L 23/48* (2006.01)
*H01L 23/522* (2006.01)
*H01L 23/528* (2006.01)

(52) U.S. Cl.
CPC ........ *H01L 23/481* (2013.01); *H01L 23/5226* (2013.01); *H01L 23/5283* (2013.01); *H01L 24/19* (2013.01); *H01L 24/82* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0193226 A1* | 8/2011 | Kirby .................. H01L 23/5283 257/E21.585 |
| 2011/0248396 A1* | 10/2011 | Liu ..................... H01L 25/0657 438/459 |
| 2015/0262877 A1* | 9/2015 | Kurita .................... H01L 24/17 257/737 |
| 2015/0303174 A1* | 10/2015 | Yu ........................ H01L 21/565 438/109 |
| 2017/0098629 A1* | 4/2017 | Liu ........................ H01L 24/20 |
| 2019/0148276 A1* | 5/2019 | Chen ..................... H01L 21/563 257/774 |

\* cited by examiner

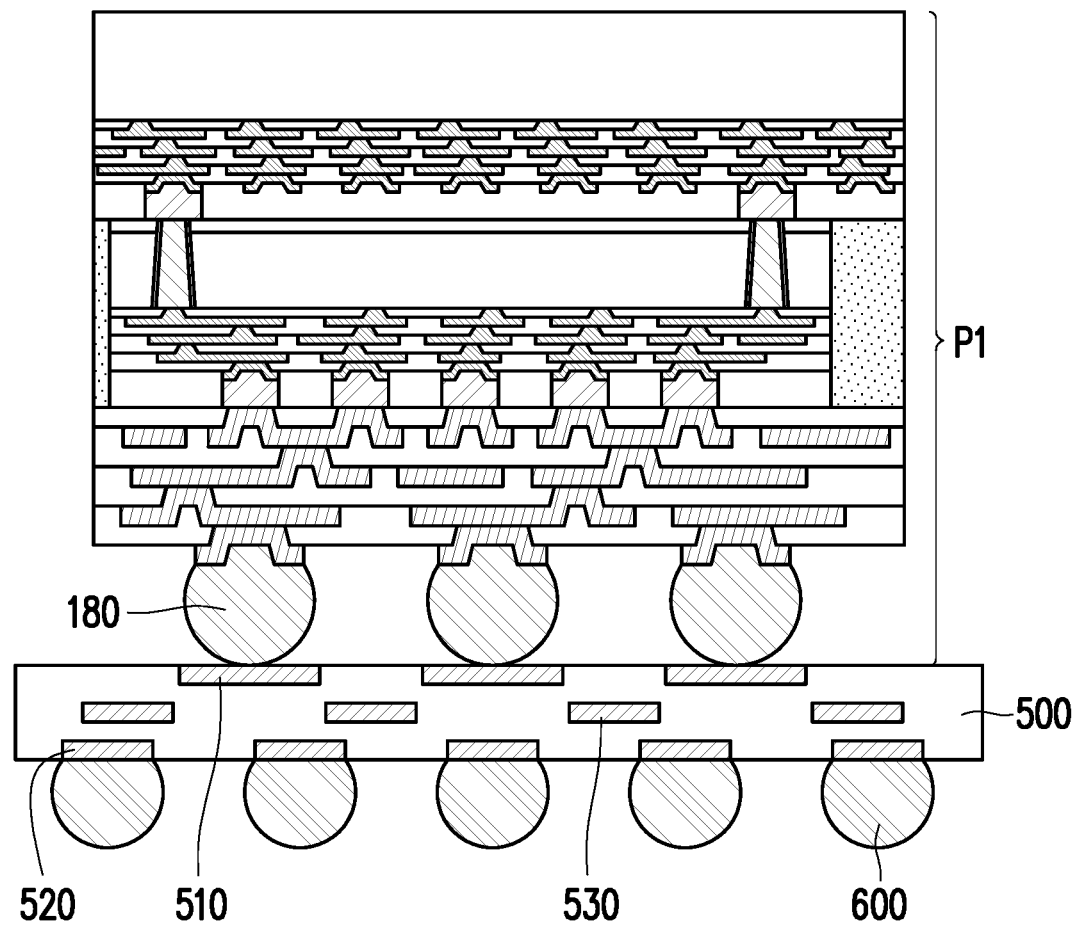
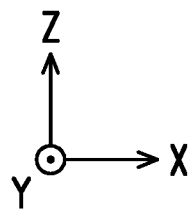
FIG. 45

SEMICONDUCTOR STRUCTURE AND METHOD MANUFACTURING THE SAME

CROSS-REFERENCE TO RELATED APPLICATION

This application is a continuation application of and claims the priority benefit of a prior application Ser. No. 16/843,860, filed on Apr. 8, 2020, which claims the priority benefit of U.S. provisional application Ser. No. 62/865,325, filed on Jun. 24, 2019. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 45 is a schematic cross-sectional view of a semiconductor structure in accordance with some embodiments of the disclosure.

DETAILED DESCRIPTION

Figure 1:
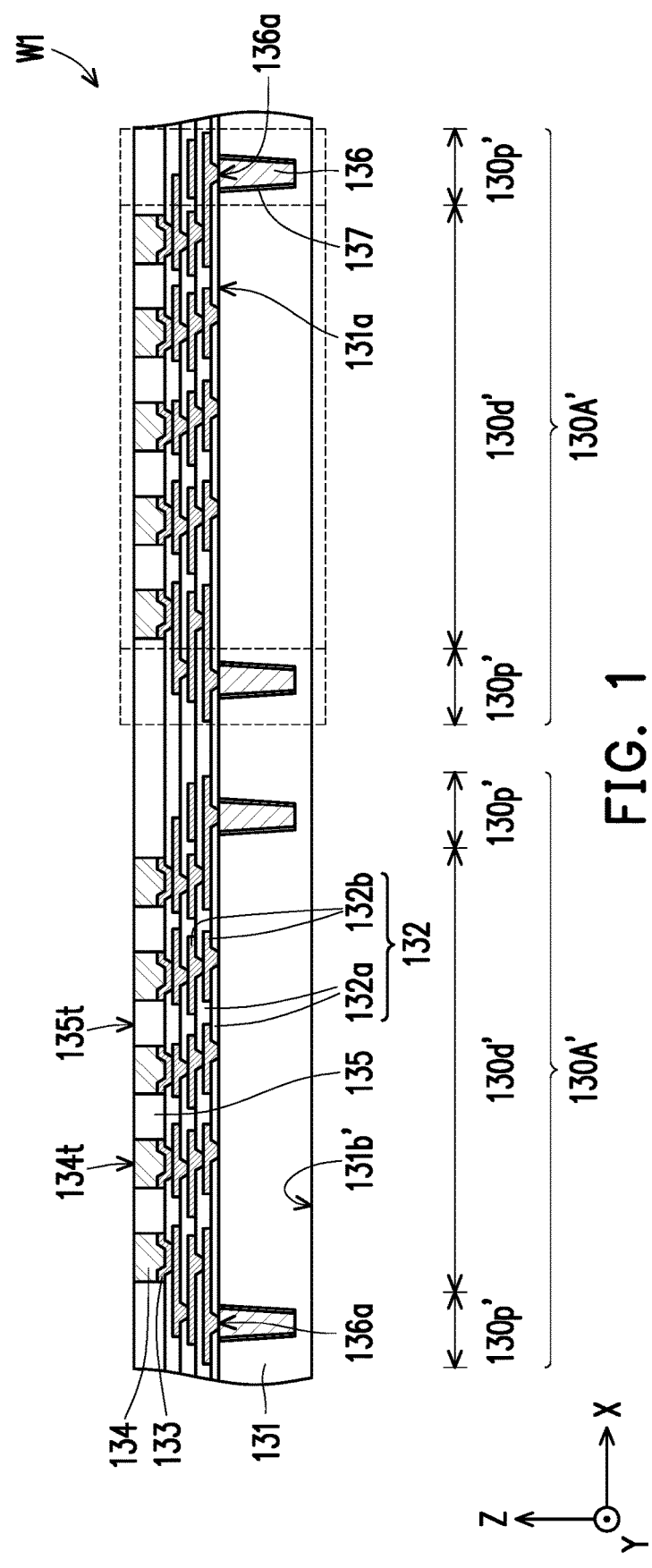
FIG. 1 through FIG. 14 are schematic cross-sectional views showing various stages in a manufacturing method of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 15:
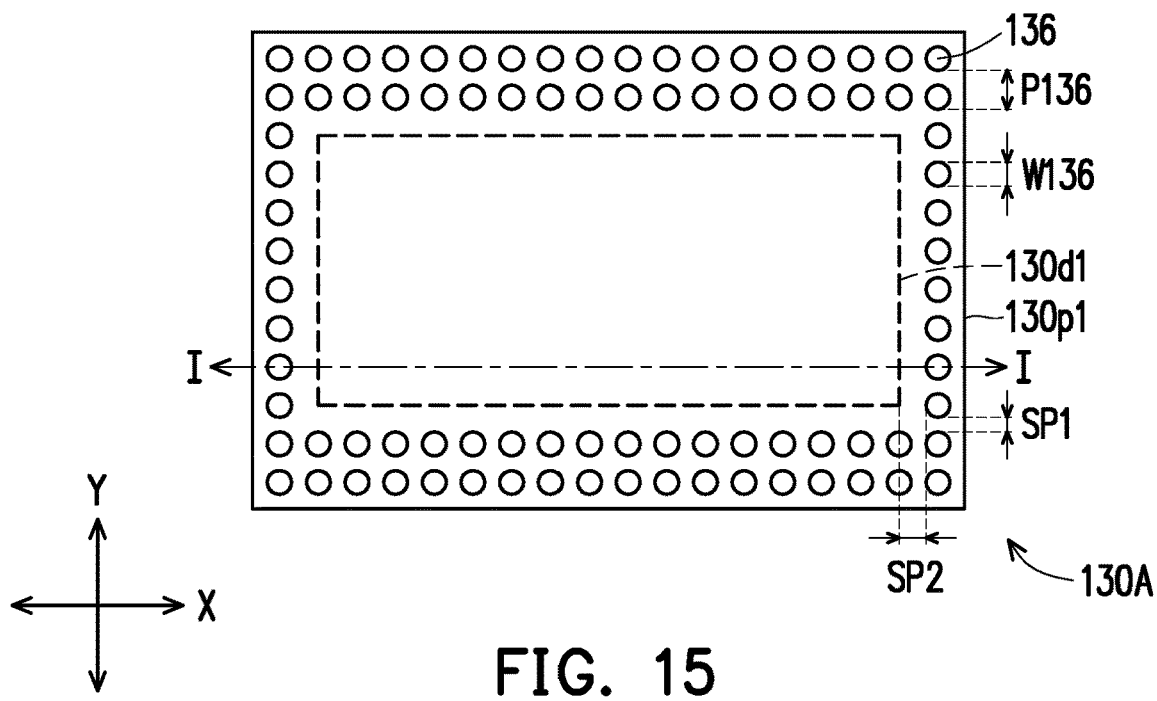
FIG. 15 is a schematic top view illustrating a relative position between a semiconductor die and through silicon vias of a semiconductor structure in accordance with some embodiments of the disclosure.
Figure 16:
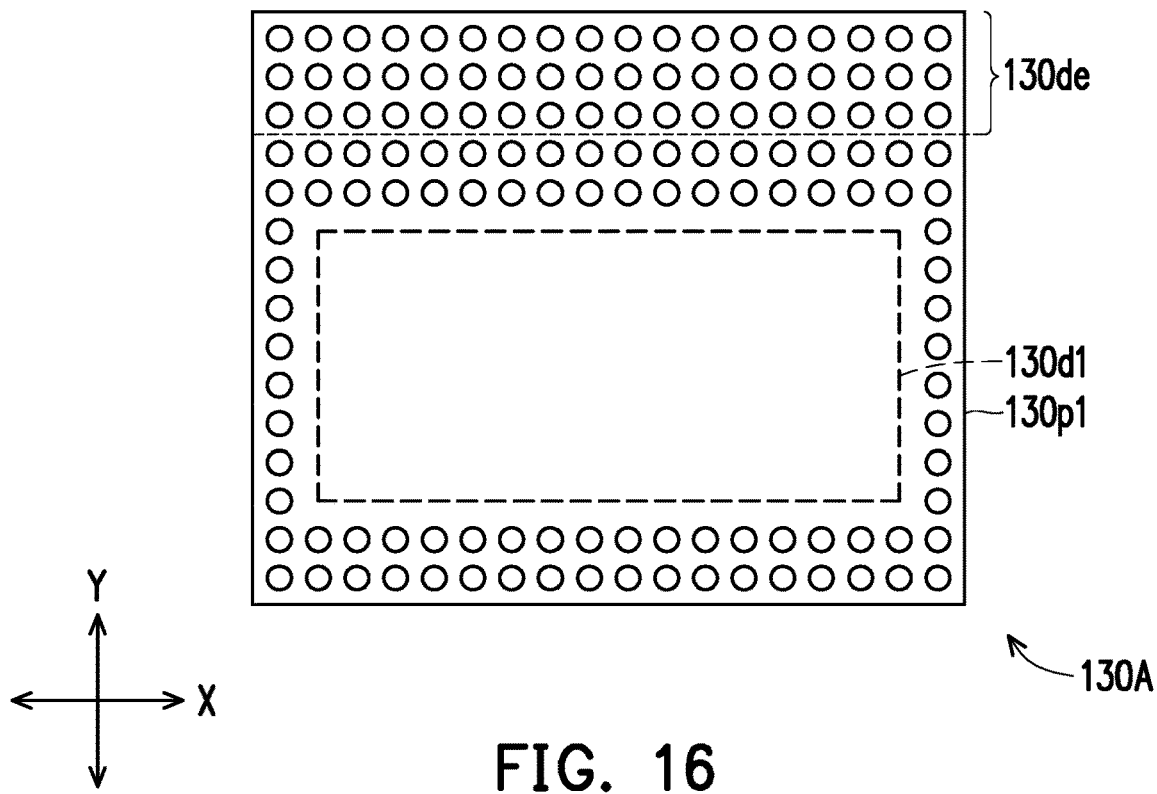
FIG. 16 is a schematic top view illustrating a relative position between a semiconductor die and through silicon vias of a semiconductor structure in accordance with some embodiments of the disclosure.

FIG. 1 through FIG. 14 are schematic cross-sectional views showing various stages in a manufacturing method of a semiconductor structure in accordance with some embodiments of the disclosure. FIG. 15 is a schematic top view illustrating a relative position between a semiconductor die and through silicon vias of a semiconductor structure in accordance with some embodiments of the disclosure, where FIG. 1 through FIG. 14 are the schematic cross-sectional views taken along a cross-sectional line I-I depicted in FIG. 15. FIG. 16 is a schematic top view illustrating a relative position between a semiconductor die and through silicon vias of a semiconductor structure in accordance with some embodiments of the disclosure. In some embodiments, the manufacturing method is part of a semiconductor packaging process. In FIG. 1 to FIG. 14, more than one semiconductor chips or dies are shown to represent plural semiconductor chips or dies of the wafer, and one semiconductor (package) structure is shown to represent plural semiconductor (package) structures obtained following the semiconductor manufacturing method, however the disclosure is not limited thereto. In other embodiments, one or more than one semiconductor chips or dies are shown to represent plural semiconductor chips or dies of the wafer, and one or more than one semiconductor (package) structure are shown to represent plural semiconductor (package) structures obtained following the semiconductor manufacturing method, however the disclosure is not limited thereto. For example, two semiconductor chips or integrated circuit components are shown to represent plural devices or chips of a wafer, the disclosure is not limited thereto.

Referring to FIG. 1, in some embodiments, a wafer W1 including a plurality of integrated circuit components 130A' arranged in an array is provided. Before performing a wafer sawing or dicing process on the wafer W1, the integrated circuit components 130A' of the wafer W1 are connected to one another, as shown in FIG. 1, for example. In some embodiments, each of the integrated circuit components 130A' includes a semiconductor substrate 131 having semiconductor devices (not shown) formed therein, an interconnect structure 132 formed on the semiconductor substrate 131, a plurality of connecting pads 133 formed on the interconnect structure 132, a plurality of connecting vias 134 formed on the interconnect structure 132, a protection layer 135 covers the interconnect structure 132, the connecting pads 133 and the connecting vias 134, and one or more conductive vias 136 formed in the semiconductor substrate 131.

In some embodiments, the semiconductor substrate 131 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 131 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the semiconductor substrate 131 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 131a of the semiconductor substrate 131 proximal to the interconnect structure 132. In some embodiments, as shown in FIG. 1, the semiconductor substrate 131 has the active surface 131a and a bottom surface 131b' opposite to the active surface 131a, and the interconnect structure 132 is disposed on and covers the active surface 131a of the semiconductor substrate 131.

The semiconductor substrate 131 may include circuitry (not shown) formed in a front-end-of-line (FEOL), and the interconnect structure 132 may be formed in a back-end-of-line (BEOL). In some embodiments, the interconnect structure 132 includes an inter-layer dielectric (ILD) layer formed over the semiconductor substrate 131 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 132 including one or more dielectric layers 132a and one or more metallization patterns 132b in alternation. The metallization patterns 132b may be embedded in the dielectric layers 132a. In some embodiments, the interconnect structure 132 is electrically coupled to the semiconductor devices formed in and/or on the semiconductor substrate 131 to one another and to external components (e.g., test pads, bonding conductors, etc.) formed thereon. For example, the metallization patterns 132b in the dielectric layers 132a route electrical signals between the semiconductor devices of the semiconductor substrate 131. The semiconductor devices and the metallization patterns 132b are interconnected to perform one or more functions including memory structures (e.g., a memory cell), processing structures (e.g., a logic cell), input/output (I/O) circuitry (e.g. an I/O cell), or the like. The uppermost layer of the interconnect structure 132 may be a passivation layer made of one or more suitable dielectric materials such as silicon oxide, silicon nitride, low-k dielectrics, polyimide, combinations of these, or the like. In some embodiments, as shown in FIG. 1, the passivation layer (e.g. the uppermost layer of the dielectric layers 132a) of the interconnect structure 132 has an opening exposing at least a portion of a topmost layer of the metallization patterns 132b for further electrical connection.

The dielectric layers 132a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 132a are formed by suitable fabrication techniques such as spin-on coating, chemical vapor deposition (CVD), plasma-enhanced chemical vapor deposition (PECVD) or the like.

The metallization patterns 132b may be made of conductive materials formed by electroplating or deposition, such as copper, copper alloy, aluminum, aluminum alloy, or combinations thereof, which may be patterned using a photolithography and etching process. In some embodiments, the metallization patterns 132b are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 132a and the number of the metallization layers 132b are not limited in the disclosure, and may be selected and designated based on demand and design layout.

In some embodiments, as illustrated in FIG. 1, the connecting pads 133 are disposed over and electrically coupled to the topmost layer of the metallization patterns 132b of the interconnect structure 132 exposed by the passivation layer (e.g. the uppermost layer of the dielectric layers 132a) of the interconnect structure 132 for testing and/or further electrical connection. The connecting pads 133 may be made of aluminum or alloys thereof or the like, and may be formed by an electroplating process. The disclosure is not limited thereto. Some of the connecting pads 133 may be testing pads, and some of the connecting pads 133 may be conductive pads for further electrical connection.

In some embodiments, the connecting vias 134 are respectively disposed on and electrically connected to the connecting pads 133 for providing an external electrical connection to the circuitry and semiconductor devices. In one embodiment, the connecting vias 134 may be formed of conductive materials such as copper, gold, aluminum, the like, or combinations thereof, and may be formed by an electroplating process or the like. The connecting vias 134 may be bond vias or bond bumps. The disclosure is not limited thereto. The connecting vias 134 may serve as bonding conductors for further electrical connection and may be formed over the connecting pads 133 (serving as the conductive pads for further electrical connection). The connecting vias 134 may be electrically coupled to the semiconductor devices of the semiconductor substrate 131 through the interconnect structure 132 and the connecting pads 133.

Figure 48:
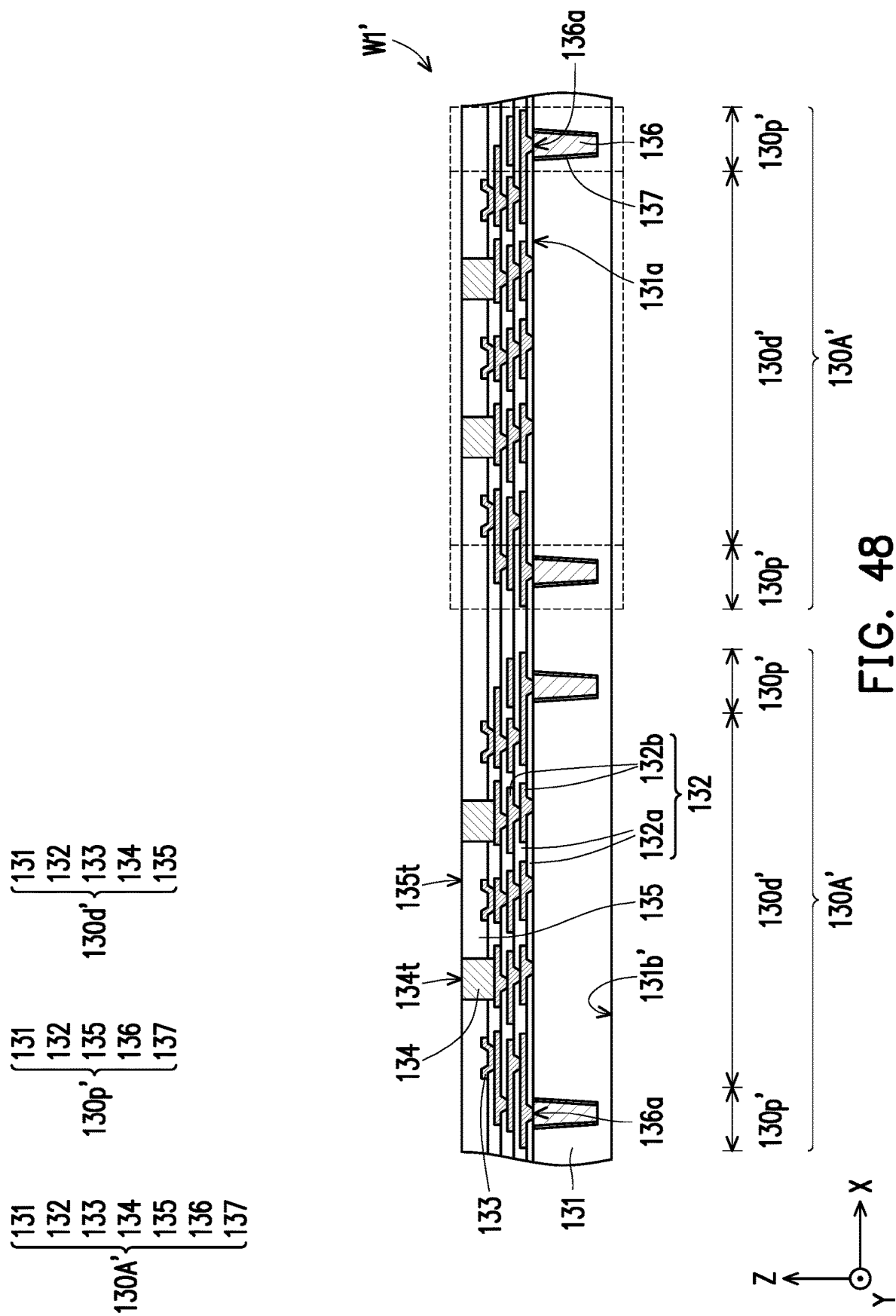
FIG. 48 is a schematic cross-sectional view of semiconductor dies includes in a semiconductor wafer in accordance with some embodiments of the disclosure.

Alternatively, the connecting vias 134 may be formed over the interconnect structure 132. For example, the connecting vias 134 are disposed on and electrically connected to the topmost layer of the metallization patterns 132b of the interconnect structure 132 exposed by the passivation layer (e.g. the uppermost layer of the dielectric layers 132a) of the interconnect structure 132 (FIG. 48). That is, the connecting vias 134 and the connecting pads 133 may all be disposed on the topmost layer of the metallization patterns 132b of the interconnect structure 132 exposed by the passivation layer in a manner of side-by-side. In such embodiments, the connecting pads 133 may be testing pads for testing while the connecting vias 134 may be the bonding conductors for further electrical connection. The connecting vias 134 may be electrically coupled to the semiconductor devices of the semiconductor substrate 131 through the interconnect structure 132.

In some embodiments, the protection layer 135 is formed on the interconnect structure 120 to cover the interconnect structure 132 and the connecting pads 133 and to laterally cover the connecting vias 134. That is to say, the protection layer 135 prevents any possible damage(s) occurring on the connecting pads 133 and the connecting vias 134 during the transfer of the integrated circuit component 130A'. In addition, in some embodiments, the protection layer 135 further acts as a passivation layer for providing better planarization and evenness. In some embodiments, top surfaces 134t of the connecting vias 134 are substantially leveled with a surface 135t of the protection layer 135 for further electrical connection, as shown in FIG. 1.

The protection layer 135 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, polyimide (PI), the like, or a combination thereof. It should be appreciated that the protection layer 135 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the conductive vias 136 are embedded in the semiconductor substrate 131. For example, the conductive vias 136 are formed in the semiconductor substrate 131 and extended from the active surface 131a towards the bottom surface 131b' along a stacking direction Z of the semiconductor substrate 131 and the interconnect structure 132. As shown in FIG. 1, top surfaces 136a of the conductive vias 136 are substantially coplanar to the active surface 131a of the semiconductor substrate 131 to be in contact with a bottommost layer of the metallization layer s 132b exposed by a lowest layer of the dielectric layers 132a of the interconnect structure 132. In some embodiments, the conductive vias 136 are not accessibly revealed by the bottom surface 131b' of the semiconductor substrate 131. In some embodiments, the conductive vias 136 may be tapered from the interconnect structure 132 to the bottom surface 131b'. Alternatively, the conductive vias 136 have substantially vertical sidewalls. In a cross-sectional view along the stacking direction Z, the shape of the conductive vias 136 may depend on the design requirements, and is not intended to be limiting in the disclosure. On the other hand, in a top (plane) view on a X-Y plane (FIG. 15), the shape of the conductive vias 136 is circular shape. However, depending on the design requirements, and the shape of the conductive vias 136 may be an oval shape, a rectangular shape, a polygonal shape, or combinations thereof; the disclosure is not limited thereto. In some embodiments, viewing from the X-Y plane shown in FIG. 15, a maximum size W136 of each of the conductive vias 136 is approximately ranging from 0.5 μm to 25 μm. In some embodiments, viewing from the X-Y plane shown in FIG. 15, a pitch P136 of the conductive vias 136 is approximately ranging from 1 μm to 50 μm. In some embodiments, viewing from the X-Y plane shown in FIG. 15, a spacing distance SP1 between any two adjacent conductive vias 136 is approximately ranging from 0.5 μm to 25 μm.

In some embodiments, the conductive vias 136 are in physical contact with the bottommost layer of the metallization patterns 132b of the interconnect structure 132 exposed by the lowest layer of the dielectric layers 132a of the interconnect structure 132 at the active surface 131a, as illustrated in FIG. 1. That is, the conductive vias 136 are electrically connected to the semiconductor devices in the semiconductor substrate 131 through the interconnect structure 132, and are electrically connected to the connecting vias 134 through the interconnect structure 132 and the connecting pads 133. The conductive vias 136 may be formed of a conductive material, such as copper, tungsten, aluminum, silver, combinations thereof, or the like.

In some embodiments, each of the conductive vias 136 is at least partially covered by a liner 137. For example, the liners 137 are formed between the conductive vias 136 and the semiconductor substrate 131. The liners 137 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 137 and the semiconductor substrate 131. In some embodiments, the conductive vias 136, the liners 137 and the optional dielectric liner are formed by forming recesses in the semiconductor substrate 131 and respectively depositing the dielectric material, the barrier material, and the conductive material in the recesses, removing excess materials on the semiconductor substrate 131. For example, the recesses of the semiconductor substrate 131 are lined with the dielectric liner so as to laterally separate the liners 137 lining sidewalls of the conductive vias 136 from the semiconductor substrate 131. The conductive vias 136 are formed by using a via-first approach, in certain embodiments. In such embodiments, the conductive vias 136 are formed prior to the formation of the interconnect structure 132. As shown in FIG. 1, in some embodiments, the conductive vias 136 are separated from the semiconductor substrate 131 through at least the liners 137. Alternatively, the liners 137 may be omitted.

Alternatively, the conductive vias 136 may be formed by using a via-last approach, and may be formed after the formation of interconnect structure 132 (FIG. 17 through FIG. 28 and FIG. 34 through FIG. 39). The disclosure is not limited thereto. The numbers of the connecting pads 133, the connecting vias 134 and conductive vias 136 are not limited in the disclosure, and may be selected and designated based on demand and design layout.

Continued on FIG. 1, in some embodiments, the wafer W1 has a plurality of device portions 130d' and a plurality of periphery portions 130p' arranged aside of the device portions 130d'. In some embodiments, each of the device portions 130d' includes the semiconductor substrate 131, the interconnect structure 132, the connecting pads 133, the connecting vias 134 and the protection layer 135. In some embodiments, each of the periphery portions 130p' includes the semiconductor substrate 131, the interconnect structure 132, the protection layer 135, the conductive vias 136 and the liners 137. In some embodiments, the interconnect structures 132 of the periphery portions 130p' and the interconnect structure 132 of the device portions 130d' are interconnected, such that the periphery portions 130p' are electrically connected to the device portions 130d'. For example, the connecting vias 134 of the device portions 130d' are electrically connected to the conductive vias 136 of the periphery regions 130p' through the interconnect structures 132 of the periphery portions 130p' and the interconnect structure 132 of the device portions 130d'.

Figure 2:
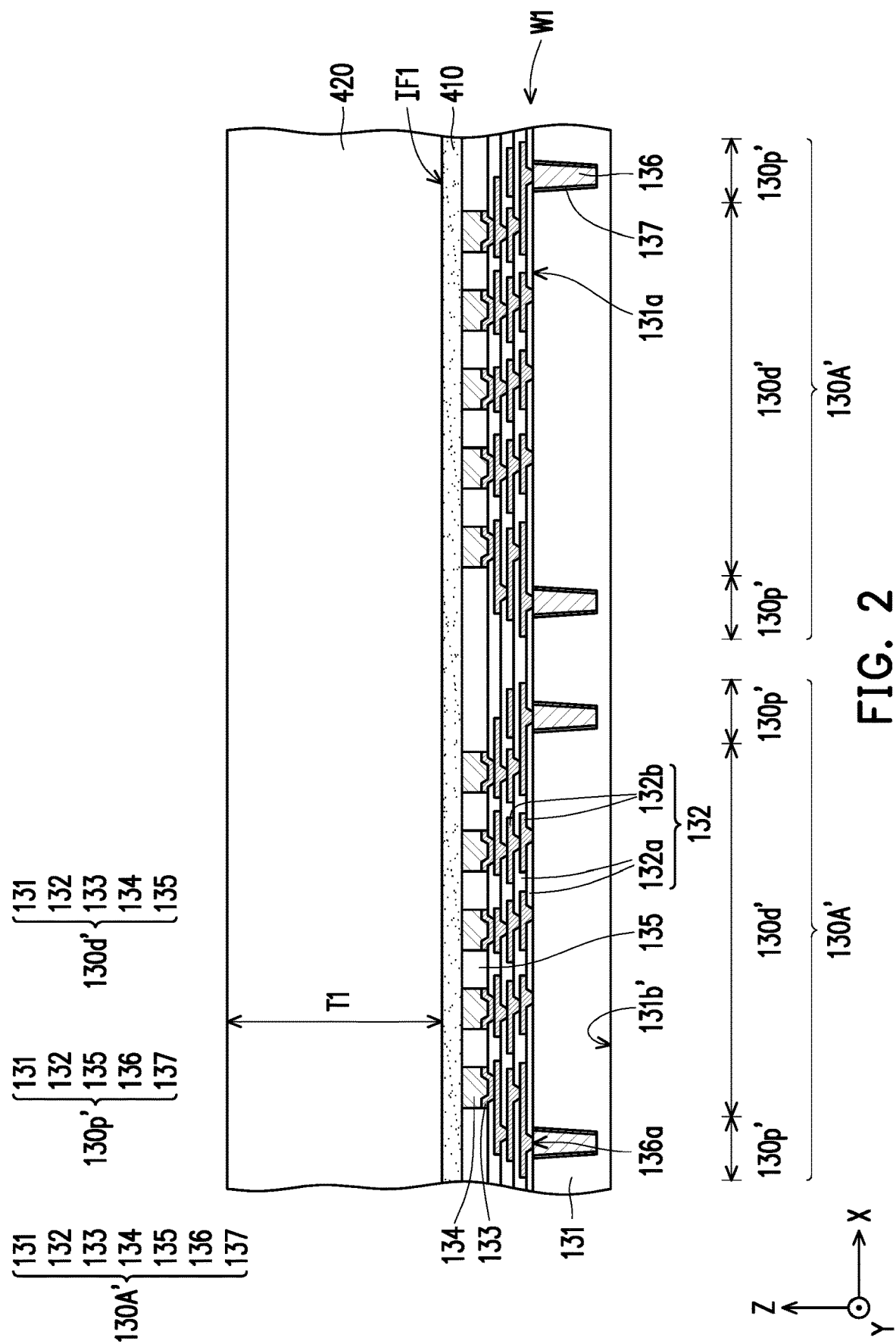

Referring to FIG. 2, in some embodiments, a bonding layer 410 is formed on the wafer W1, and a semiconductor substrate 420 is disposed on the bonding layer 410. For example, the bonding layer 410 is a smooth layer having a continuous even surface and overlaid on the top surfaces of the connecting vias 134 and the surface of the protection layer 135 of the integrated circuit components 130A' included in the wafer W1, for example. In some embodiments, the bonding layer 410 is formed in a form of a blanket layer entirely covering the wafer W1. In some embodiments, a material of the bonding layer 410 is made of silicon oxynitride, and may be formed by deposition or the like. In an alternative embodiment, the material of the bonding layer 410 is made of silicon oxide, silicon nitride or the like. Due to the top surfaces of the connecting vias 134 and the surface of the protection layer 135 of the integrated circuit components 130A' included in the wafer W1 has the high degree of planarity and flatness, the bonding layer 410 is capable of having a substantially uniform and even thickness, for example.

In some embodiments, the semiconductor substrate 420 is provided to be disposed on the bonding layer 410. As shown in FIG. 2, the bonding layer 410 is located between the semiconductor substrate 420 and the wafer W1 (including the integrated circuit components 130A'), for example. In certain embodiments, through the bonding layer 410, the semiconductor substrate 420 is bonded on the integrated circuit components 130A' by fusion bonding. In such embodiments, the fusion bonding is a direct bonding between dielectric-to-dielectric bonding (e.g., oxide-to-oxide bonding, nitride-to-nitride bonding, or nitride-to-oxide bonding). For example, a bonding interface IF1 between the bonding layer 410 and the semiconductor substrate 420 includes a dielectric-to-dielectric bonding interface (e.g., an oxide-to-nitride bonding interface). In the disclosure, the bonding interface IF1 may be referred to as a fusion bonding interface. The fusion bonding process may include a hydrophilic fusion bonding process, where a workable temperature may be approximately greater than or substantially equal to about 100° C. and a workable pressure may be approximately greater than or substantially equal to about 1 kg/cm2. However, the disclosure is not specifically limited thereto. In some embodiments, the semiconductor substrate 420 is a reclaim silicon substrate or the like, and thus the manufacturing cost is reduced. In some embodiments, a thickness T1 of the semiconductor substrate 420 is approximately ranging from 100 μm to 800 μm.

Figure 3:
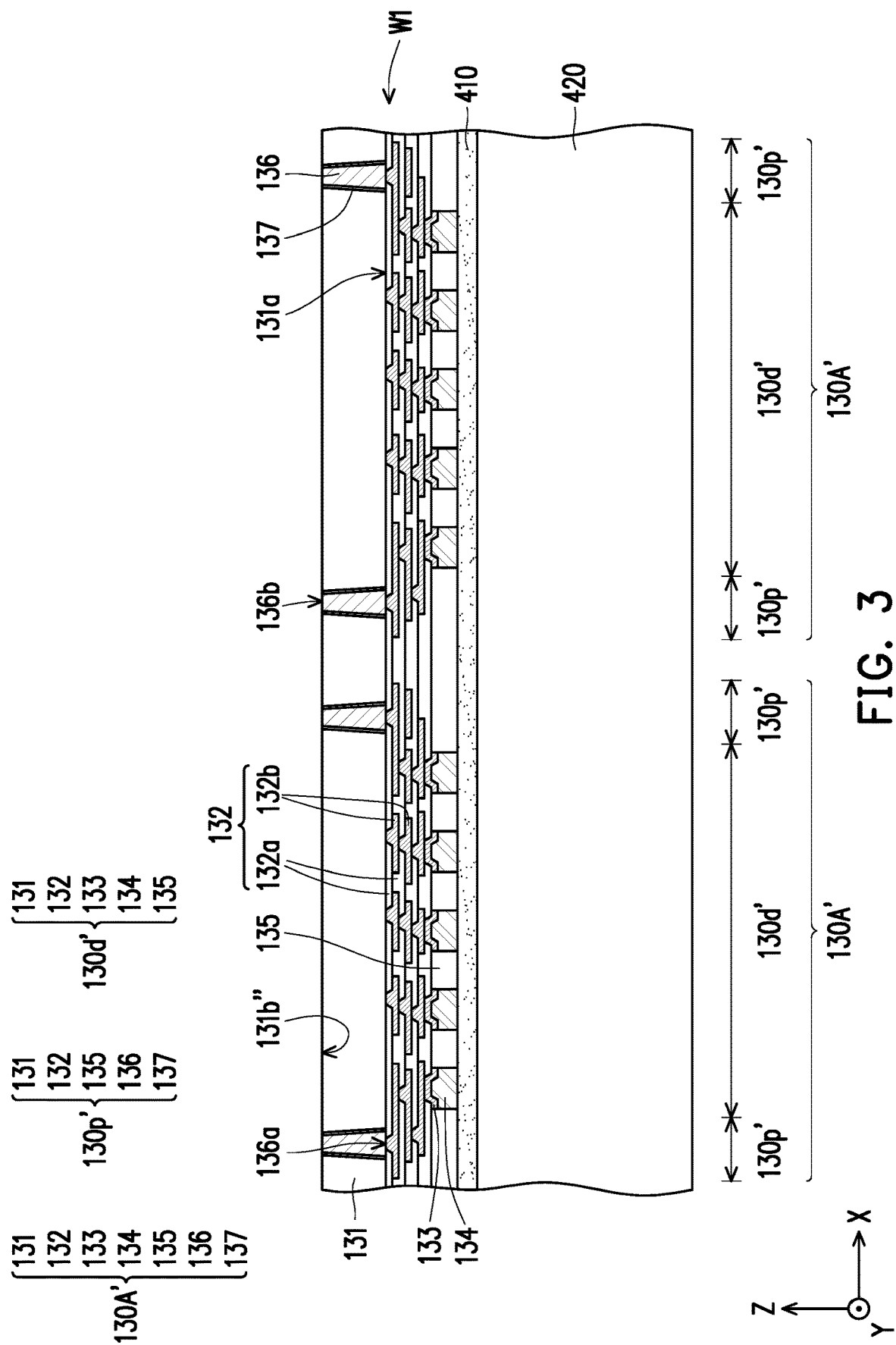

Referring to FIG. 3, in some embodiments, a first planarizing process is performed to expose the conductive vias 136 by the wafer W1. Before performing the first planarizing process, the wafer W1 may be overturned (e.g., flipped upside down along the stacking direction Z). In some embodiments, a portion of the semiconductor substrate 131 are removed by the first planarizing process, such that a bottom surface 131b" of the semiconductor substrate 131 and bottom surfaces 136b of the conductive vias 136 are substantially levelled with each other. In other words, the bottom surface 131b" of the semiconductor substrate 131 and the bottom surfaces 136b of the conductive vias 136 are substantially coplanar to each other. As shown in FIG. 3, the bottom surfaces 136b of the conductive vias 136 are accessibly revealed by the bottom surface 131b" of the semiconductor substrate 131. In the disclosure, since the conductive vias 136 extend through the semiconductor substrate 131, the conductive vias 136 may be referred to as through semiconductor vias or through silicon vias (TSVs) 136 when the semiconductor substrate 131 is a silicon substrate.

In some embodiments, the first planarizing process may include a grinding process and/or a chemical mechanical polishing (CMP) process or the like; however, the disclosure is not limited thereto. After planarizing, a cleaning process may be optionally performed, for example to clean and remove the residue generated from the first planarizing process. However, the disclosure is not limited thereto, and the first planarizing process may be performed through any other suitable method.

Figure 4:
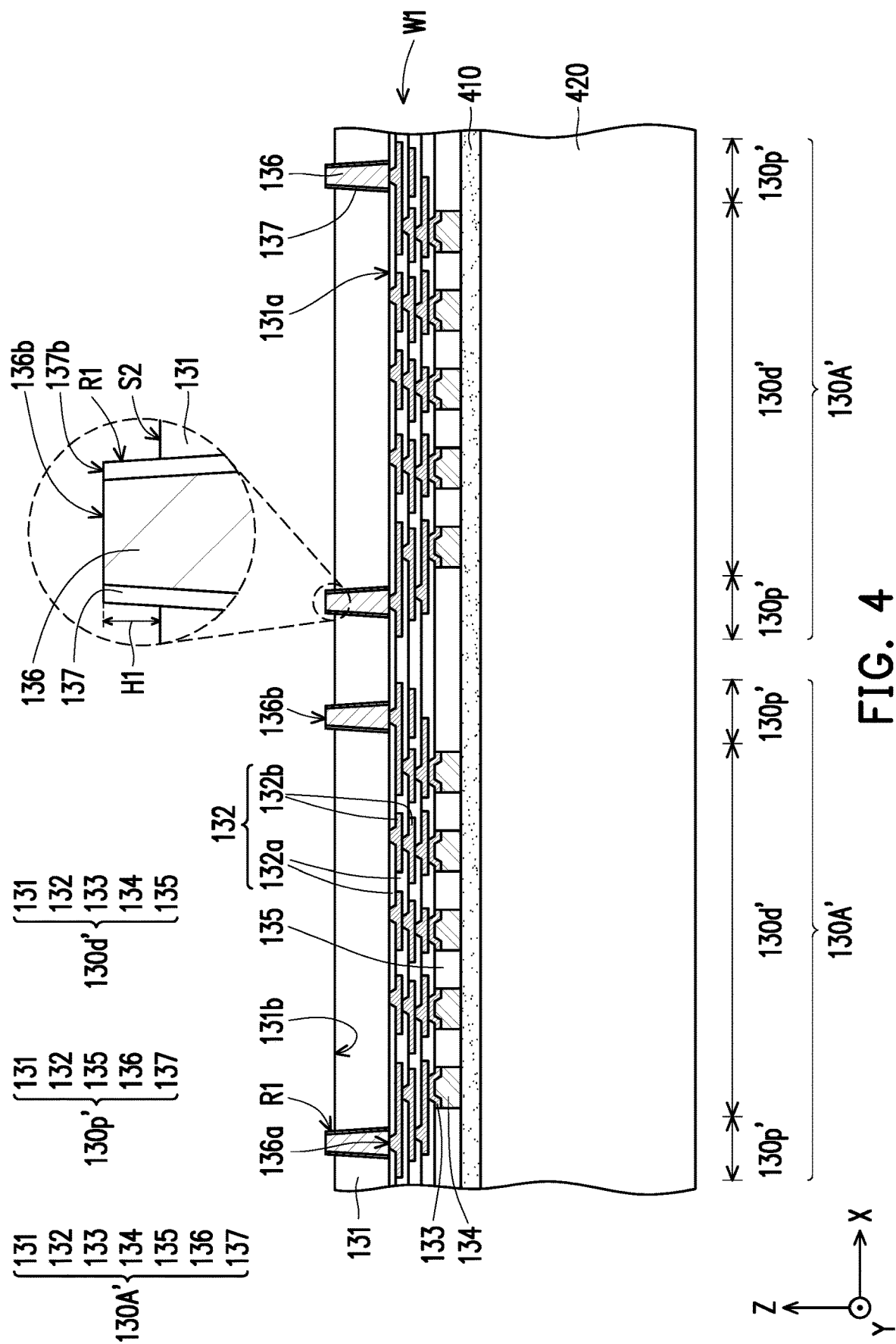

Referring to FIG. 4, in some embodiments, a patterning process is performed to partially remove the semiconductor substrate 131 so as to form recesses R1. In some embodiments, the semiconductor substrate 131 is patterned to form a bottom surface 131b, such that a portion of each of the TSVs 136 protrudes from the bottom surface 131b of the semiconductor substrate 131. The patterning process may include an etching process (such as a wet etch or a dry etch) or the like, for example. The disclosure is not limited thereto. For example, the etching process has a high etch-rate selectivity to the material of the semiconductor substrate 131 over the materials of the TSVs 136 and the liners 137. For example, the removed amount of the semiconductor substrate 131 is controlled by adjusting the etching time. In some embodiments, the TSVs 136 and the liners 137 remain intact during recessing. In some embodiments, a cleaning process is performed to remove residues of the etching process by using suitable solvent, cleaning chemical, or other cleaning techniques. The portion of each of the TSVs 136 protruding from the bottom surface 131b of the semiconductor substrate 131 is in the recess R1 and has a height H1 approximately ranging from 0.2 μm to 2 μm (as measured from a bottom surface 136b of one TSV 136 to the bottom surface 131b of the semiconductor substrate 131 along the stacked direction Z), for example. Alternatively, the liners 137 disposed on the sidewalls of the portions of the TSVs 136 and protruding from the bottom surface 131b may be also removed during the patterning process, if need.

Figure 5:
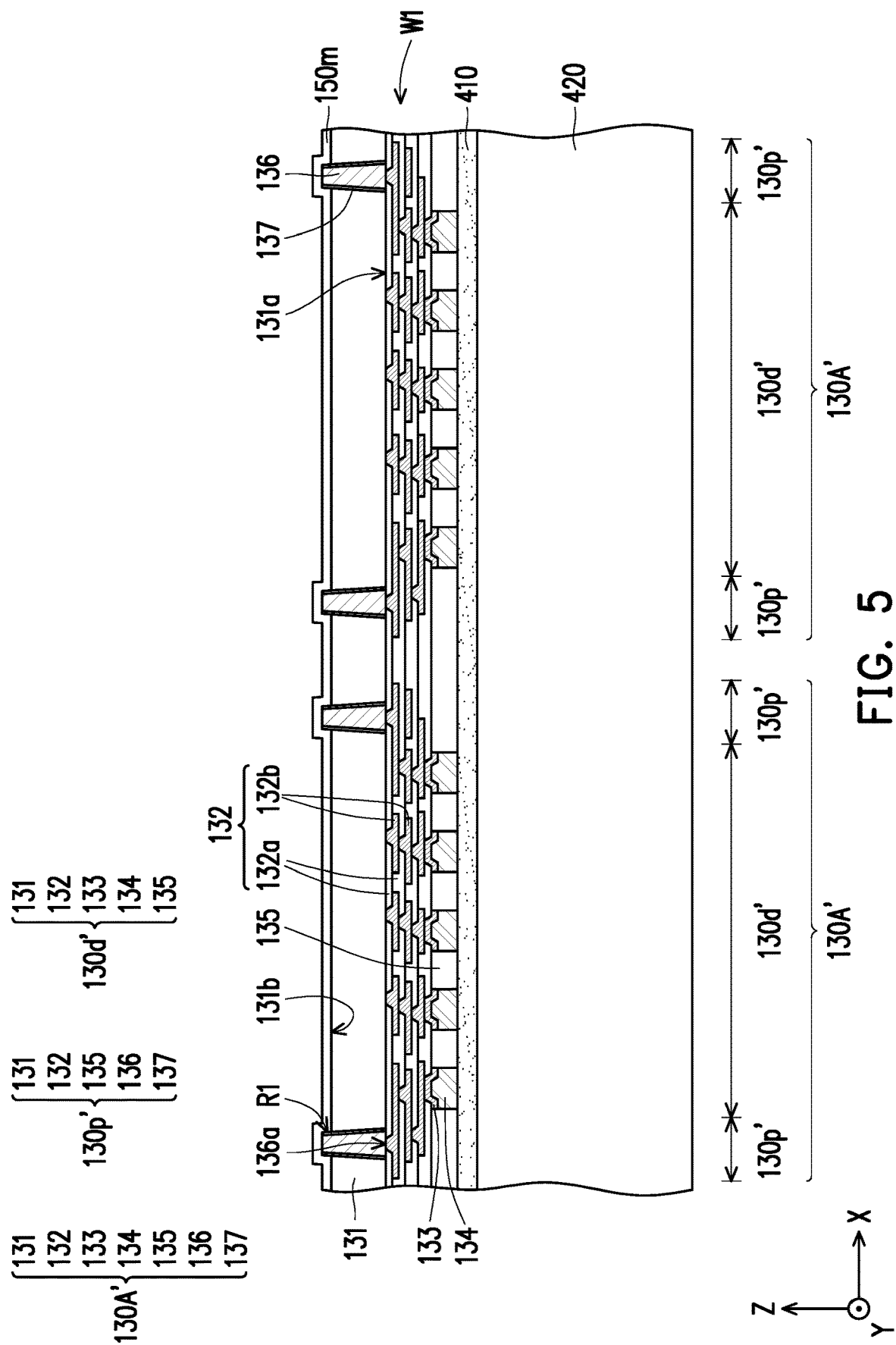

Referring to FIG. 4 and FIG. 5, in some embodiments, a dielectric material 150m is formed over the wafer W1. In some embodiments, the dielectric material 150m is directly formed on the semiconductor substrate 131, the TSVs 136 and the liners 137, where the bottom surfaces 136b of the TSVs 136, the bottom surface 131b of the semiconductor substrate 131, bottom surfaces 137b of the liners 137 are covered by and in physical contact with the dielectric material 150m. As shown in FIG. 5, for example, a portion of the dielectric material 150m fills into the recesses R1, where the recesses R1 are fully filled with the dielectric material 150m. A thickness of the dielectric material 150m may be greater than the height H1 of the portion of each of the TSVs 136 protruding from the bottom surface 131b of the semiconductor substrate 131.

In some embodiments, the dielectric material 150m is a dielectric material layer. The dielectric material 150m may be a polymer layer which made of PI, PBO, BCB, or any other suitable polymer-based dielectric material. Alternatively, the dielectric material 150m may be Ajinomoto Buildup Film (ABF), Solder Resist film (SR), or the like. In some embodiments, the dielectric material 150m is formed on the wafer W1 by a suitable fabrication technique such as spin-coating, lamination, deposition, or the like.

Figure 6:
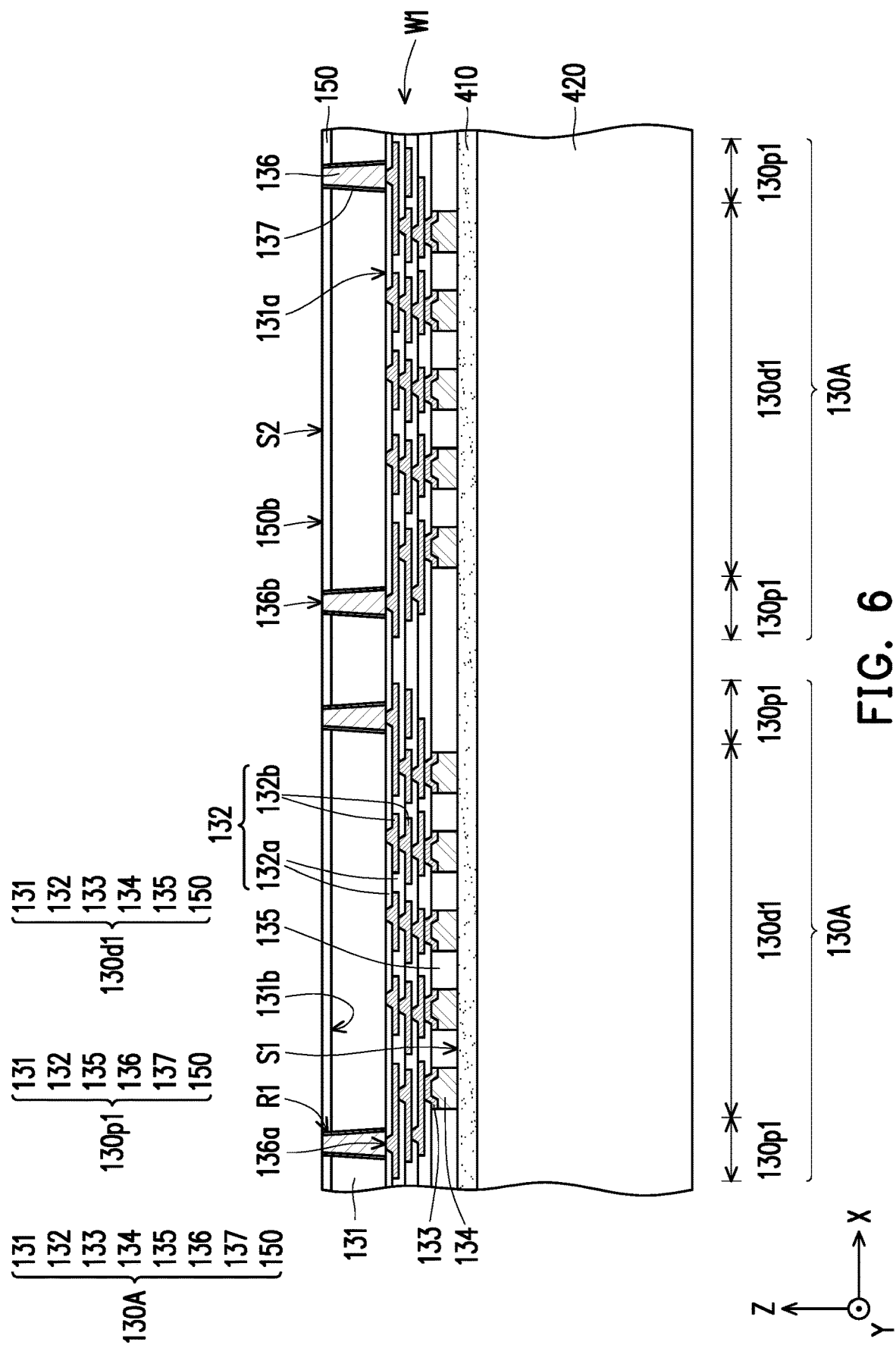

Referring to FIG. 6, in some embodiments, a second planarizing process is performed to form a passivation layer 150, where the passivation layer 150 exposes the bottom surfaces 136b of the TSVs 136 and the bottom surfaces of the liners 137. In some embodiments, during the second planarizing process, the dielectric material 150m located in the recesses R1 is remained, while the rest of the dielectric material 150m are removed; and the remained dielectric material 150m is referred as the passivation layer 150. In some embodiments, the second planarizing process may include a CMP process, or the like; and the disclosure is not limited thereto. After planarizing, a cleaning process may be optionally performed, for example to clean and remove the residue generated from the second planarizing process. However, the disclosure is not limited thereto, and the second planarizing process may be performed through any other suitable method.

A height of the passivation layer 150 may be substantially equal to the height H1 of the portion of each of the TSVs 136 protruding from the bottom surface 131b of the semiconductor substrate 131. In some embodiments, the portion of each of the TSVs 136 protruding from the bottom surface 131b of the semiconductor substrate 131 is located in the passivation layer 150 and has the height H1. As illustrated in FIG. 6, for example, a surface 150b of the passivation layer 150 is substantially levelled with the bottom surfaces 136b of the TSVs 136 and the bottom surfaces 137b of the liners 137. The surface 150b of the passivation layer 150 is substantially coplanar to the bottom surfaces 136b of the TSVs 136 and the bottom surfaces 137b of the liners 137, in some embodiments. Up to here, the integrated circuit components 130A included in the wafer W1 are manufactured. The integrated circuit components 130A may be referred to as a semiconductor device, such as a semiconductor chip or die. For example, the surface 150b of the passivation layer 150, the bottom surfaces 136b of the TSVs 136 and the bottom surfaces 137b of the liners 137, which are substantially leveled, are together referred to as a back surface S2 of the integrated circuit component 130A; and the top surfaces of the connecting vias 134 and the surface of the protection layer 135, which are substantially leveled, are together referred to as a front surface S1 of the integrated circuit component 130A.

The integrated circuit components 130A included in the wafer W1 each may include one device portion 130d1 and one or more than one periphery portion 130p1. In some embodiments, each of the integrated circuit components 130A included in the wafer W1 includes one device portion 130d1 and one periphery portion 130p1 connected to (e.g. joined to) the device portion 130d1, as shown in FIG. 6 and FIG. 15. For example, the shape of the periphery portion 130p1 of each integrated circuit component 130A is a closed, continuous frame shape, such that the device portion 130d1 (having a rectangular shape) is laterally surrounded with and covered by the periphery portion 130p1. The shape of the periphery portion 130p1 corresponds to the shape of the device portion 130d1. In some embodiments, viewing from the X-Y plane shown in FIG. 15, a spacing distance SP2 between one TSV 136 and an edge (denoted by a dot line in FIG. 15) of the device portion 130d1 is approximately ranging from 2 μm to 200 μm. In some embodiments, shown in FIG. 6 and FIG. 15, the device portion 130d1 and the periphery portion 130p1 are an integral piece and are together referred to as one integrated circuit component 130A. In other embodiments, as shown in FIG. 16, the periphery portion 130p1 further includes an extension 130pe to provide more I/O counts for the integrated circuit component 130A, without reducing an area of the device portion 130d1 projecting on the X-Y plane as compared with FIG. 15.

Figure 43:
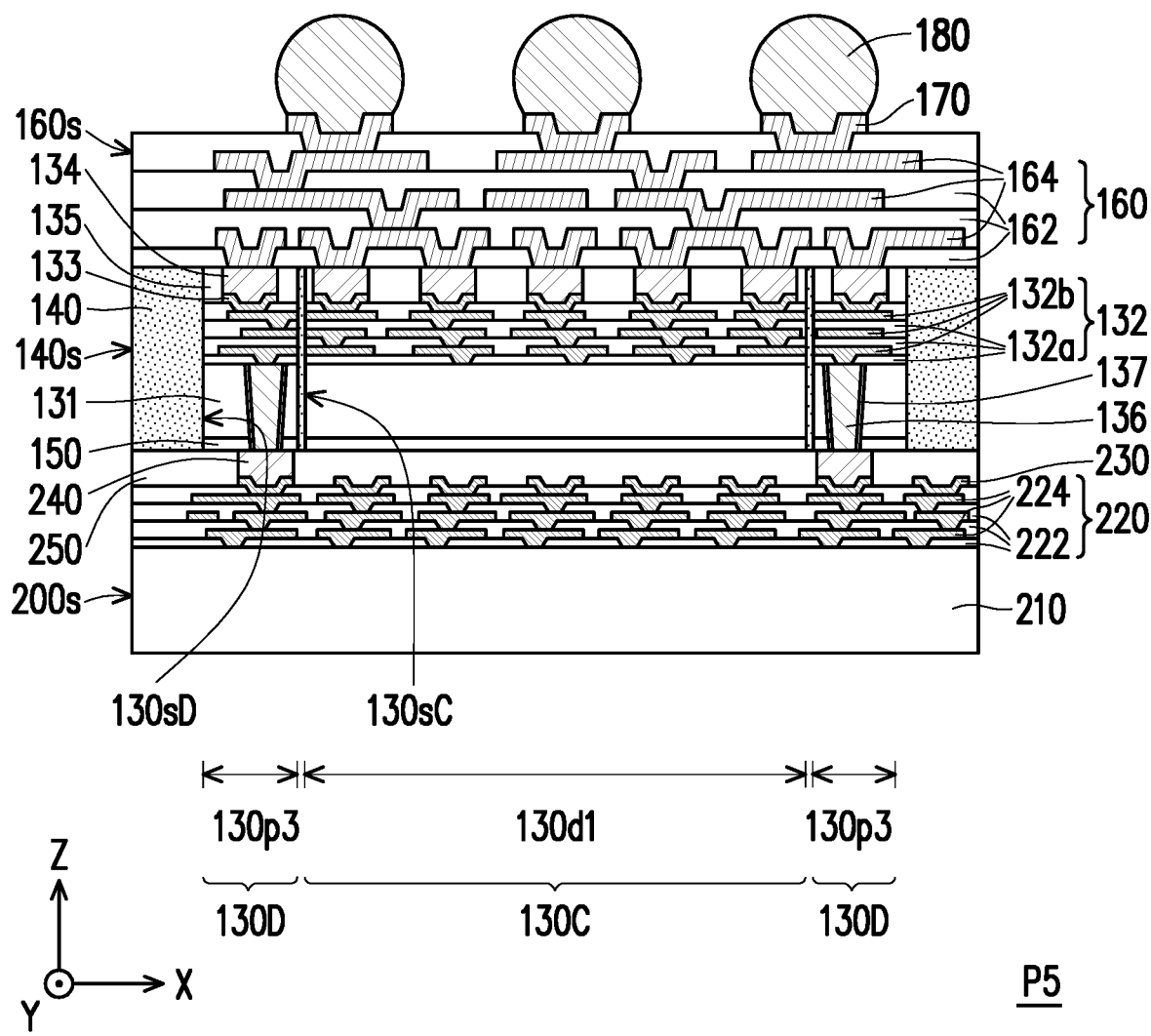
Figure 44:
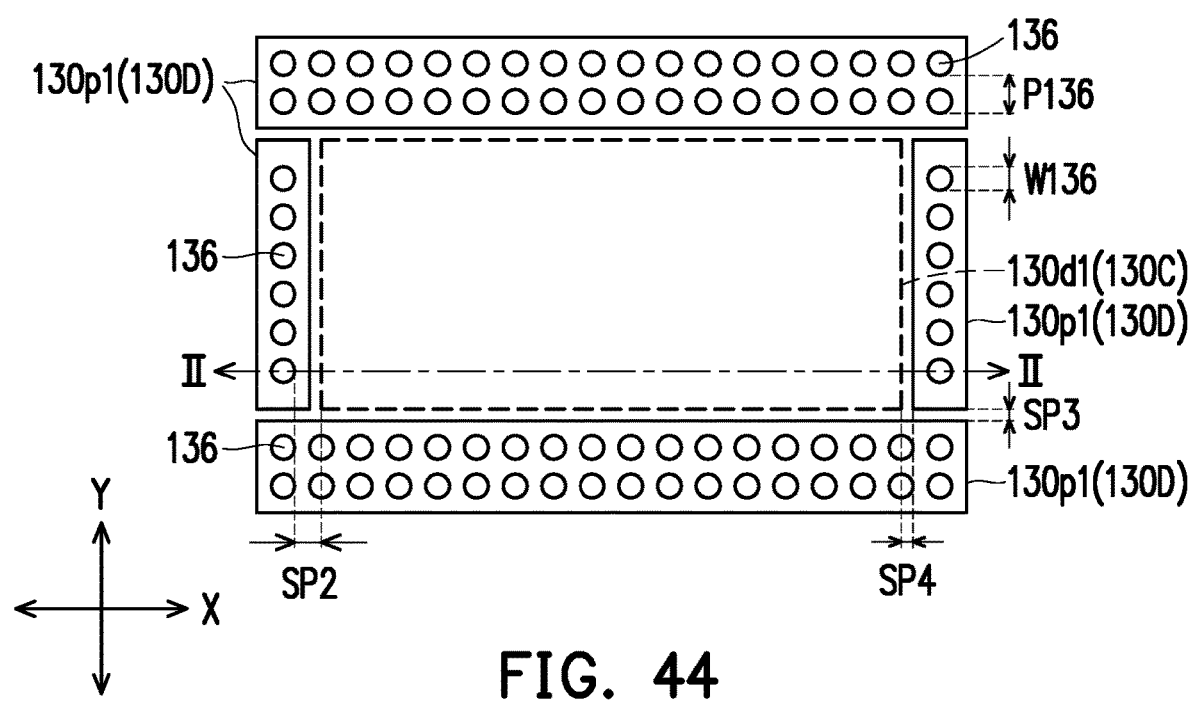
FIG. 44 is a schematic top view illustrating a relative position between a semiconductor die and through silicon vias of a semiconductor structure in accordance with some embodiments of the disclosure.

Alternatively, the integrated circuit components 130A may include one device portion and multiple periphery portions separated from (e.g. distant from) the device portion (FIG. 43 and FIG. 44). In some embodiments, the sizes of these periphery portions are different (FIG. 44). In other embodiments, the sizes of these periphery portions are the same (not shown). The sizes of the periphery portions are not limited to the disclosure, and may be selected and designated based on the demand and the design layout.

In some embodiments, each of the device portions 130d1 includes the semiconductor substrate 131, the interconnect structure 132, the connecting pads 133, the connecting vias 134, the protection layer 135 and the passivation layer 150, where the device portions 130d1 provides functions including memory structures (e.g., a memory cell), processing structures (e.g., a logic cell), or the like. In some embodiments, each of the periphery portions 130p1 includes the semiconductor substrate 131, the interconnect structure 132, the protection layer 135, the TSVs 136, the liners 137 and the passivation layer 150, where the periphery portions 130p1 provides functions including input/output (I/O) circuitry (e.g. an I/O cell) or the like. In some embodiments, the periphery portions 130p1 are electrically connected to the device portions 130d1. The device portions 130d1 may be referred to as a semiconductor device component (such as a semiconductor chip or die) and the periphery portions 130p1 may be referred to as a connecting bridge providing routing function. In some alternative embodiments, the liners 137 are omitted from the sidewalls of the TSVs 136, the disclosure is not limited thereto.

Figure 7:
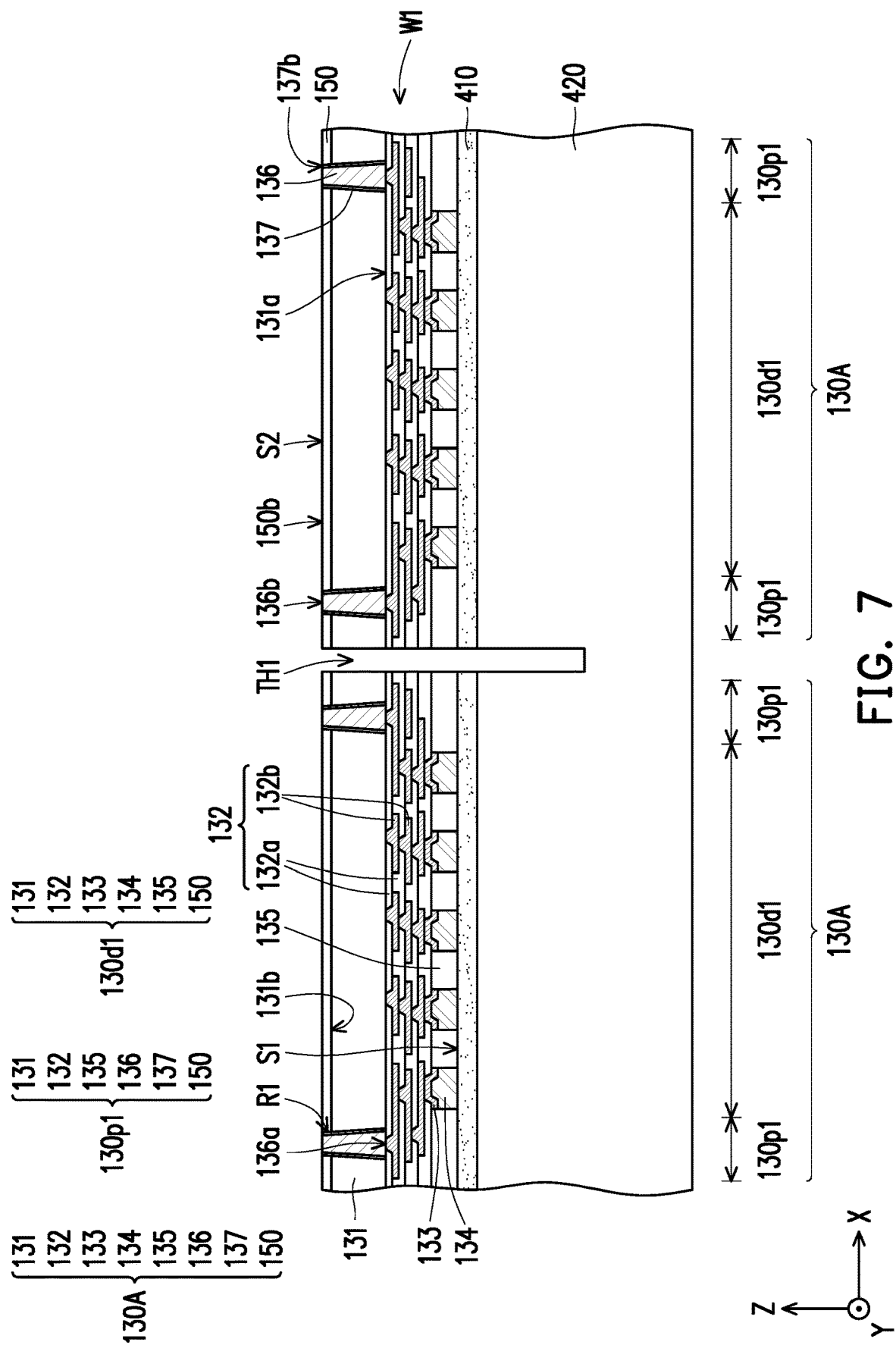

Referring to FIG. 7, in some embodiments, a pre-dicing (or pre-singulation) process is performed. For example, the pre-dicing process is performed to cut through the wafer W1, the bonding layer 410 and a portion of the semiconductor substrate 420 and form trenches TH1. The pre-dicing process may be a wafer dicing process, which may include mechanical blade sawing or laser cutting. The disclosure is not limited thereto. As shown in FIG. 7, the trenches TH1 each separate two adjacent integrated circuit components 130A, for example.

Figure 8:
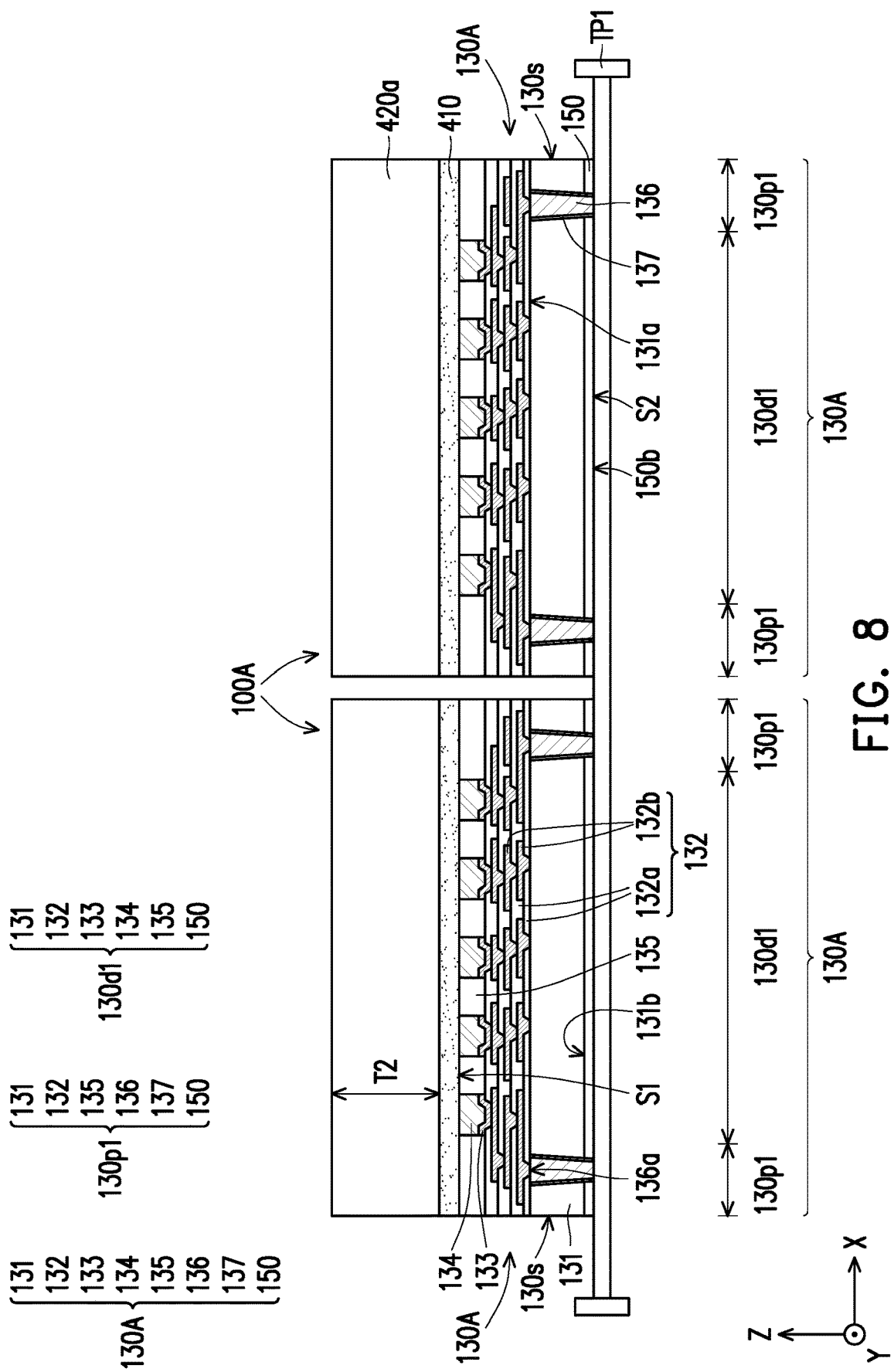

Referring to FIG. 8, in some embodiments, a third planarizing process is performed on the structure depicted in FIG. 7 to remove an un-cut portion of the semiconductor substrate 420 to form a plurality of semiconductor components 100A which are separated from one another. For example, each semiconductor component 100A includes one integrated circuit component 130A with the bonding layer 410 and a thinned semiconductor substrate 420a overlying thereto. In some embodiments, a thickness T2 of the thinned semiconductor substrate 420a is approximately ranging from 10 µm to 100 µm. The thickness T2 of the thinned semiconductor substrate 420a is less than the thinness T1 of the semiconductor substrate 420, in some embodiments. In other words, the third planarizing process is applied to separate a plurality of the integrated circuit components 130A being interconnected by the un-cut portion of the semiconductor substrate 420, in some embodiments. In some embodiments, the third planarizing process may include a grinding process or a CMP process. After planarizing, a cleaning process may be optionally performed, for example to clean and remove the residue generated from the third planarizing process. However, the disclosure is not limited thereto, and the third planarizing process may be performed through any other suitable method.

In some embodiments, prior to the third planarizing process, a holding device TP1 is adopted to secure the structure depicted in FIG. 7 for preventing any damages to the integrated circuit components 130A by planarizing or any other subsequent process(es). For example, the whole structure depicted in FIG. 7 is placed onto the holding device TP1, where the semiconductor substrate 420 face upwards and is distant from the holding device TP1, and the back surfaces S2 of the integrated circuit components 130A are in contact with the holding device TP1. The holding device TP1 may be an adhesive tape, an adhesive carrier or a suction pad, the disclosure is not limited thereto. In some embodiments, prior to the third planarizing process (and/or the pre-dicing process), the integrated circuit components 130A being interconnected are tested for functionality and performance by probing, and only known good dies (KGDs) from the tested integrated circuit components 130A are selected and used for subsequently processing.

Figure 9:
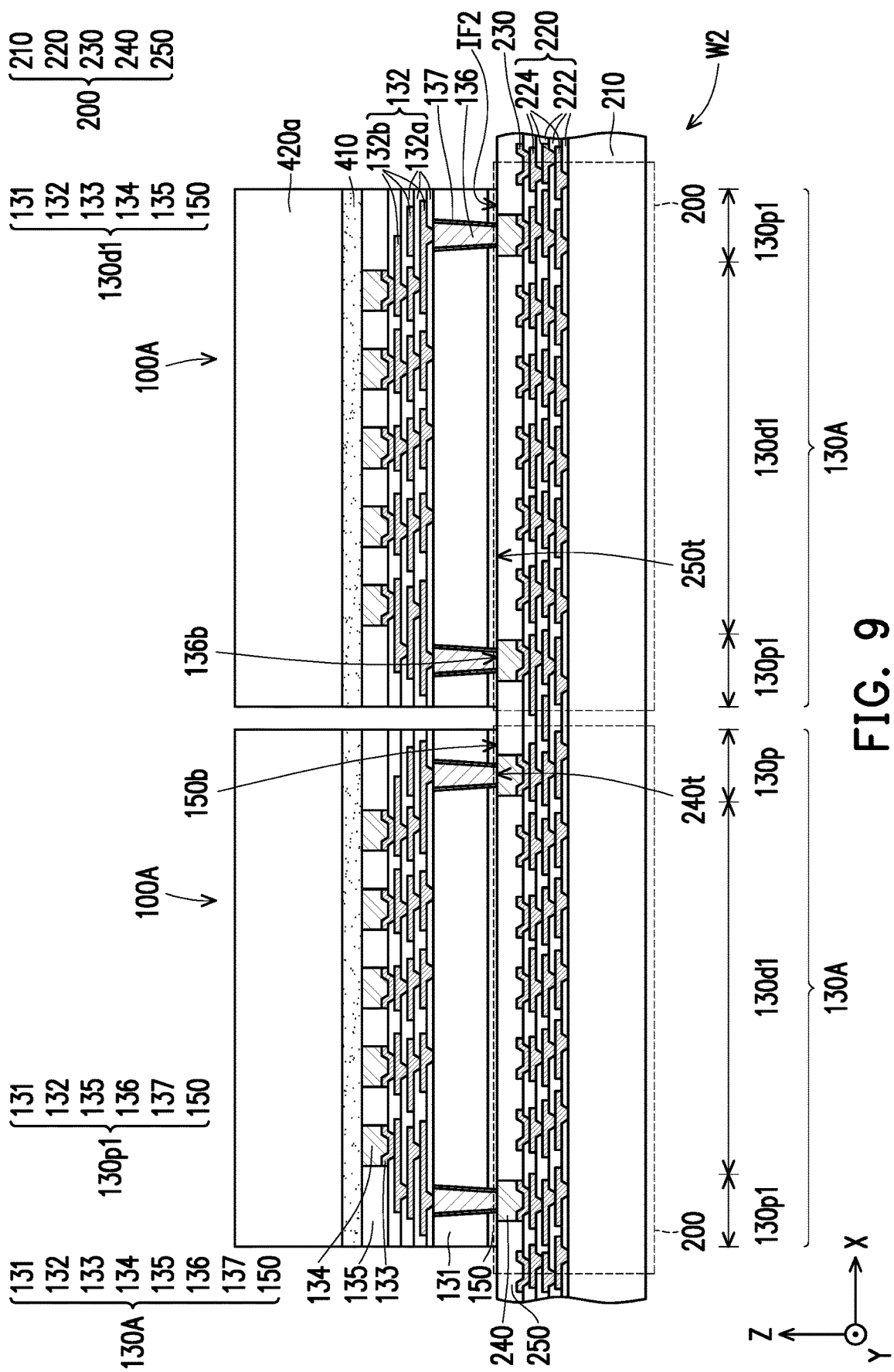

Referring to FIG. 9, in some embodiments, one or more than one semiconductor components 100A are provided and bonded to a wafer W2. For illustration purpose, only two semiconductor components 100A are shown in FIG. 9, for example. However, the number of the semiconductor components 100A may be more than two or less than two based on the demand and/or design layout, the disclosure is not limited thereto. For example, the semiconductor components 100A are provided to be placed on the wafer W2 for bonding by pick-and-place process.

In some embodiments, the wafer W2 includes a plurality of integrated circuit components 200 arranged in an array is provided. Before performing a wafer sawing or dicing process on the wafer W2, the integrated circuit components 200 of the wafer W2 may be connected to one another. In some embodiments, each of the integrated circuit components 200 includes a semiconductor substrate 210 having semiconductor devices (not shown) formed therein, an interconnect structure 220 formed on the semiconductor substrate 210, a plurality of connecting pads 230 formed on the interconnect structure 220, a plurality of connecting vias 240 formed on the interconnect structure 220, a protection layer 250 covers the interconnect structure 220, the connecting pads 230 and the connecting vias 240. For example, the interconnect structure 220 includes one or more than one dielectric layer 222 and one or more than one metallization layer 242 in alternation. The formations and materials of the semiconductor substrate 210, the interconnect structure 220 (including the dielectric layers 222 and the metallization layers 242), the connecting pads 230, the connecting vias 240 and the protection layer 250 are respectively the same or similar to the processes and materials of the semiconductor substrate 131, the interconnect structure 132 (including the dielectric layers 132a and the metallization layers 132b), the connecting pads 133, the connecting vias 134 and protection layer 135 as described in FIG. 1, and thus are not repeated herein for simplicity. The number of the dielectric layers 222 and the numbers of the metallization layer 224 of the interconnect structure 220, the number of the connecting pads 230 and the number of the connecting vias 240 are not limited to the disclosure, and may be selected and designated based on the demand and design layout.

In some embodiments, the semiconductor components 100A (each including the integrated circuit component 130A) are bonded to the wafer W2 (including multiple integrated circuit components 200) by a hybrid bonding process. One integrated circuit component 130A may be overlaid on one integrated circuit component 200. For example, one integrated circuit component 130A is bonded on and electrically connected to one integrated circuit component 200 underlying thereto, as shown in FIG. 9. Alternatively, multiple integrated circuit components 130A may be bonded on and electrically connected to one integrated circuit component 200 underlying thereto (not shown).

For example, the bottom surfaces 136b of the TSVs 136 in one of the integrated circuit components 130A and top surfaces 240t of the connecting vias 240 in a respective underlying one of the integrated circuit components 200 prop against each other and are bonded together through copper-to-copper bonding (known as a direct metal-to-metal bonding). In addition, the bottom surface 150b of the passivation layer 150 in each of the integrated circuit components 130A and a top surface 250t of the protection layer 250 in the respective underlying one of the integrated circuit components 200 prop against each other and are bonded together through oxide-to-nitride bonding (known as a direct dielectrics-to-dielectrics bonding), for example. In such embodiments, a bonding interface IF2 between the integrated circuit component 130A (respectively included in the semiconductor components 100A) and the integrated circuit components 200 (included in the wafer W2) includes a dielectric-to-dielectric bonding interface (e.g., an oxide-to-nitride bonding interface) and a metal-to-metal interface (e.g., a copper-to-copper bonding interface). In the disclosure, the bonding interface IF2 may be referred to as a hybrid bonding interface.

As illustrated in FIG. 9, for example, the semiconductor devices in the semiconductor substrate 210 are electrically connected to the semiconductor devices in the semiconductor substrate 131 through the interconnect structure 220, the connecting pads 230, the connecting vias 240, the TSVs 136, and the interconnect structure 132. In some embodiments, the semiconductor devices in the semiconductor substrate 210 are electrically connected to the connecting vias 134 through the interconnect structure 220, the connecting pads 230, the connecting vias 240, the TSVs 136, the interconnect structure 132 and the connecting pads 133.

It should be noted that bonding methods described above are merely examples and are not intended to be limiting. In some embodiments, an offset is between a sidewall of the TSVs 136 and a sidewall of the connecting vias 240 underlying thereto, as shown in FIG. 9. Since the connecting vias 240 may have a larger bonding surface than the TSVs 136, the direct metal-to-metal bonding may still be achieved even if misalignment occurs, thereby exhibiting better reliability. In some embodiments in which the dimensions of the TSVs 136 are smaller than those of corresponding connecting vias 240, the passivation layer 150 immediately adjacent to TSVs 136 is bonded to a portion of each of the connecting vias 240 (e.g. a dielectric-to-metal bonding).

Figure 10:
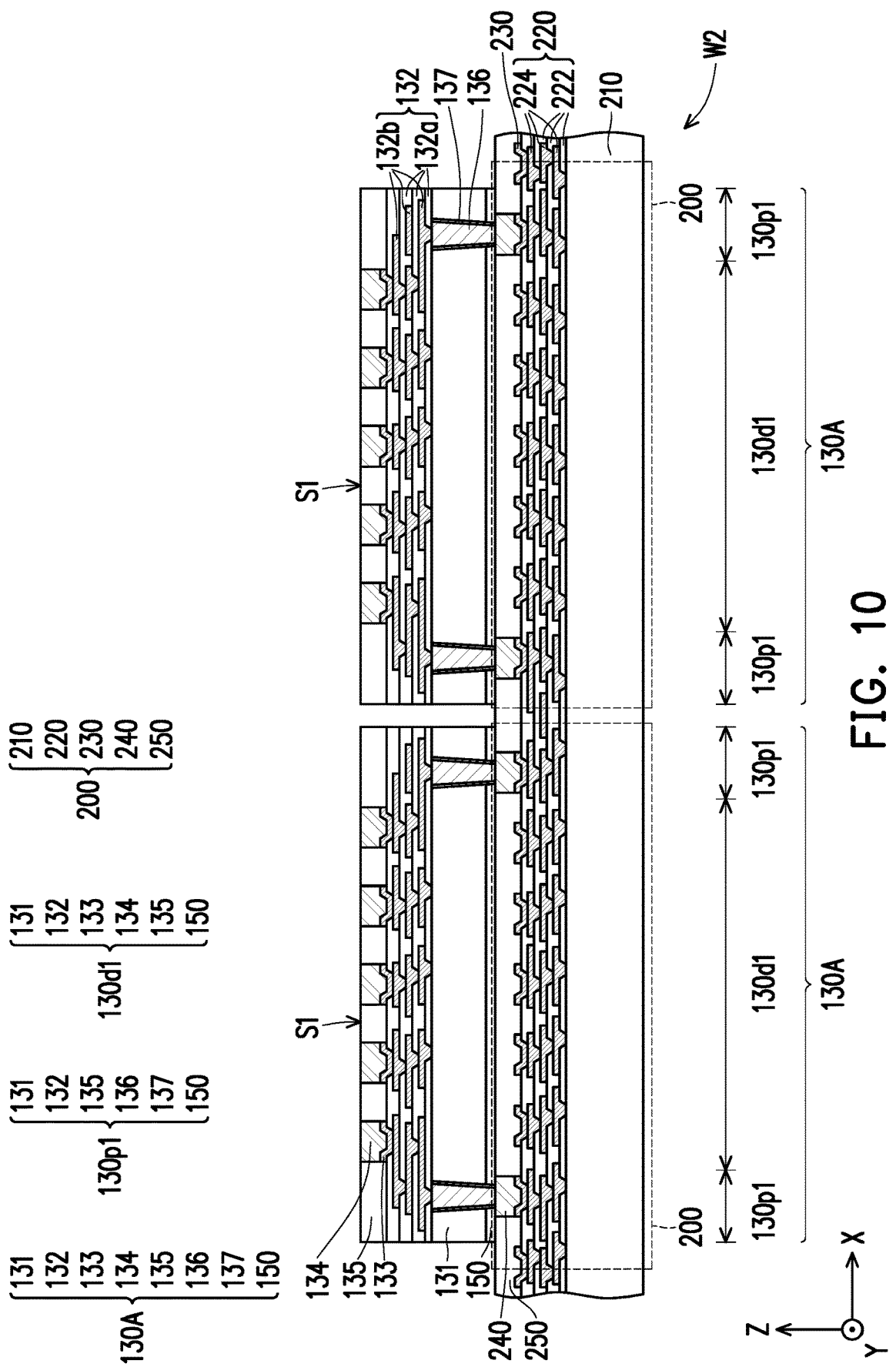

Referring to FIG. 10, in some embodiments, a fourth planarizing process is performed on the semiconductor components 100A to remove the bonding layer 410 and the thinned semiconductor substrate 420a therefrom, thereby exposing the integrated circuit components 130A. That is, for example, after the fourth planarizing process, the thinned semiconductor substrate 420a and the bonding layer 410 of each of the semiconductor components 100A are removed and only the integrated circuit components 130A are left on the wafer W2. Through the fourth planarizing process, in some embodiments, the fourth surfaces S1 of the integrated circuit components 130A, are accessibly revealed.

During the fourth planarizing process, the connecting vias 134 and the protection layer 135 of one or more than one of the integrated circuit components 130A may further be planarized. In some embodiments, the fourth planarizing process may include a grinding process or a CMP process. After the fourth planarizing process, a cleaning process may be optionally performed, for example to clean and remove the residue generated from the fourth planarizing process. However, the disclosure is not limited thereto, and the fourth planarizing process may be performed through any other suitable method.

Figure 11:
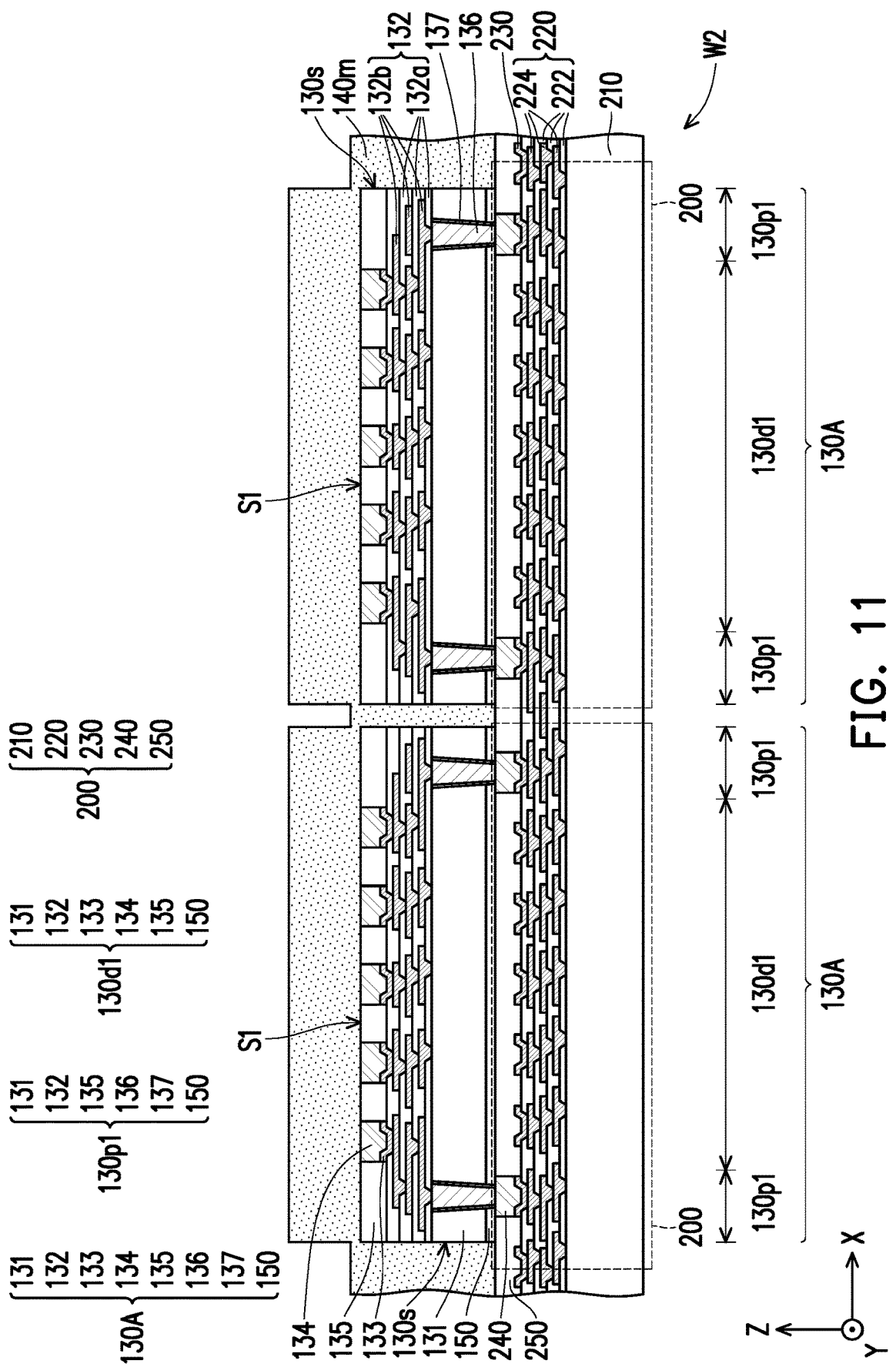

Referring to FIG. 11, in some embodiments, an insulating encapsulation 140m is formed over the wafer W2. For example, the insulating encapsulation 140m is conformally formed on the integrated circuit components 130A, where the integrated circuit components 130A and a portion of the wafer W2 exposed by the integrated circuit components 130A are covered by the insulating encapsulation 140m. In some embodiments, the top surface S1 and a sidewall 130s of each of the integrated circuit components 130A are physically contacted with and encapsulated by the insulating encapsulation 140m. The insulating encapsulation 140m may be made of a dielectric material (such as an oxide (e.g. silicon oxide), a nitride (e.g. silicon nitride), TEOS, or the like) or any suitable insulating materials for gap fill, and may be formed by deposition (such as a CVD process). As shown in FIG. 11, the integrated circuit components 130A are not accessibly revealed by the insulating encapsulation 140m, for example.

Figure 12:
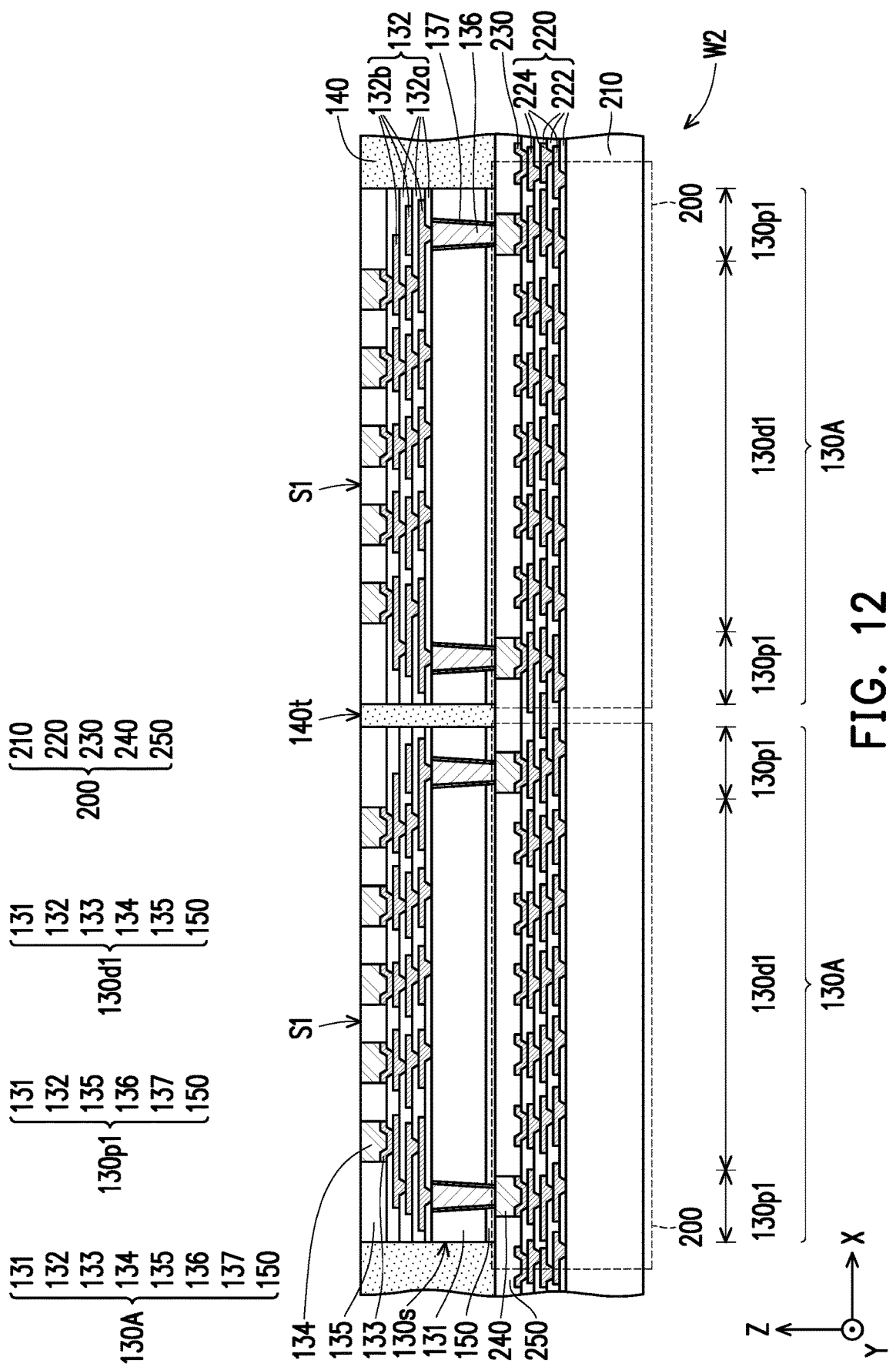

Referring to FIG. 12, in some embodiments, a fifth planarizing process is performed on the insulating encapsulation 140m to form an insulating encapsulation 140 exposing the integrated circuit components 130A. For example, a portion of the insulating encapsulation 140m is removed to form the insulating encapsulation 140 having a top surface 140t, where the top surface 140t is a flat and planar surface. In some embodiments, the top surfaces S1 of the integrated circuit components 130A are substantially leveled with the top surface 140t of the insulating encapsulation 140. For example, the top surfaces S1 of the integrated circuit components 130A are substantially coplanar to the top surface 140t of the insulating encapsulation 140. The sidewalls 130s of the integrated circuit components 130A and the surface of the wafer W2 exposed by the integrated circuit components 130A are covered by the insulating encapsulation 140, in some embodiments. As shown in FIG. 12, the integrated circuit components 130A (e.g. the connecting vias 134) are accessibly revealed by the insulating encapsulation 140, for example.

During the fifth planarizing process, the connecting vias 134 and the protection layer 135 of one or more than one of the integrated circuit components 130A may further be planarized. In some embodiments, the fifth planarizing process may include a grinding process or a CMP process. After the fifth planarizing process, a cleaning process may be optionally performed, for example to clean and remove the residue generated from the fifth planarizing process. However, the disclosure is not limited thereto, and the fifth planarizing process may be performed through any other suitable method.

Figure 13:
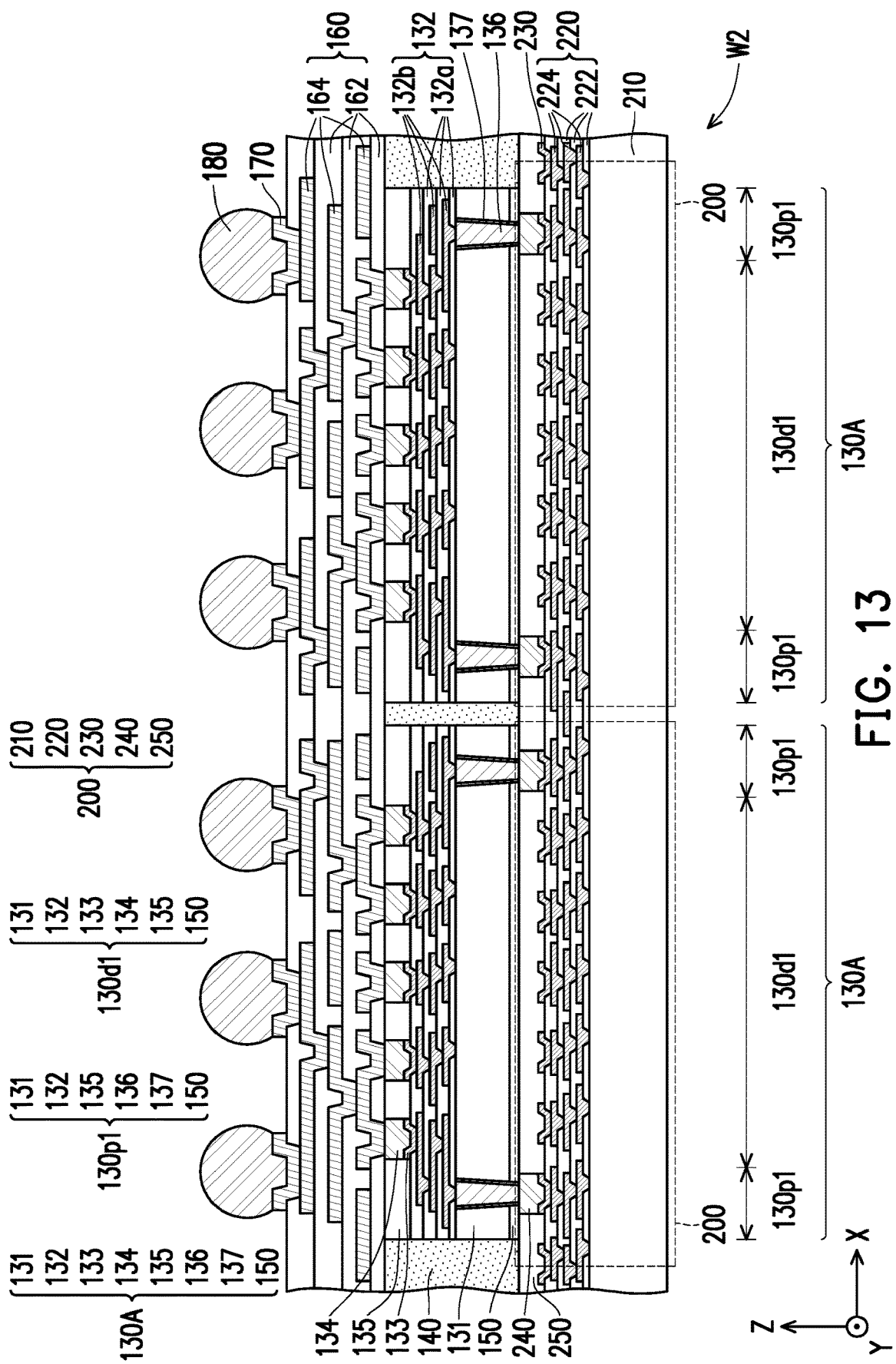

Referring to FIG. 13, in some embodiments, after forming the insulating encapsulation 140, a redistribution circuit structure 160, a plurality of under-ball metallurgy (UBM) patterns 170 and a plurality of conductive elements 180 are sequentially formed over the wafer W2. For example, the redistribution circuit structure 160 is formed on the integrated circuit components 130A, the UBM patterns 170 are formed on the redistribution circuit structure 160, and the conductive elements 180 are respectively formed on the UBM patterns 170. The redistribution circuit structure 160 is electrically connected to the integrated circuit components 130A, and the conductive elements 180 are electrically connected to the redistribution circuit structure 160 through the UBM patterns 170, for example. Alternatively, the UBM patterns 170 may be omitted, the disclosure is not limited thereto. The numbers of the UBM patterns 170 and the conductive elements 180 are not limited in the disclosure, and may be selected and designated based on demand and design layout.

As illustrated in FIG. 13, in some embodiments, the redistribution circuit structure 160 is formed on the insulating encapsulation 140 and the integrated circuit components 130A. In some embodiments, the redistribution circuit structure 160 is electrically connected to the integrated circuit components 130A via the conductive vias 140. As shown in FIG. 13, for example, the redistribution circuit structure 160 is a so-called a front side redistribution circuit structure since the redistribution circuit structure 160 is fabricated at the front surfaces S1 (e.g. active sides) of the integrated circuit components 130A. Through the redistribution circuit structure 160, the integrated circuit components 130A are electrically connected to each other. In other words, the integrated circuit components 130A electrically communicate to one another through the presence of the redistribution circuit structure 160. The formation of the redistribution circuit structure 160 includes sequentially forming one or more polymer dielectric layers 162 and one or more patterned conductive layers 164 in alternation. For example, the patterned conductive layers 164 may be sandwiched between the polymer dielectric layers 162. In some embodiments, the top surface of a topmost layer of the patterned conductive layers 164 is exposed by a topmost layer of the polymer dielectric layers 162 for connecting with later-formed or later-disposed conductive elements/overlying connectors (e.g. the UBM patterns 170, the conductive elements 180). For example, a lowest layer of the patterned conductive layers 164 is exposed by a lowest layer of the polymer dielectric layers 162 for connecting underlying connectors (e.g. the conductive vias 140 of the integrated circuit components 130A). The numbers of the layers of the polymer dielectric layers 162 and the patterned conductive layers 164 may be less than or more than what is depicted in FIG. 11, and may be designated based on the demand and/or design layout; the disclosure is not specifically limited thereto.

In some embodiments, the material of the polymer dielectric layers 162 includes polyimide, epoxy resin, acrylic resin, phenol resin, BCB, PBO, or any other suitable polymer-based dielectric material, and the polymer dielectric layers 162 may be formed by deposition. In some embodiments, the material of the patterned conductive layers 164 includes aluminum, titanium, copper, nickel, tungsten, and/or alloys thereof, and the patterned conductive layers 164 may be formed by electroplating or deposition. In certain embodiments, as the underlying insulating encapsulation 140 and the integrated circuit components 130A (e.g. the conductive vias 140 and the protection layers 150) provide better planarization and evenness, the later-formed redistribution circuit structure 160, especially the patterned conductive layers with thin line width or tight spacing, can be formed with uniform line-widths or even profiles over the planar and level insulating encapsulation 140 and the integrated circuit components 130A, resulting in improved line/wiring reliability. The formations materials of the polymer dielectric layers 162 and the patterned conductive layers 164 may be the same or similar to the formations and materials of the dielectric layers 132a/222 and the metallization layers 132b/224, the disclosure is not limited thereto. For example, the pitch and width of the patterned conductive layers 164 of the redistribution circuit structure 160 may be greater than the pitch and width of the metallization layers 132b of the interconnect structure 132 and/or the pitch and width of the metallization layers 224 of the interconnect structure 220.

As illustrated in FIG. 13, in some embodiments, the UBM patterns 170 are disposed on the top surface of the topmost layer of the patterned conductive layers 164 exposed by the topmost layer of the polymer dielectric layers 162, such that the UBM patterns 170 are electrically connected to the redistribution circuit structure 160. In some embodiments, through the redistribution circuit structure 160, the UBM patterns 170 are electrically connected to the integrated circuit components 130A. The UBM patterns 170 may be a metal layer, which may include a single layer or a composite layer comprising a plurality of sub-layers formed of different materials. In some embodiments, the materials of the UBM patterns 170 includes copper, nickel, titanium, molybdenum, tungsten, titanium nitride, titanium tungsten, or alloys thereof or the like, and may be formed by an electroplating process, for example. The UBM patterns 170 each may include titanium layer and a copper layer over the titanium layer. In some embodiments, the UBM patterns 170 are formed using, for example, sputtering, PVD, or the like. The shape and number of the UBM patterns 170 are not limited in this disclosure. The number of the UBM patterns 170 may be controlled by adjusting the numbers of openings formed in the topmost layer of the polymer dielectric layers 162 exposing the top surface of the topmost layer of the patterned conductive layers 164.

In alternative embodiments, the UBM patterns 170 are optionally omitted based on demand and/or design layout, and parts of the topmost layer of the patterned conductive layers 164 underlying the later-formed or later-disposed conductive elements (e.g. the conductive elements 180) function as under-ball metallurgy (UBM) layers. In a further alternative embodiment, besides the formation of the UBM patterns 170, additional conductive pads (not shown) are also formed for mounting semiconductor passive components/devices (not shown) thereon. The semiconductor passive components/devices may be integrated passive devices (IPDs) or surface mount devices (SMDs). The materials of the conductive pads and the UBM patterns 170 may be the same. Alternatively, the material of the UBM patterns 170 may be different from the material of the conductive pads. The disclosure is not limited thereto.

As illustrated in FIG. 13, in some embodiments, the conductive elements 180 are respectively formed on the UBM patterns 170, such that the conductive elements 180 are electrically connected to the redistribution circuit structure 160 through the UBM patterns 170. Due to the UBM patterns 170, the adhesive strength between the conductive elements 180 and the redistribution circuit structure 160 is enhanced. For example, through the UBM patterns 170 and the redistribution circuit structure 160, the conductive elements 180 are electrically connected to the integrated circuit components 130A. In some embodiments, the redistribution circuit structure 160 is located between the integrated circuit components 130A and the conductive elements 180 and between the insulating encapsulation 140 and the conductive elements 180. The conductive elements 180 may be disposed on the UBM patterns 170 by ball placement process or reflow process. The conductive elements 180 may be micro-bumps, metal pillars, electroless nickel-electroless palladium-immersion gold (ENEPIG) formed bumps, controlled collapse chip connection (C4) bumps, a ball grid array (BGA) bumps or balls, solder balls, or the like. The disclosure is not limited thereto. The numbers of the conductive elements 180 may correspond to the numbers of the UBM patterns 170. When solder is used, the solder may include either eutectic solder or non-eutectic solder. The solder may include lead or be lead-free, and may include Sn—Ag, Sn—Cu, Sn—Ag—Cu, or the like. The conductive elements 180 may be referred to as conductive terminals of a semiconductor structure.

Figure 14:
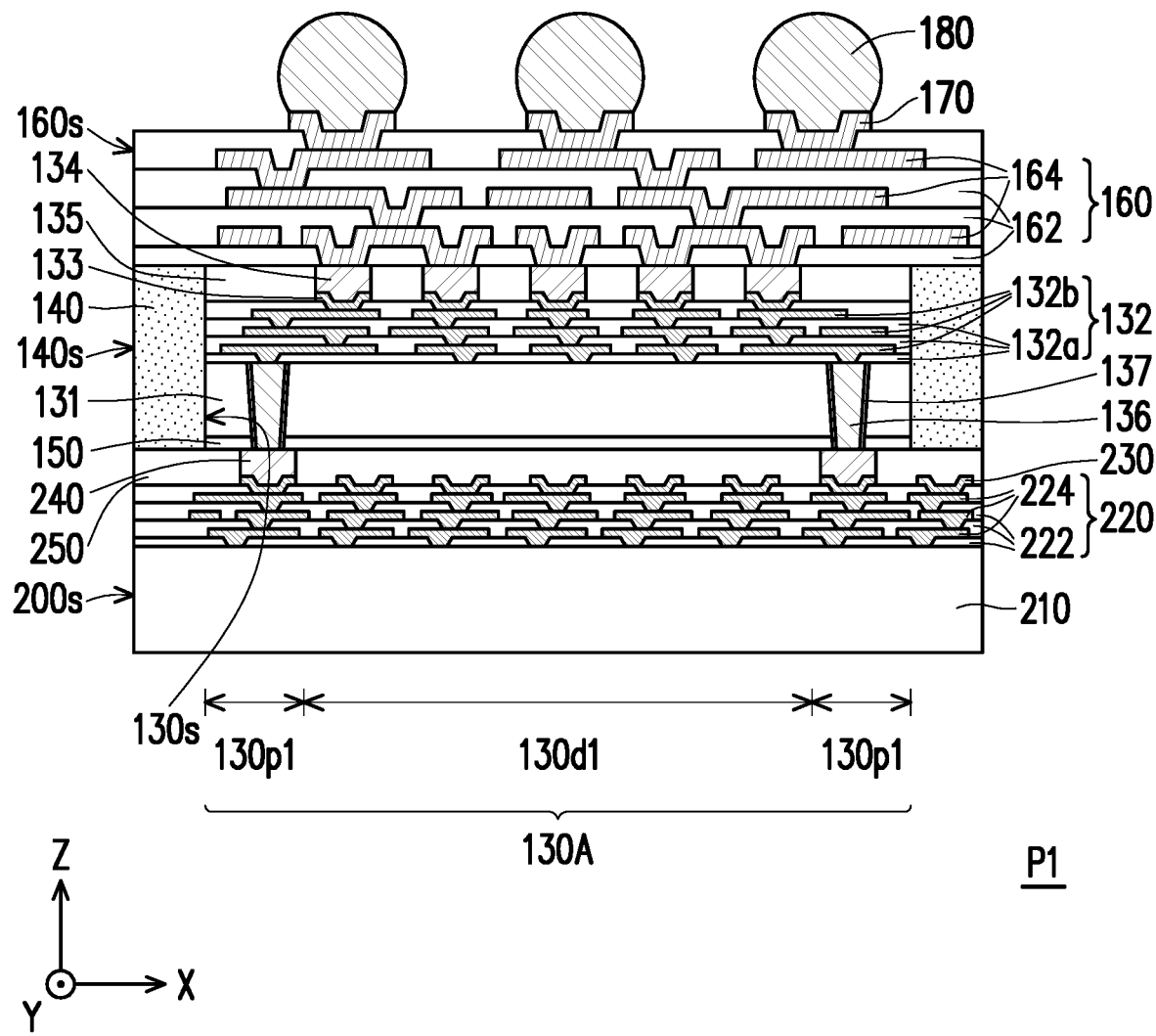

Referring to FIG. 14, after the conductive elements 180 are formed, a singulation (dicing) process is performed to cut the structure depicted in FIG. 13 into individual and separate semiconductor structures P1. In one embodiment, the singulation (dicing) process is a wafer dicing process or a wafer singulation process including mechanical sawing or laser cutting. Up to here, the semiconductor structure P1 is manufactured.

In some embodiments, as shown in FIG. 14, the semiconductor structure P1 includes the integrated circuit component 200, the integrated circuit component 130A located on the integrated circuit component 200, the insulating encapsulation 140 laterally covered the integrated circuit component 130A and on the integrated circuit component 200 exposed by the integrated circuit component 130A, the redistribution circuit structure 160 located on the integrated circuit component 130A and the insulating encapsulation 140, the UBMs patterns 170 on the redistribution circuit structure 160, and the conductive elements 180 on the UBMs patterns 170. Alternatively, the UBM patterns 170 may be omitted. The additional semiconductor passive devices may be disposed on the conductive pads formed on the redistribution circuit structure 160. The disclosure is not limited thereto. Due to the integrated circuit component 200 is exposed to the external environment, the semiconductor structure P1 is capable of having better heat dissipating performance.

In some embodiments, the integrated circuit component 130A is hybrid bonded to the integrated circuit component 200 with the bonding interface IF2, where the integrated circuit component 130A is electrically connected to the integrated circuit component 200 through the TSVs 136. For example, the device portion 130d1 and the periphery portion 130p1 connected thereto together constitute the integrated circuit component 130A. For example, the semiconductor devices in the device portion 130d1 of the integrated circuit component 130A are electrically connected to the semiconductor devices in the integrated circuit component 200 through the TSVs 136 formed in the periphery portion 130p1 of the integrated circuit component 130A. In some embodiments, the redistribution circuit structure 160 is electrically connected to the integrated circuit component 200 through the periphery portion 130p1 of the integrated circuit component 130A. In some embodiments, the redistribution circuit structure 160 is respectively electrically connected to the periphery portion 130p1 and the device portion 130d1 of the integrated circuit component 130A. In some embodiments, some of the conductive elements 180 are electrically connected to the integrated circuit component 130A (e.g. both of the periphery portion 130p1 and the device portion 130d1) through some of the UBM patterns 170 and the redistribution circuit structure 160, and some of the conductive elements 180 are electrically connected to the integrated circuit component 200 through some of the UBM patterns 170, the redistribution circuit structure 160 and the periphery portion 130p1 of the integrated circuit component 130A.

In other words, for example, the periphery portion 130p1 of the integrated circuit component 130A is a bridge for providing vertically electrical communications between the redistribution circuit structure 160 and the integrated circuit component 200 and between the integrated circuit component 130A and the integrated circuit component 200. Due to the periphery portion 130p1 with the TSVs 136 formed therein, the semiconductor structure P1 is free of through-insulator-vias or through-interlayer-vias (TIVs), thereby reducing the manufacturing cost. Further, since the periphery portion 130p1 and the device portion 130d1 are divided into different and independent regions and the size of the periphery portion 130p1 is controllable, the number of I/O counts may be increased by increasing the size of the periphery portion 130p1, without reducing the size of the device portion 130d1. As shown in FIG. 14, for example, the periphery portion 130p1 and the device portion 130d1 are an integral piece. In some embodiments, a sidewall 160s of the redistribution circuit structure 160 is substantially aligned with a sidewall 140s of the insulating encapsulation 140 and a sidewall 200s of the integrated circuit component 200.

FIG. 17 through FIG. 28 are schematic cross-sectional views showing various stages in a manufacturing method of a semiconductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 17:
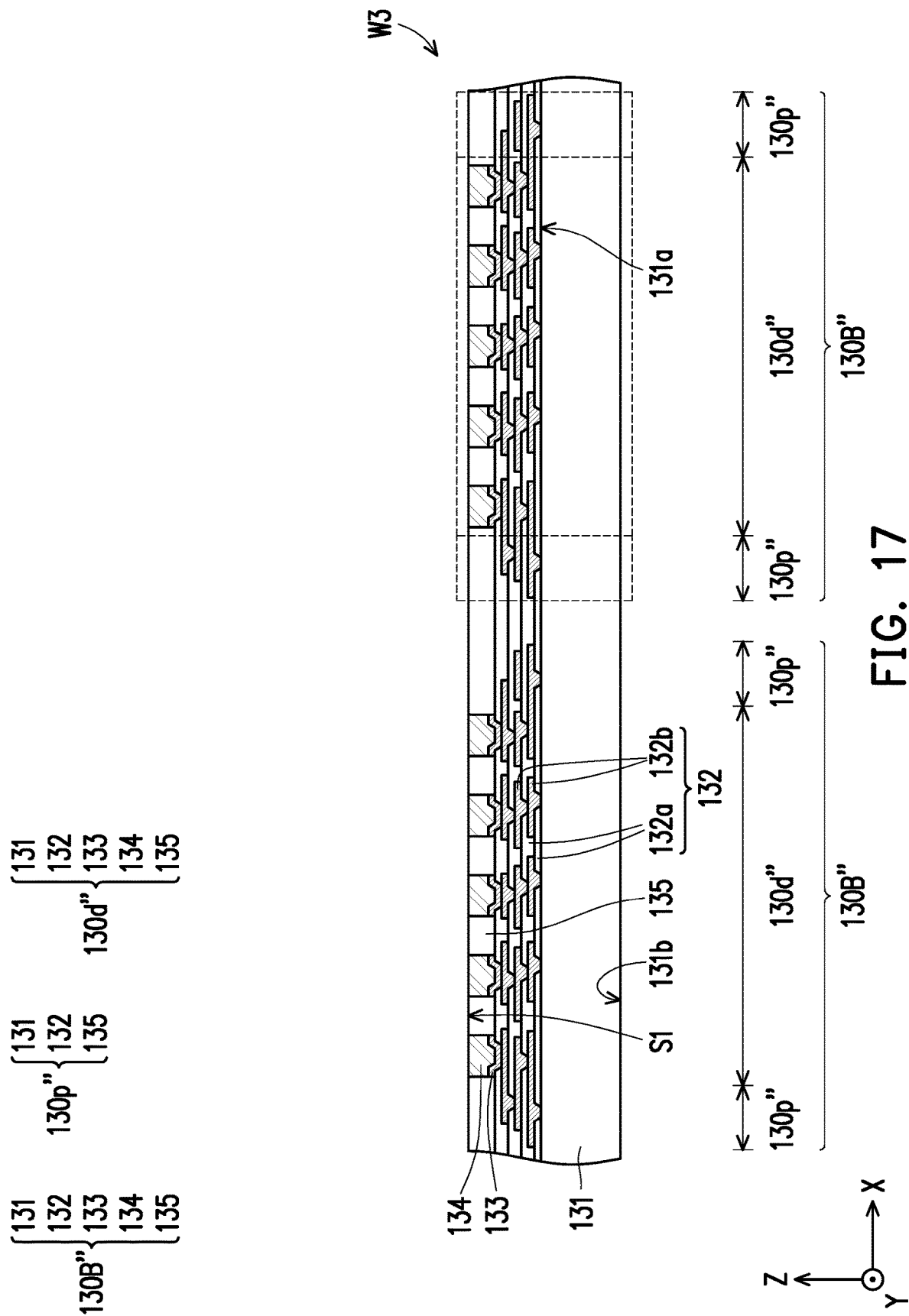
FIG. 17 through FIG. 28 are schematic cross-sectional views showing various stages in a manufacturing method of a semiconductor structure in accordance with some embodiments of the disclosure.

Referring to FIG. 17, in some embodiments, a wafer W3 including a plurality of integrated circuit components 130B" arranged in an array is provided. Before performing a wafer sawing or dicing process on the wafer W3, the integrated circuit components 130B" of the wafer W3 are connected to one another, as shown in FIG. 17, for example. In some embodiments, each of the integrated circuit components 130B" includes a semiconductor substrate 131 having semiconductor devices (not shown) formed therein, an interconnect structure 132 formed on the semiconductor substrate 131, a plurality of connecting pads 133 formed on the interconnect structure 132, a plurality of connecting vias 134 formed on the interconnect structure 132 and a protection layer 135 covers the interconnect structure 132, the connecting pads 133 and the connecting vias 134. The formations and materials of the semiconductor substrate 131, the interconnect structure 132, the connecting pads 133, the connecting vias 134 and the protection layer 135 have been described in FIG. 1, and thus are omitted for brevity.

In some embodiments, the wafer W3 has a plurality of device portions 130d" and a plurality of periphery portions 130p" arranged aside of the device portions 130d". In some embodiments, each of the device portions 130d" includes the semiconductor substrate 131, the interconnect structure 132, the connecting pads 133, the connecting vias 134 and the protection layer 135. The device portion 130d" of the integrated circuit component 130B" is the same as the device portion 130d' of the integrated circuit component 130A, for example. In some embodiments, each of the periphery portions 130p" includes the semiconductor substrate 131, the interconnect structure 132 and the protection layer 135. The periphery portions 130p" of the integrated circuit component 130B" is the different from the periphery portions 130p' of the integrated circuit component 130A', for example. In some embodiments, the interconnect structures 132 of the periphery portions 130p" and the interconnect structure 132 of the device portions 130d" are interconnected, such that the interconnect structures 132 of the periphery portions 130p" are electrically connected to the interconnect structures 132 of the device portions 130d".

Figure 18:
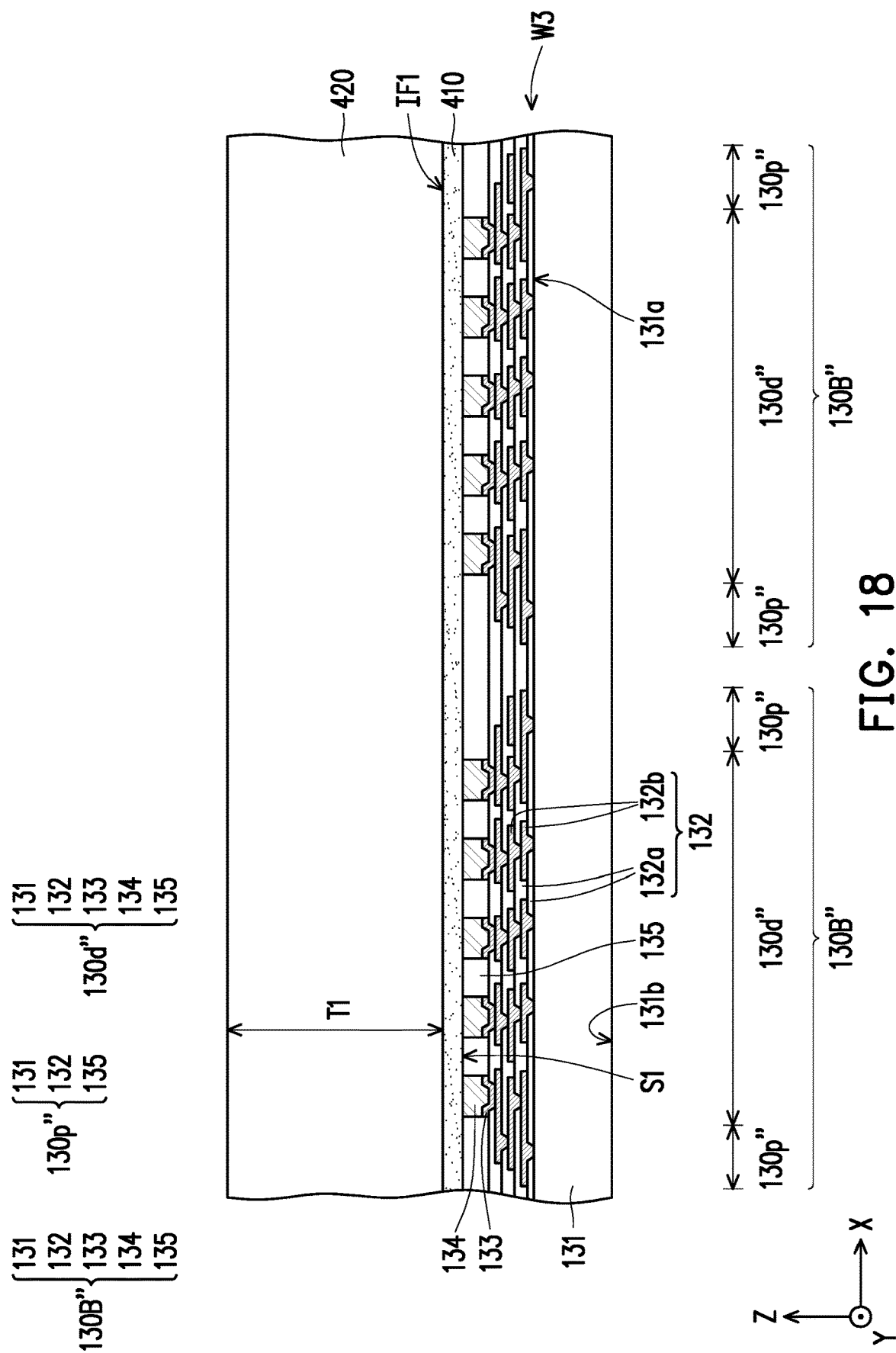

Referring to FIG. 18, in some embodiments, a bonding layer 410 and a semiconductor substrate 420 are sequentially formed on the wafer W3 (e.g. on a front surface S1). The formations and materials of the bonding layer 410 and the semiconductor substrate 420 have been described in FIG. 2, and thus are omitted for brevity. In some embodiments, a bonding interface IF1 between the bonding layer 410 and the semiconductor substrate 420 includes a dielectric-to-dielectric bonding interface (e.g., an oxide-to-nitride bonding interface). In the disclosure, the bonding interface IF1 may be referred to as a fusion bonding interface. In some embodiments, the semiconductor substrate 420 has the thickness T1. As shown in FIG. 18, the bonding layer 410 is located between the semiconductor substrate 420 and the wafer W3, in some embodiments.

Figure 19:
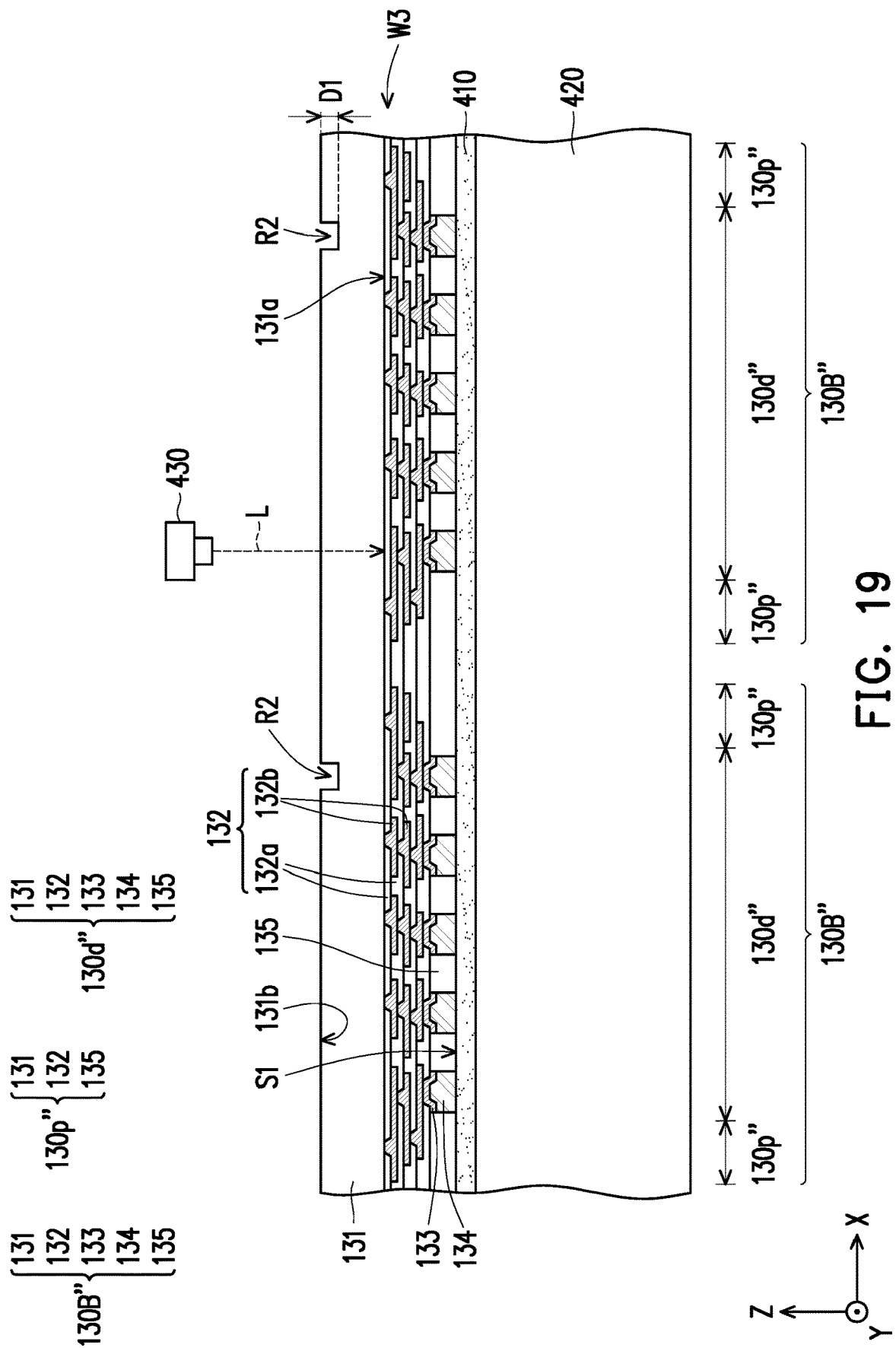

Referring to FIG. 19, in some embodiments, a patterning process is performed on the semiconductor substrate 131 to form recesses R2. The semiconductor substrate 131 is partially removed to form the recesses R2 by photolithography and etching processes or the like, for example. In some embodiments, the recesses R2 each have a depth D1 approximately ranging from 0.5 μm to 5 m (as measured from a bottom surface of one recess R2 to the bottom surface 131b of the semiconductor substrate 131 along the stacked direction Z), for example. In one embodiment, positioning locations of the recesses R2 are determined by a process which a light L emitting from a light detector 430 is reflected by the bottommost layer of the metallization layers 132b of the interconnect structure 132, and an intensity of the light reflection is detected by the light detector 430. With such process, for example, the recesses R2 are easily positioned inside the device portion 130d" respectively arranged at the edges the device portion 130d", which further indicate the locations of the periphery portions 130p".

Figure 20:
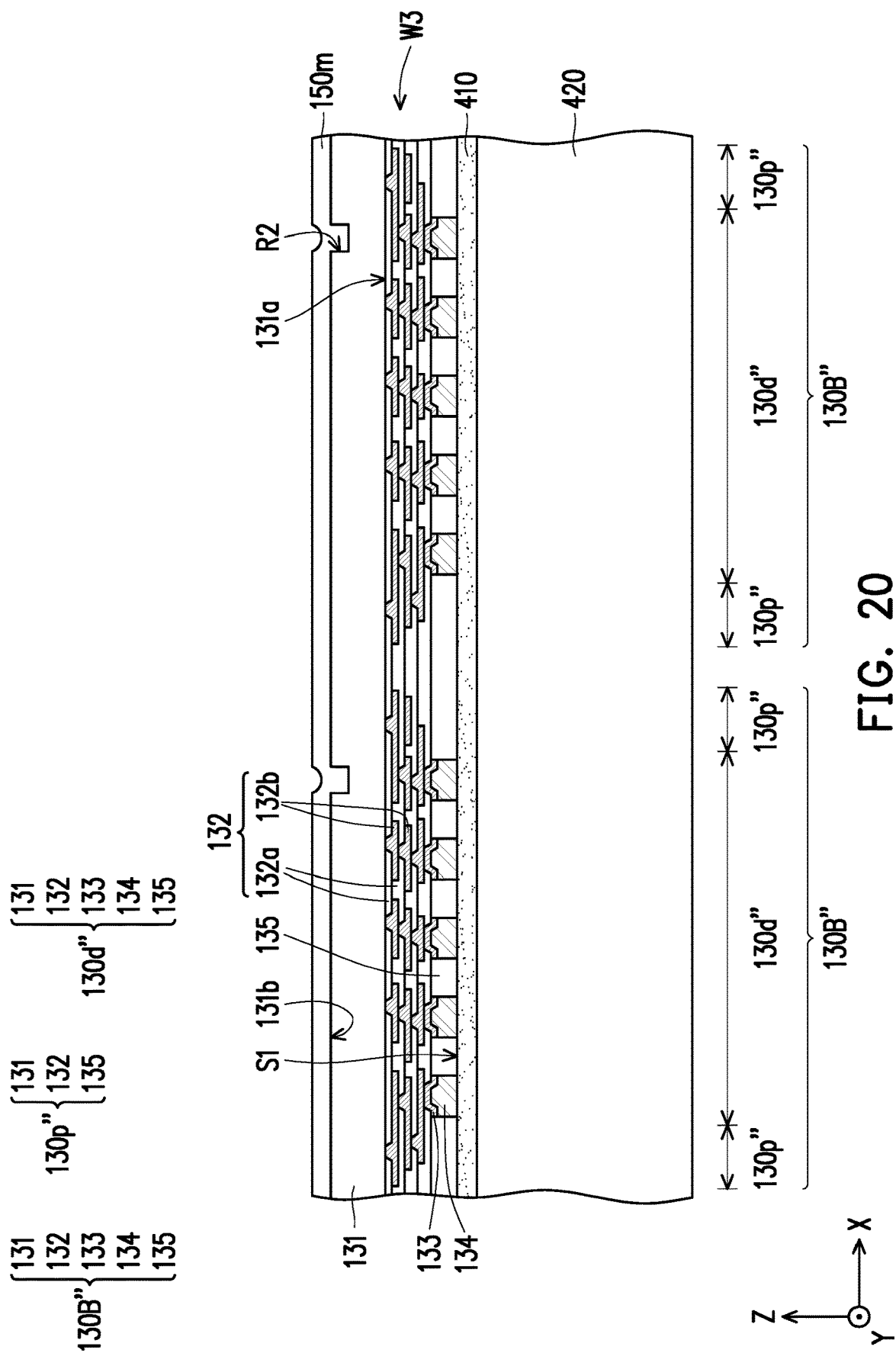

Referring to FIG. 20, in some embodiments, a dielectric material 150m is formed over the wafer W3. In some embodiments, the dielectric material 150m is directly formed on the semiconductor substrate 131 (e.g. on the bottom surface 131b), and the recesses R2 are fully filled with the dielectric material 150m. A thickness of the dielectric material 150m may be greater than the depth D1 of the recesses R2. The formations and materials of the dielectric material 150m have been described in FIG. 5, and thus is omitted for brevity.

Figure 21:
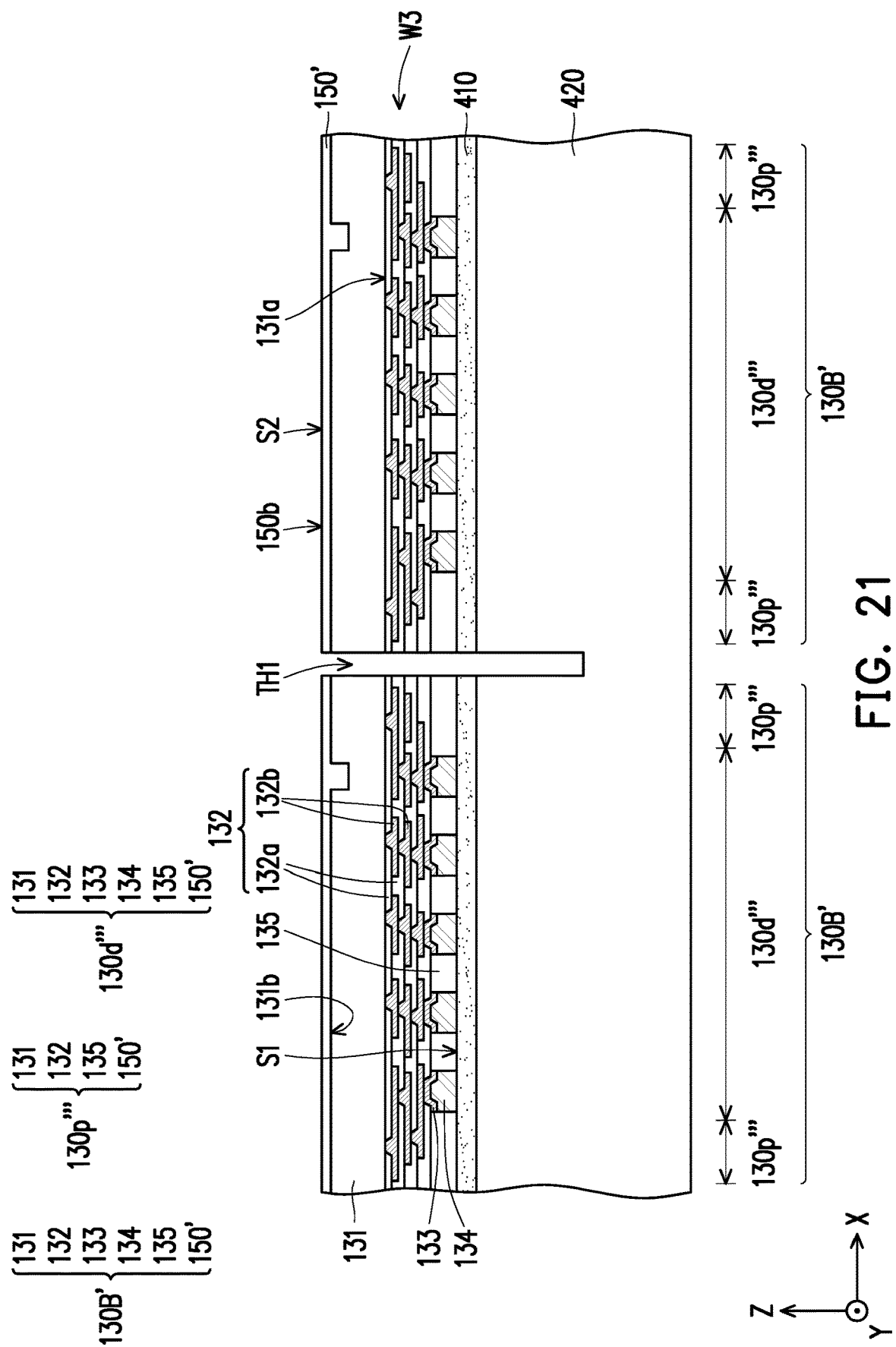

Referring to FIG. 21, in some embodiments, a planarizing process is performed on the dielectric material 150m to form a passivation layer 150'. The formations and materials of the passivation layer 150' have been described in FIG. 6, and thus is omitted for brevity. In some embodiments, portions of the passivation layer 150' extending into the recess R2 are referred to as a plurality of alignment marks (not labeled). The alignment marks may be recognizable and feasible in an infrared (IR) alignment process, where alignment marks may facilitate the formation of later-formed connectors (e.g. conductive vias or conductive pillars) inside the periphery portions 130p'". In some embodiments, the alignment marks include L-shaped alignment marks, cross-shaped alignment marks or alignment marks with other shapes. The shape and number of the alignment marks are not limited to the disclosure, which may be easily modified by adjusting the shape and number of the recesses R2. Up to here, integrated circuit components 130B' are formed in the wafer W3.

For example, each integrated circuit component 130B' includes the semiconductor substrate 131, the interconnect structure 132, the connecting pads 133, the connecting vias 134, the passivation layer 150', and the alignment marks in the recesses R2 formed in the semiconductor substrate 131. For example, each device portion 130d'" includes the semiconductor substrate 131, the interconnect structure 132, the connecting pads 133, the connecting vias 134 and the passivation layer 150' in addition to the alignment marks. For example, each periphery portion 130p'" includes the semiconductor substrate 131, the interconnect structure 132, the connecting pads 133, the connecting vias 134 and the passivation layer 150'. Alternatively, the alignment marks may be formed in the periphery portions 130p" instead of the device portions 130d'", the disclosure is not limited thereto.

In some embodiments, after forming the passivation layer 150', a pre-dicing (or pre-singulation) process is performed.

For example, the pre-dicing process is performed to cut through the wafer W3, the bonding layer 410 and a portion of the semiconductor substrate 420 and form trenches TH1. The pre-dicing (or pre-singulation) process has been described in FIG. 7, and thus is omitted for brevity. As shown in FIG. 21, the trenches TH1 each separate two adjacent integrated circuit components 130B', for example.

Figure 22:
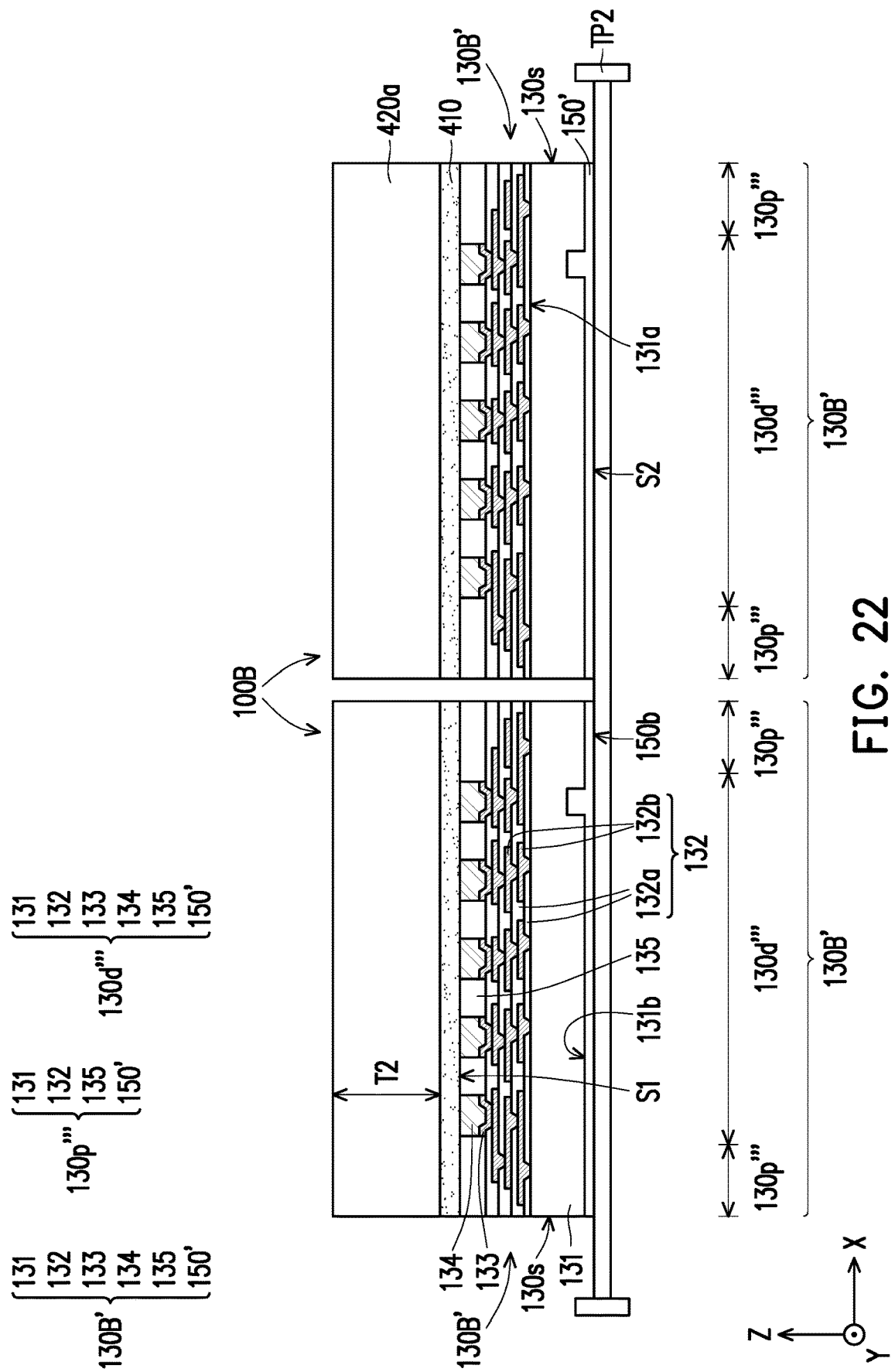

Referring to FIG. 22, in some embodiments, a planarizing process is performed on the structure depicted in FIG. 21 to remove an un-cut portion of the semiconductor substrate 420 to form a plurality of semiconductor components 100B which are separated from one another. For example, each semiconductor component 100B includes one integrated circuit component 130B' with the bonding layer 410 and a thinned semiconductor substrate 420a overlying thereto. In some embodiments, the thinned semiconductor substrate 420a has the thickness T2, where the thickness T2 of the thinned semiconductor substrate 420a is less than the thinness T1 of the semiconductor substrate 420, in some embodiments. The planarizing process has been described in FIG. 8, and thus is omitted for brevity. In some embodiments, prior to the third planarizing process, a holding device TP2 is adopted to secure the structure depicted in FIG. 21 for preventing any damages to the integrated circuit components 130B' by planarizing or any other subsequent process(s). The holding device TP2 may be the same as the holding device TP1 as described in FIG. 8, and thus is not repeated herein. In some embodiments, prior to the planarizing process, the integrated circuit components 130B' being interconnected are tested for functionality and performance by probing, and only known good dies (KGDs) from the tested integrated circuit components 130B' are selected and used for subsequently processing.

Figure 23:
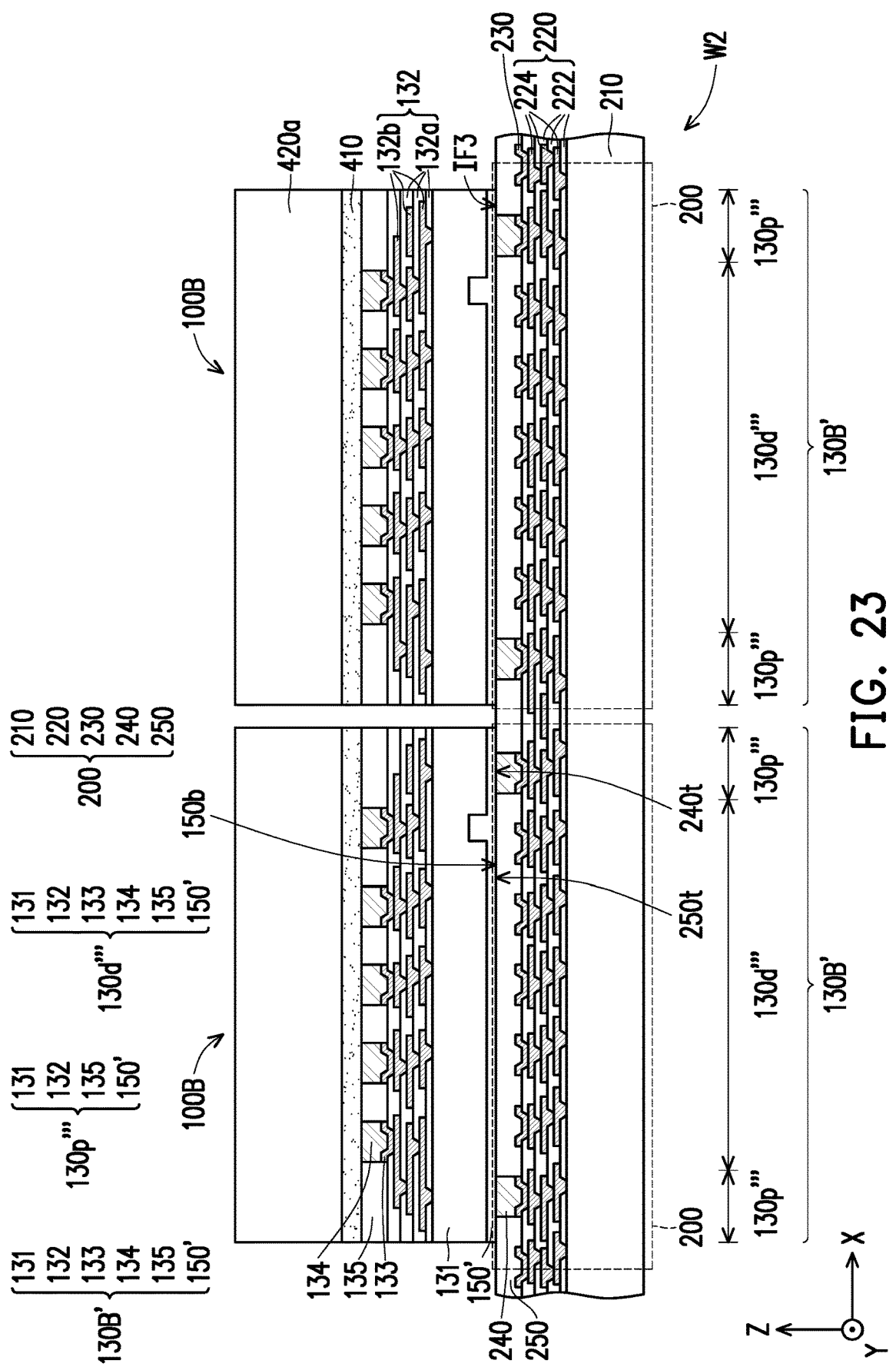

Referring to FIG. 23, in some embodiments, one or more than one semiconductor components 100B are provided and boned to a wafer W2 including a plurality of integrated circuit components 200. For illustration purpose, only two semiconductor components 100B' are shown in FIG. 23, for example. However, the number of the semiconductor components 100B may be more than two or less than two based on the demand and/or design layout, the disclosure is not limited thereto. The details of the wafer W2 and the integrated circuit components 200 have been described in FIG. 9, and thus are not repeated herein.

In some embodiments, the semiconductor components 100B (each including the integrated circuit component 130B') are bonded to the wafer W2 (including multiple integrated circuit components 200) by a hybrid bonding process. One integrated circuit component 130B' may be overlaid on one integrated circuit component 200. For example, one integrated circuit component 130B' is bonded on and electrically connected to one integrated circuit component 200 underlying thereto, as shown in FIG. 23. The bonding process has been described in FIG. 9, and thus is omitted for brevity. Alternatively, multiple integrated circuit components 130B' may be bonded on and electrically connected to one integrated circuit component 200 underlying thereto (not shown).

For example, the protection layer 250 and portions of the passivation layer 150', which prop against each other, are bonded together through a direct dielectrics-to-dielectrics bonding. On the other hand, the connecting vias 240 and other portions of the passivation layer 150', which prop against each other, are bonded together through a directly dielectric-to-metal bonding, for example. In addition, In such embodiments, a bonding interface IF3 between the integrated circuit component 130B' (respectively included in the semiconductor components 100B) and the integrated circuit components 200 (included in the wafer W2) includes a dielectric-to-dielectric bonding interface (e.g., an oxide-to-nitride bonding interface) and a dielectric-to-metal interface (e.g., an oxide-to-copper bonding or a nitride-to-copper bonding. In the disclosure, the bonding interface IF3 may be referred to as a hybrid bonding interface.

Figure 24:
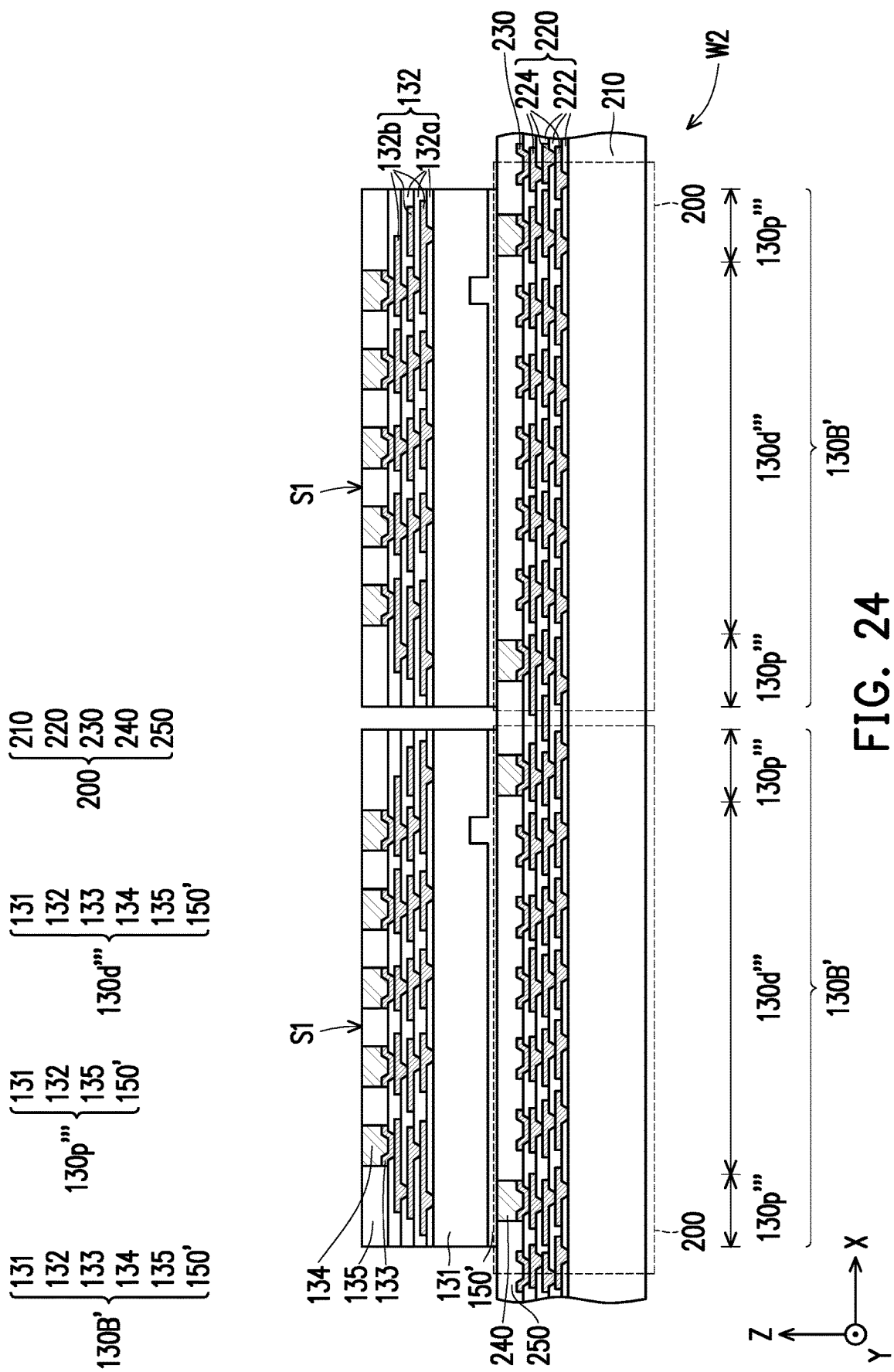

Referring to FIG. 24, in some embodiments, a planarizing process is performed on the semiconductor components 100B to remove the bonding layer 410 and the thinned semiconductor substrate 420a therefrom, thereby exposing the integrated circuit components 130B'. The planarizing process has been described in FIG. 10, and thus is omitted for brevity. Through the planarizing process, in some embodiments, the fourth surfaces S1 of the integrated circuit components 130B', are accessibly revealed.

Figure 25:
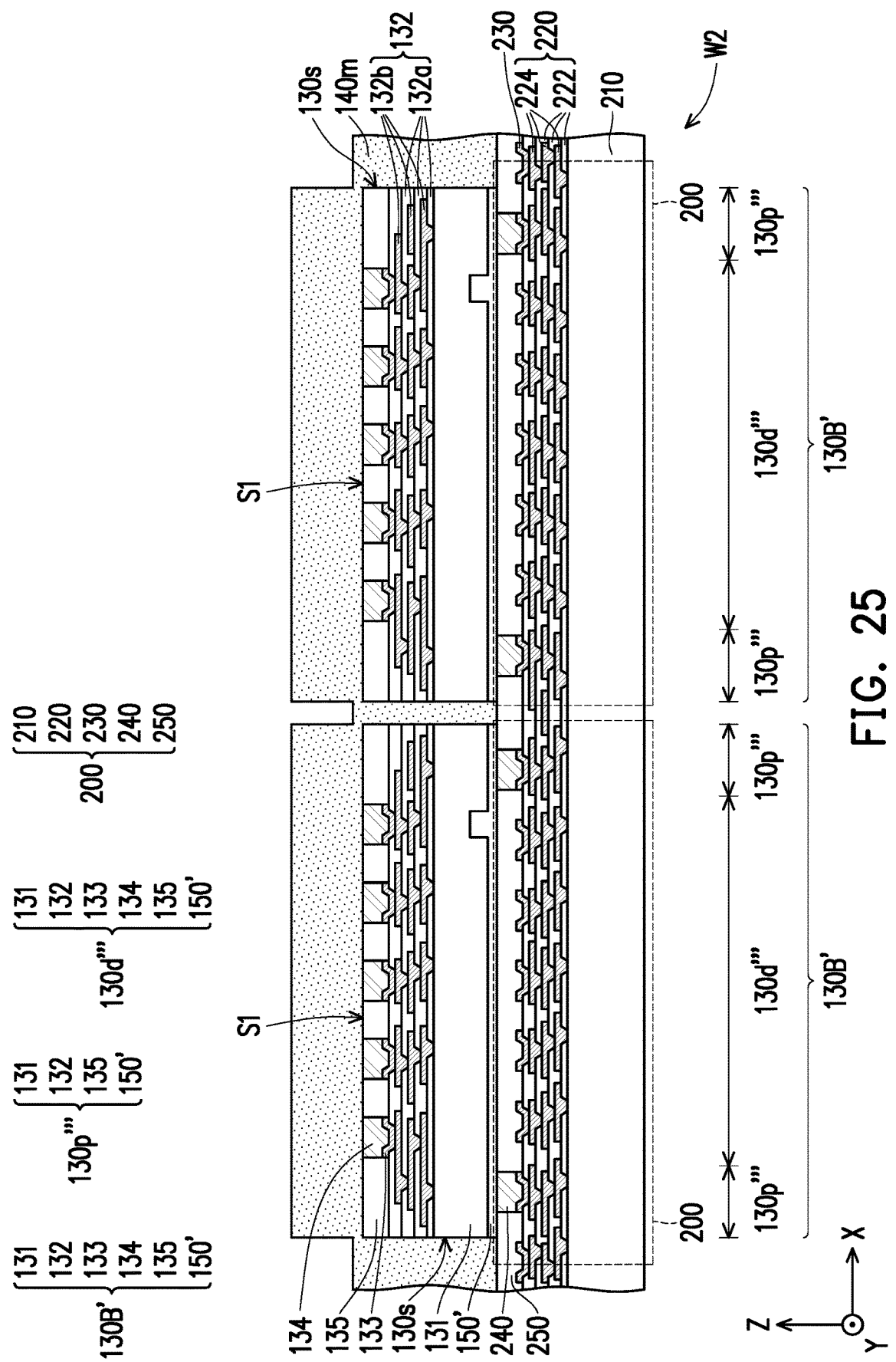

Referring to FIG. 25, in some embodiments, an insulating encapsulation 140m is formed over the wafer W2. For example, the insulating encapsulation 140m is conformally formed on the integrated circuit components 130B', where the integrated circuit components 130B' and a portion of the wafer W2 exposed by the integrated circuit components 130B' are covered by the insulating encapsulation 140m. In some embodiments, the top surface S1 and a sidewall 130s of each of the integrated circuit components 130B' are physically contacted with and encapsulated by the insulating encapsulation 140m. The formation and material of insulating encapsulation 140m have been described in FIG. 11, and thus are not repeated herein. As shown in FIG. 25, the integrated circuit components 130B' are not accessibly revealed by the insulating encapsulation 140m, for example.

Figure 26:
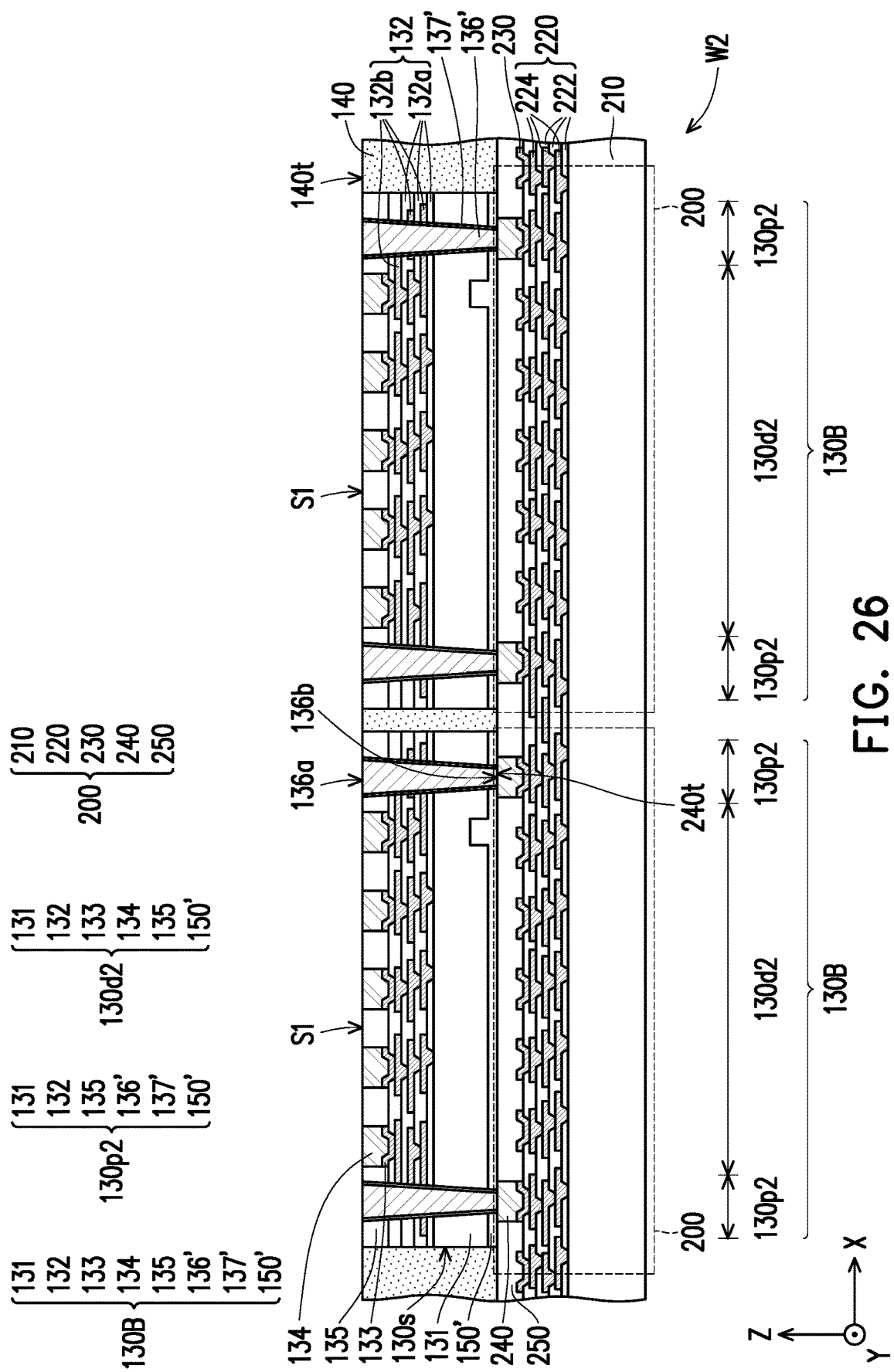

Referring to FIG. 26, in some embodiments, a planarizing process is performed on the insulating encapsulation 140m to form an insulating encapsulation 140 exposing the integrated circuit components 130B'. The planarizing process has been described in FIG. 12, and thus is omitted for brevity. For example, a portion of the insulating encapsulation 140m is removed to form the insulating encapsulation 140 having a top surface 140t, where the top surface 140t is a flat and planar surface. In some embodiments, the top surfaces S1 of the integrated circuit components 130B' are substantially leveled with the top surface 140t of the insulating encapsulation 140. The sidewalls 130s of the integrated circuit components 130B' and the surface of the wafer W2 exposed by the integrated circuit components 130B' are covered by the insulating encapsulation 140, in some embodiments.

In some embodiments, as shown in FIG. 25 and FIG. 26, after the insulating encapsulation 140 is formed, a plurality of through holes (not labeled) are formed in the periphery portions 130p''', where the through holes penetrate through the protection layer 135, the interconnect structure 132, the semiconductor substrate 131 and the passivation layer 150' to expose the top surfaces 240t of the connecting vias 240. In some embodiments, the through holes are, for example, formed by a laser drilling process. For example, in FIG. 26, only two through holes are shown in each of the integrated circuit components 130B', however the disclosure is not limited thereto. The number of the through holes may be one or more than one depending on the demand. In some embodiments, if considering the through holes are holes with substantially round-shaped cross-section (from the top view on the X-Y plane), each of the through holes includes a slant sidewall (from the cross sectional view depicted un FIG. 26), where each of through holes has a top opening (at the front surface S1) having a top diameter and a bottom opening (at the back surface S2) having a bottom diameter, and the top diameter is greater than the bottom diameter. Alternatively, each of the through holes may include a vertical sidewall, where the top diameter may be substantially equal to the bottom diameter. The cross-sectional shape of the through holes on the X-Y plane is, for example, elliptical, oval, tetragonal, octagonal or any suitable polygonal shape.

As illustrated in FIG. 26, in some embodiments, conductive vias 136' and liners 137' are then formed in the through holes formed in the periphery portions 130p''' to form integrated circuit components 130B. For example, each of the conductive vias 136' is laterally covered by one of the liners 137'. In some embodiment, through the liners 137', the conductive vias 136' are separated from the protection layer 135, the interconnect structure 132, the semiconductor substrate 131 and the passivation layer 151'. For example, the conductive vias 136' are physically and electrically connected to the connecting vias 240, and the conductive vias 136' are physically and electrically isolated from the interconnect structure 132 and the semiconductor substrate 131. Alternatively, a dielectric liner (not shown) may be further optionally formed to laterally separate the liners 137' from the protection layer 135, the interconnect structure 132, the semiconductor substrate 131 and the passivation layer 151'. The formations and materials of the conductive vias 136, the liners 137 and the optional dielectric liner have been described in FIG. 1, and thus are not repeated herein. For example, as shown in FIG. 26, the conductive vias 136' are formed by using a via-last approach. In the disclosure, since the conductive vias 136' may be referred to as through semiconductor vias or through silicon vias (TSVs) 136'. Up to here, integrated circuit components 130B are formed, and the integrated circuit components 130B (e.g. the connecting vias 134 and the TSVs 136') are accessibly revealed by the insulating encapsulation 140, for example. The integrated circuit components 130B may be referred to as a semiconductor device, such as a semiconductor chip or die.

The integrated circuit components 130B each may include one device portion 130d2 and one or more than one periphery portion 130p2. For example, each of the integrated circuit components 130B includes one device portion 130d2 and one periphery portion 130p2 connected to (e.g. joined to) and laterally surrounding the device portion 130d2. In some embodiments, each of the device portions 130d2 includes the semiconductor substrate 131, the interconnect structure 132, the connecting pads 133, the connecting vias 134, the protection layer 135, the passivation layer 150' and the alignment mark, where the device portions 130d2 provides functions including memory structures (e.g., a memory cell), processing structures (e.g., a logic cell), or the like. In some embodiments, each of the periphery portions 130p2 includes the semiconductor substrate 131, the interconnect structure 132, the protection layer 135, the TSVs 136', the liners 137' and the passivation layer 150', where the periphery portions 130p2 provides functions including input/output (I/O) circuitry (e.g. an I/O cell) or the like. The device portions 130d2 may be referred to as a semiconductor device component (such as a semiconductor chip or die) and the periphery portions 130p2 may be referred to as a connecting bridge providing routing function. The positioning locations and configurations of the device portions 130d2 and the periphery portions 130p2 may be the same or similar to the positioning locations and configurations of the device portions 130d1 and the periphery portions 130p1 described in FIG. 15 or FIG. 16, and thus are omitted for brevity. As shown in FIG. 26, in some embodiments, the top surfaces 136a of the TSVs 136' are substantially leveled with the front surfaces S1 of the integrated circuit components 130B and the top surface 140t of the insulating encapsulation 140. For example, the top surfaces 136a of the TSVs 136' are substantially coplanar to the front surfaces S1 of the integrated circuit components 130B and the top surface 140t of the insulating encapsulation 140.

Alternatively, the integrated circuit components 130B may include one device portion and multiple periphery portions separated from the device portion. In such embodiments, the sizes of these periphery portions are different. In other embodiments, the sizes of these periphery portions are the same. The sizes of the periphery portions are not limited to the disclosure, and may be selected and designated based on the demand and the design layout.

Figure 27:
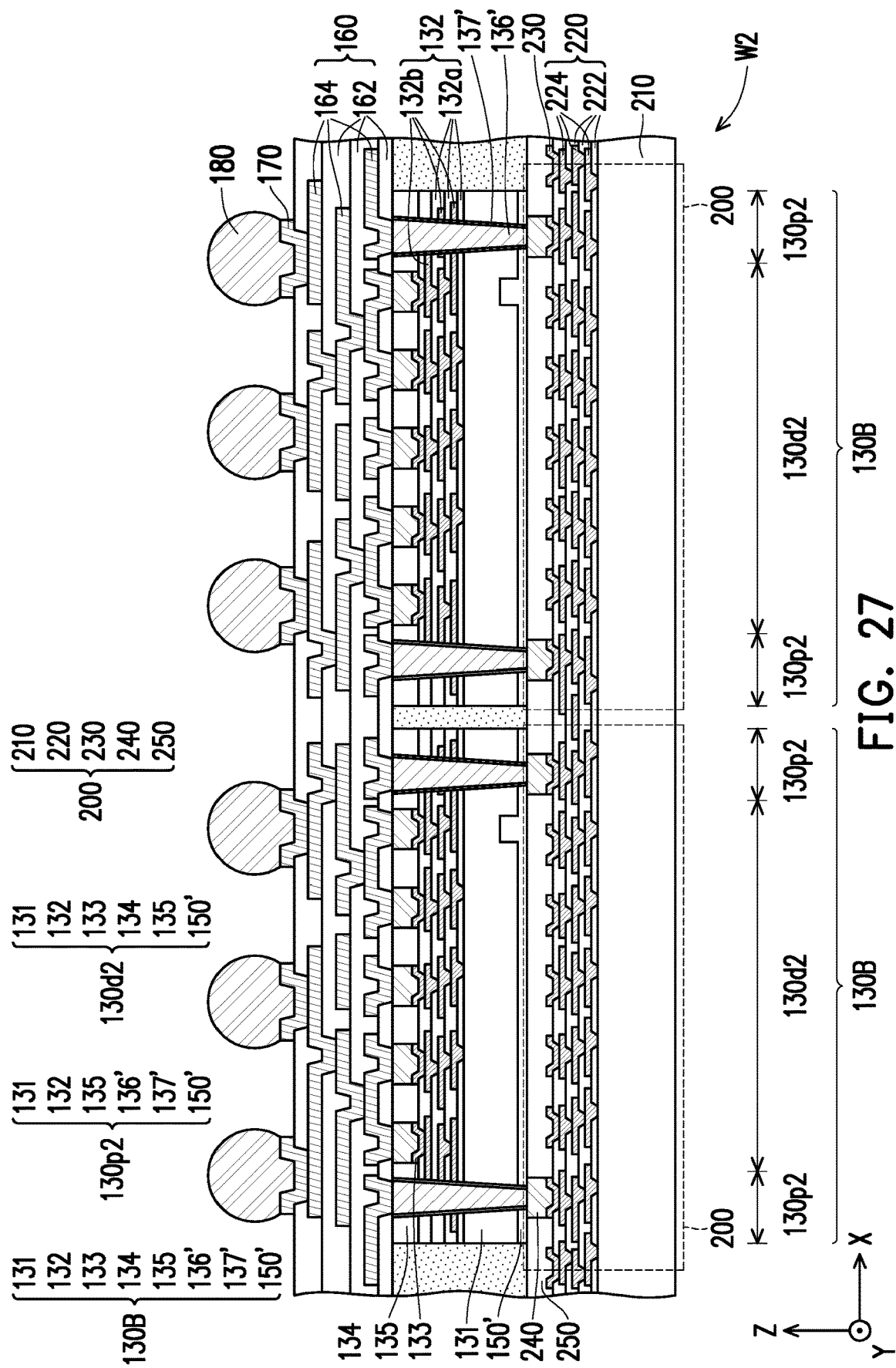

Referring to FIG. 27, in some embodiments, after forming the TSVs 136' and the liners 137' of the integrated circuit components 130B, a redistribution circuit structure 160, a plurality of under-ball metallurgy (UBM) patterns 170 and a plurality of conductive elements 180 are sequentially formed over the wafer W2. The formations and materials of the redistribution circuit structure 160, the UBM patterns 170 and the conductive balls 180 have been described in FIG. 13, and thus are not repeated herein. The numbers of the UBM patterns 170 and the conductive elements 180 are not limited in the disclosure, and may be selected and designated based on demand and design layout. The numbers of the layers of the polymer dielectric layers 162 and the patterned conductive layers 164 may be less than or more than what is depicted in FIG. 27, and may be designated based on the demand and/or design layout; the disclosure is not specifically limited thereto.

For example, the redistribution circuit structure 160 is formed on the integrated circuit components 130B, the UBM patterns 170 are formed on the redistribution circuit structure 160, and the conductive elements 180 are respectively formed on the UBM patterns 170. In some embodiments, the redistribution circuit structure 160 is electrically connected to the device portions 130d2 of the integrated circuit components 130B through the connecting vias 134, is electrically connected to the periphery portions 130p2 of the integrated circuit components 130B through the TSVs 136', and is electrically connected to the integrated circuit components 200 through the periphery portions 130p2. The integrated circuit components 130B are electrically connected to the integrated circuit components 200 through the redistribution circuit structure 160 and the periphery portions 130p2, for example. In some embodiments, the conductive elements 180 are electrically connected to the redistribution circuit structure 160 through the UBM patterns 170. Due to the UBM patterns 170, the adhesive strength between the conductive elements 180 and the redistribution circuit structure 160 is enhanced. However, the disclosure is not limited thereto. Alternatively, the UBM patterns 170 may be omitted, the disclosure is not limited thereto.

Figure 28:
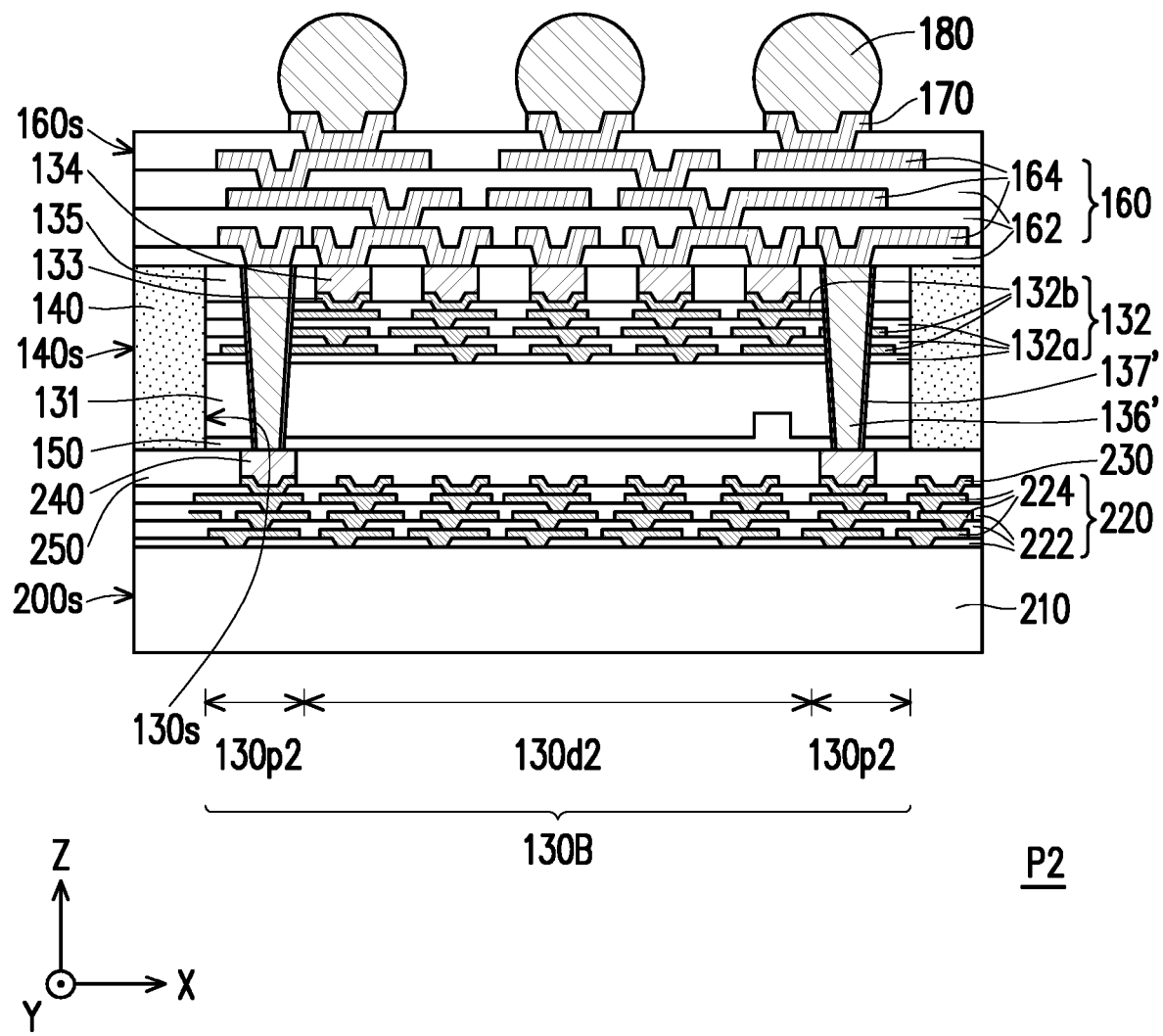

Referring to FIG. 28, in some embodiments, a singulation (dicing) process is performed to cut the structure depicted in FIG. 27 into individual and separate semiconductor structures P2. In one embodiment, the singulation (dicing) process is a wafer dicing process or a wafer singulation process including mechanical sawing or laser cutting. Up to here, the semiconductor structure P2 is manufactured. In some embodiments, the integrated circuit component 130B is hybrid bonded to the integrated circuit component 200 with the bonding interface IF3. In some embodiments, as shown in FIG. 28, the semiconductor structure P2 includes the integrated circuit component 200, the integrated circuit component 130B located on the integrated circuit component 200, the insulating encapsulation 140 laterally covered the integrated circuit component 130B and on the integrated circuit component 200 exposed by the integrated circuit component 130B, the redistribution circuit structure 160 located on the integrated circuit component 130B and the insulating encapsulation 140, the UBMs patterns 170 on the redistribution circuit structure 160, and the conductive elements 180 on the UBMs patterns 170. The additional semiconductor passive devices may be disposed on the conductive pads formed on the redistribution circuit structure 160. Due to the integrated circuit component 200 is exposed to the external environment, the semiconductor structure P2 is capable of having better heat dissipating performance.

In some embodiments, the redistribution circuit structure 160 is respectively electrically connected to the periphery portion 130p2 and the device portion 130d2 of the integrated circuit component 130B. For example, the integrated circuit component 130B (e.g., the semiconductor devices in the device portion 130d2) is electrically connected to the integrated circuit component 200 (e.g., the semiconductor devices in the semiconductor substrate 210) through the TSVs 136' in the periphery portion 130p2 and the redistribution circuit structure 160. In other words, for example, the periphery portion 130p2 of the integrated circuit component 130B is a bridge for providing vertically electrical communications between the redistribution circuit structure 160 and the integrated circuit component 200 and between the integrated circuit component 130B and the integrated circuit component 200. Due to the periphery portion 130p2 with the TSVs 136 formed therein, the semiconductor structure P2 is free of through-insulator-vias or through-interlayer-vias (TIVs), thereby reducing the manufacturing cost. Further, since the periphery portion 130p2 and the device portion 130d2 are divided into different and independent regions and the size of the periphery portion 130p2 is controllable, the number of I/O counts may be increased by increasing the size of the periphery portion 130p2, without reducing the size of the device portion 130d2. As shown in FIG. 28, for example, the periphery portion 130p2 and the device portion 130d2 are an integral piece. In some embodiments, a sidewall 160s of the redistribution circuit structure 160 is substantially aligned with a sidewall 140s of the insulating encapsulation 140 and a sidewall 200s of the integrated circuit component 200.

In the above embodiments, the integrated circuit components 130A and/or 130B are bonded to the integrated circuit components 200 in a manner of a chip-on-wafer (CoW) bonding, however the disclosure is not limited thereto. In some alternative embodiments, the integrated circuit components 130A and/or 130B are bonded to the integrated circuit components 200 in a manner of a wafer-on-wafer (WoW) bonding.

Figure 29:
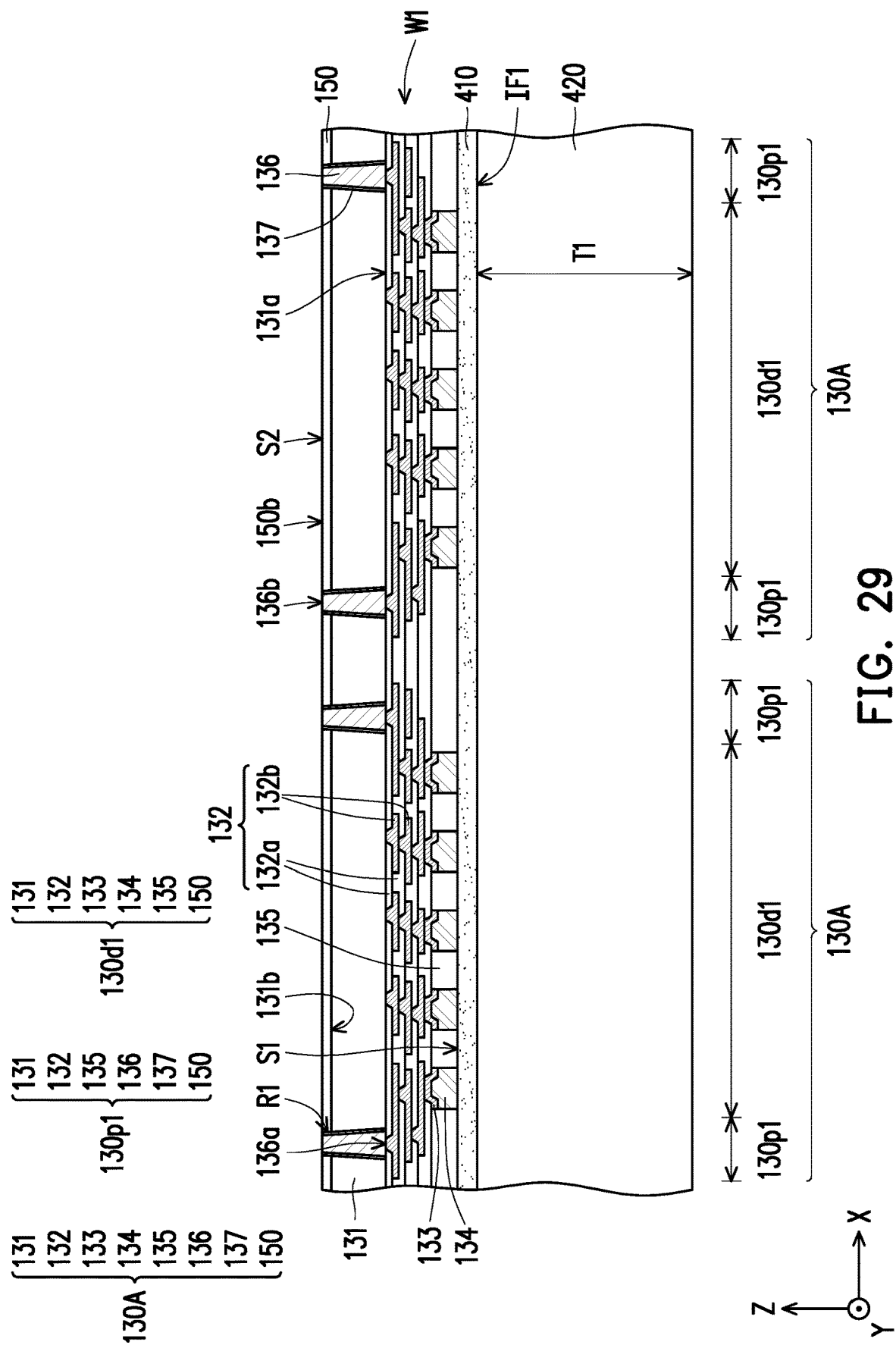
FIG. 29 through FIG. 33 are schematic cross-sectional views showing various stages in a manufacturing method of a semiconductor structure in accordance with some embodiments of the disclosure.
Figure 30:
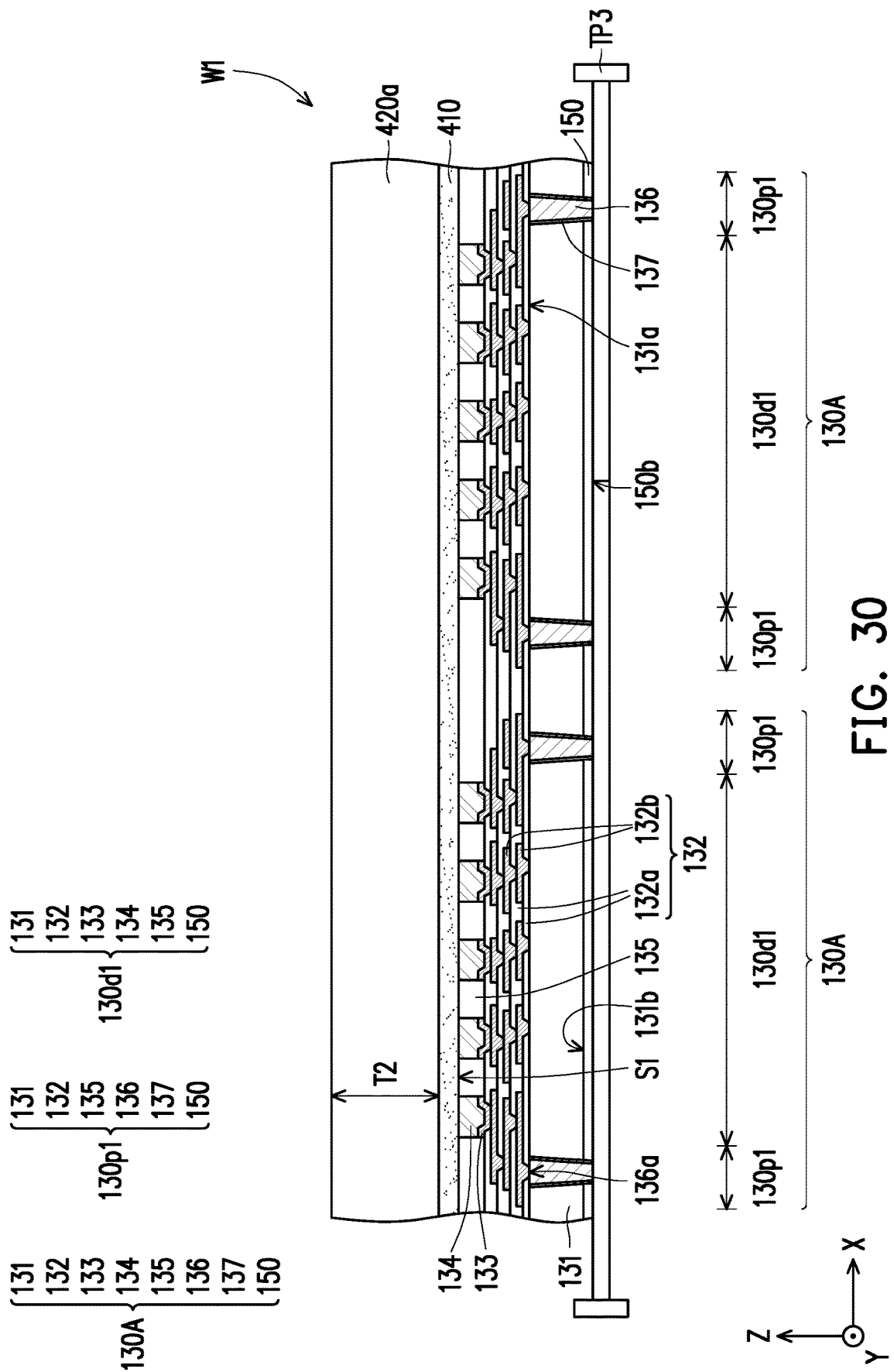
Figure 31:
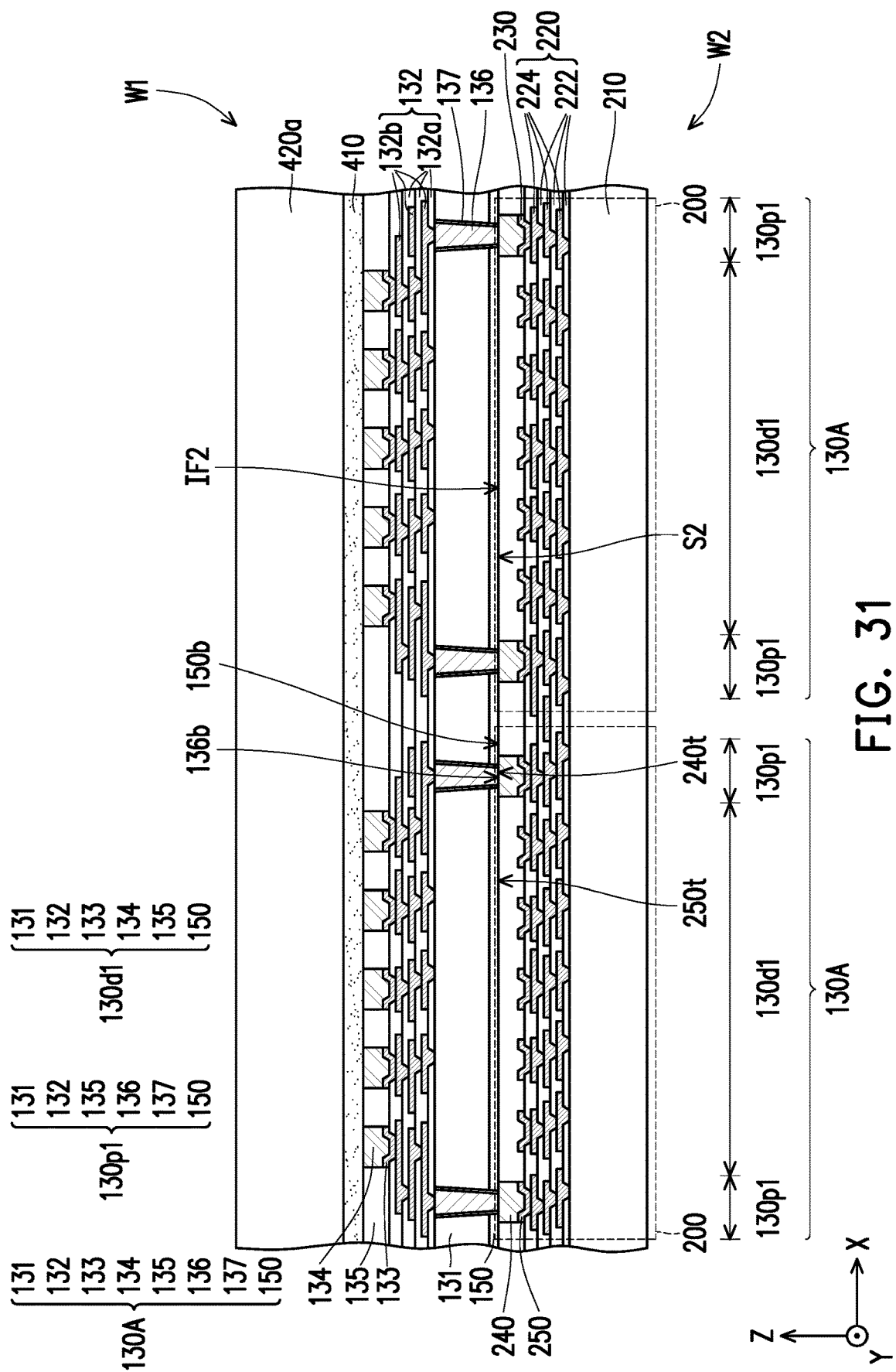
Figure 32:
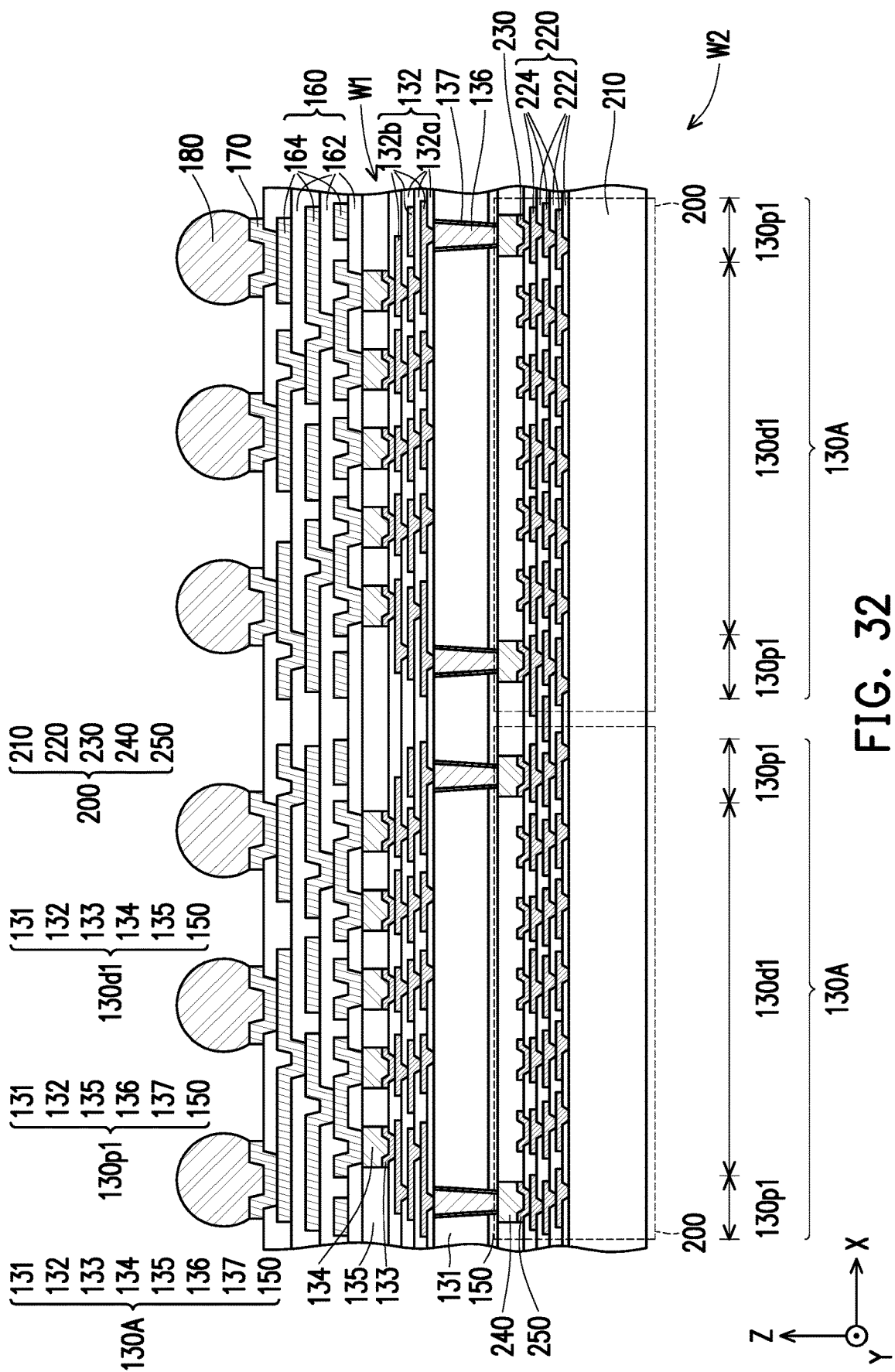
Figure 33:
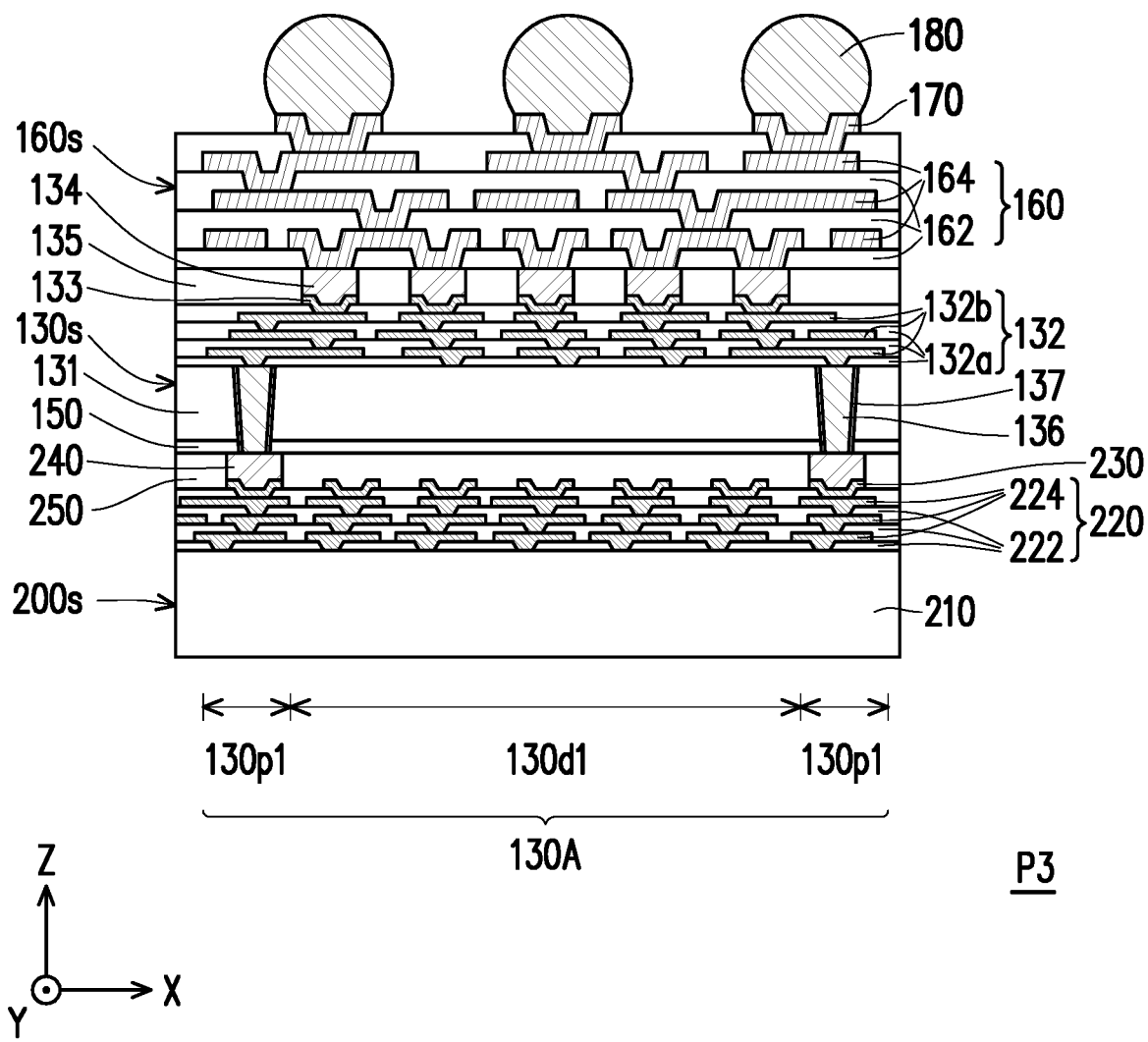

FIG. 29 through FIG. 33 are schematic cross-sectional views showing various stages in a manufacturing method of a semiconductor structure in accordance with some embodiments of the disclosure. A semiconductor structure P3 depicted in FIG. 33 is similar to the semiconductor structure P1 depicted in FIG. 14, the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 29, in some embodiments, a passivation layer 150 is formed by performing a planarizing process to form a plurality of integrated circuit components 130A in the wafer W1, following the process as described in FIG. 5. The details of the wafer W1 and the integrated circuit components 130A and the planarizing process have been described in FIG. 6, and thus are not repeated herein. Referring to FIG. 30, in some embodiments, the structure depicted in FIG. 29 is flipped upside down and placed onto a holding device TP3, and another planarizing process is performed to form a thinned semiconductor substrate 420a by removing a portion the semiconductor substrate 420. The planarizing processes may be the same or similar to the planarizing process as described in FIG. 8, and thus are omitted for brevity. The holding device TP3 may be the same or similar to the holding device TP1, and thus is not repeated herein.

Referring to FIG. 31, in some embodiments, the wafer W1 is placed over a wafer W2, and a hybrid bonding process is performed to bond the wafer W1 to the wafer W2. The details of the wafer W2 and the integrated circuit components 200 have been described in FIG. 9, and thus are not repeated herein. In some embodiments, the wafer W1 (e.g. the integrated circuit components 130A) is hybrid bonded to the wafer W2 (e.g., the integrated circuit components 200) with the bonding interface IF2 (e.g. a hybrid bonding interface). For example, the TSVs 136 of the wafer W1 is bonded to the connecting vias 240 of the wafer W2 through a direct metal-to-metal bonding (e.g., a copper-to-copper bonding), and the passivation layer 150 of the wafer W1 is boned to the protection layer 250 of the wafer 250 through a direct dielectric-to-dielectric bonding (e.g., an oxide-to-nitride bonding). In some embodiments, the passivation layer 150 immediately adjacent to TSVs 136 is bonded to a portion of each of the connecting vias 240 (e.g. a dielectric-to-metal bonding) when the bottom surfaces 136b of the TSVs 136 are smaller than the top surfaces 240t of corresponding connecting vias 240. The details of the hybrid bonding process have been described in FIG. 9, and thus are not repeated herein. Referring to FIG. 32, in some embodiments, a redistribution circuit structure 160, a plurality of under-ball metallurgy (UBM) patterns 170 and a plurality of conductive elements 180 are sequentially formed on the wafer W1 and over the wafer W2. The formations and materials of the redistribution circuit structure 160, the UBM patterns 170 and the conductive balls 180 have been described in FIG. 13, and thus are not repeated herein. Due to the integrated circuit component 130A and the redistribution circuit structure 160 are, for example, electrically connected to the integrated circuit component 200 through the periphery portion 130p1, the periphery portion 130p1 of the integrated circuit component 130A is a bridge for providing vertically electrical communications between the redistribution circuit structure 160 and the integrated circuit component 200 and between the integrated circuit component 130A and the integrated circuit component 200, and the semiconductor structure P3 is free of through-insulator-vias or through-interlayer-vias (TIVs), thereby reducing the manufacturing cost. Furthermore, the number of I/O counts of the semiconductor structure P3 is increased by increasing the size of the periphery portion 130p1, without reducing the size of the device portion 130d1.

Referring to FIG. 33, in some embodiments, a singulation (dicing) process is performed to cut the structure depicted in FIG. 32 into individual and separate semiconductor structures P3. In one embodiment, the singulation (dicing) process is a wafer dicing process or a wafer singulation process including mechanical sawing or laser cutting. Up to here, the semiconductor structure P3 is manufactured. The semiconductor structure P3 depicted in FIG. 33 is similar to the semiconductor structure P1 depicted in FIG. 14, the difference is that, the semiconductor structure P3 includes no insulating encapsulation 140 laterally encapsulating the integrated circuit component 130A and over the integrated circuit component 200. That is, in the semiconductor structure P3 as shown in FIG. 33, for example, a sidewall 130s of the integrated circuit component 130A is substantially aligned with and substantially coplanar to the sidewall 160s of the redistribution circuit structure 160 and the sidewall 200s of the integrated circuit component 200. Due to the integrated circuit component 130A (e.g., the sidewall of the semiconductor substrate 131) and the integrated circuit component 200 exposed to the external environment, the semiconductor structure P3 is capable of having further better heat dissipating performance.

Figure 34:
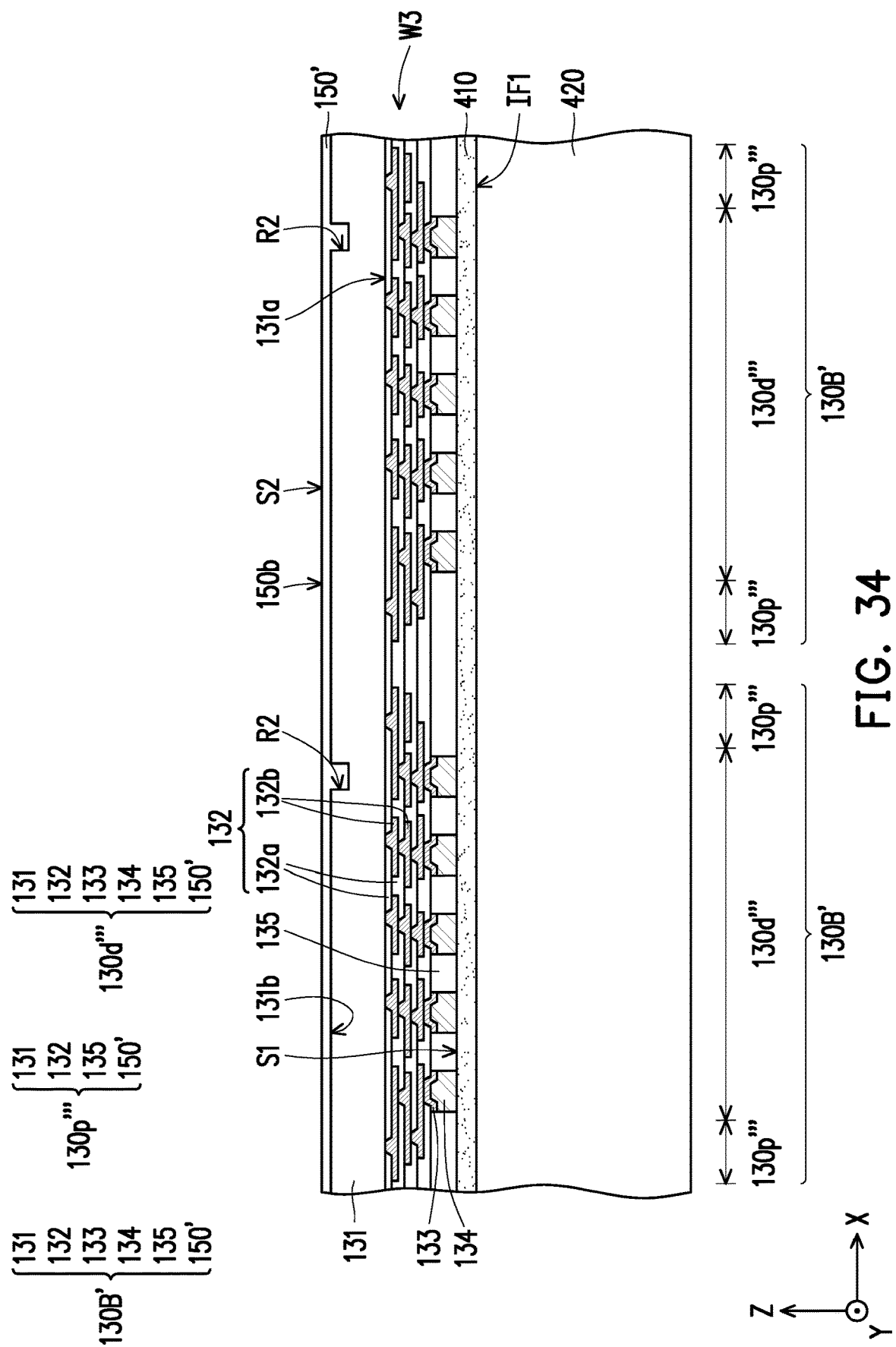
FIG. 34 through FIG. 39 are schematic cross-sectional views showing various stages in a manufacturing method of a semiconductor structure in accordance with some embodiments of the disclosure.
Figure 35:
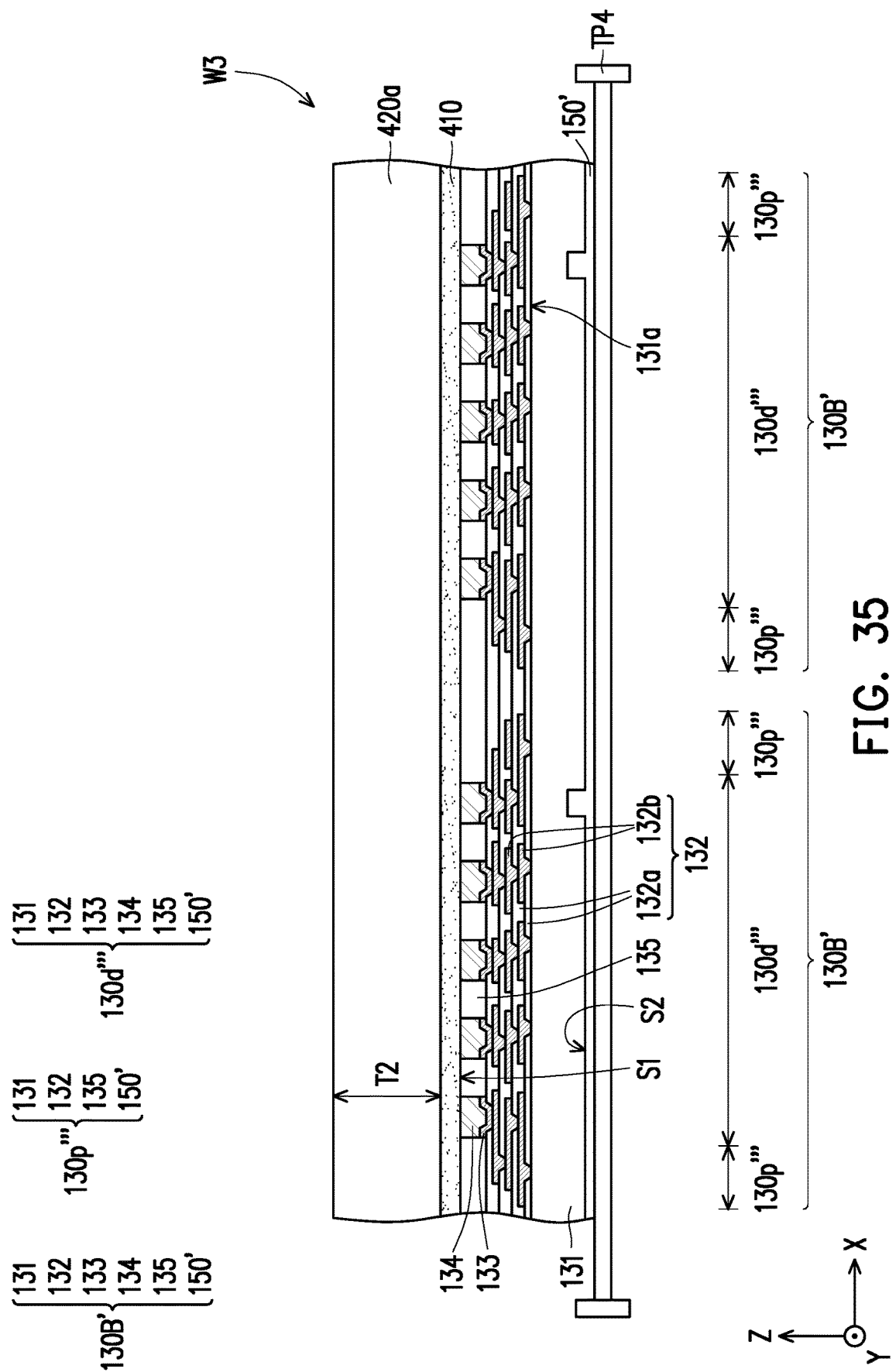
Figure 37:
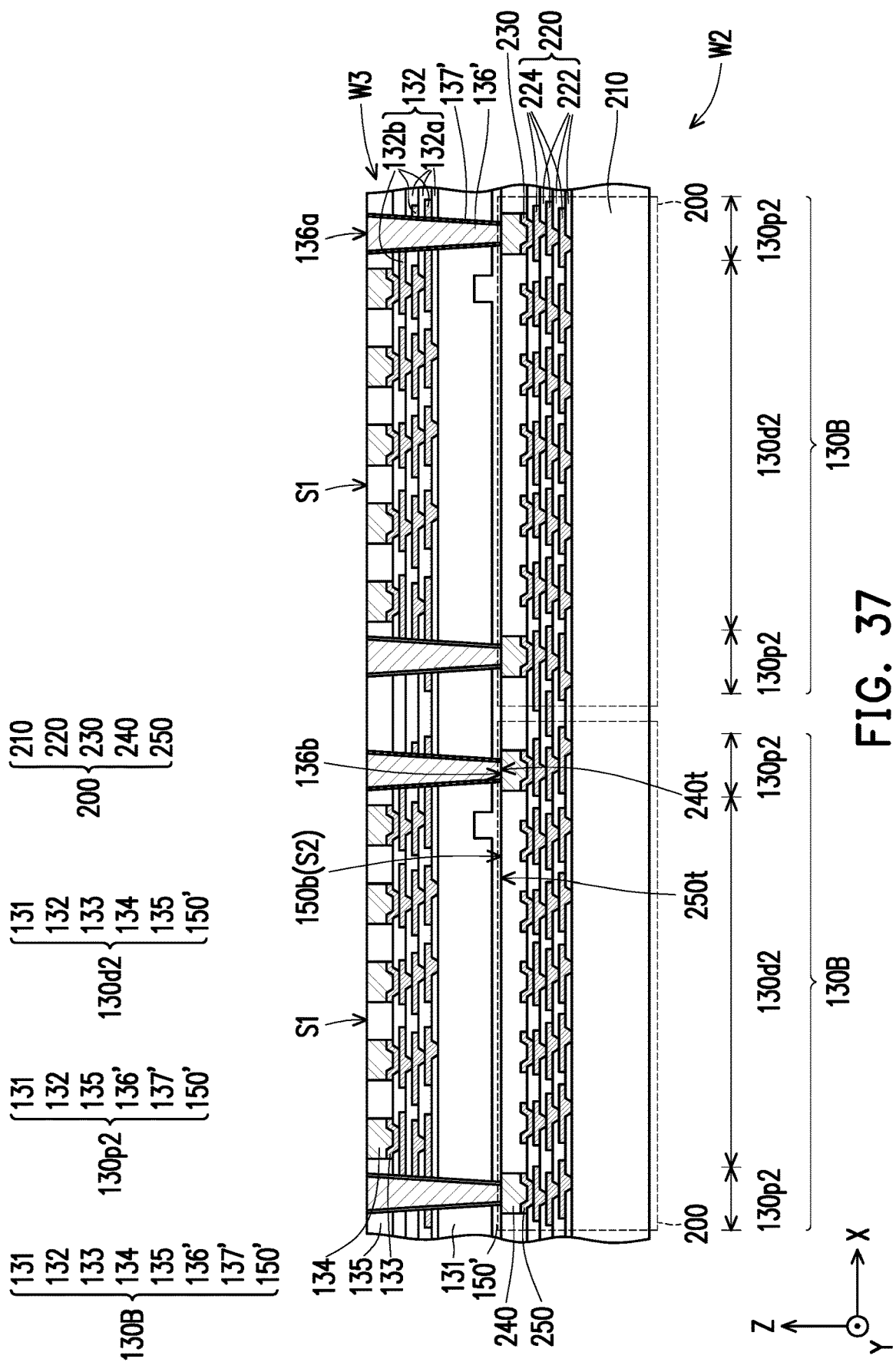
Figure 38:
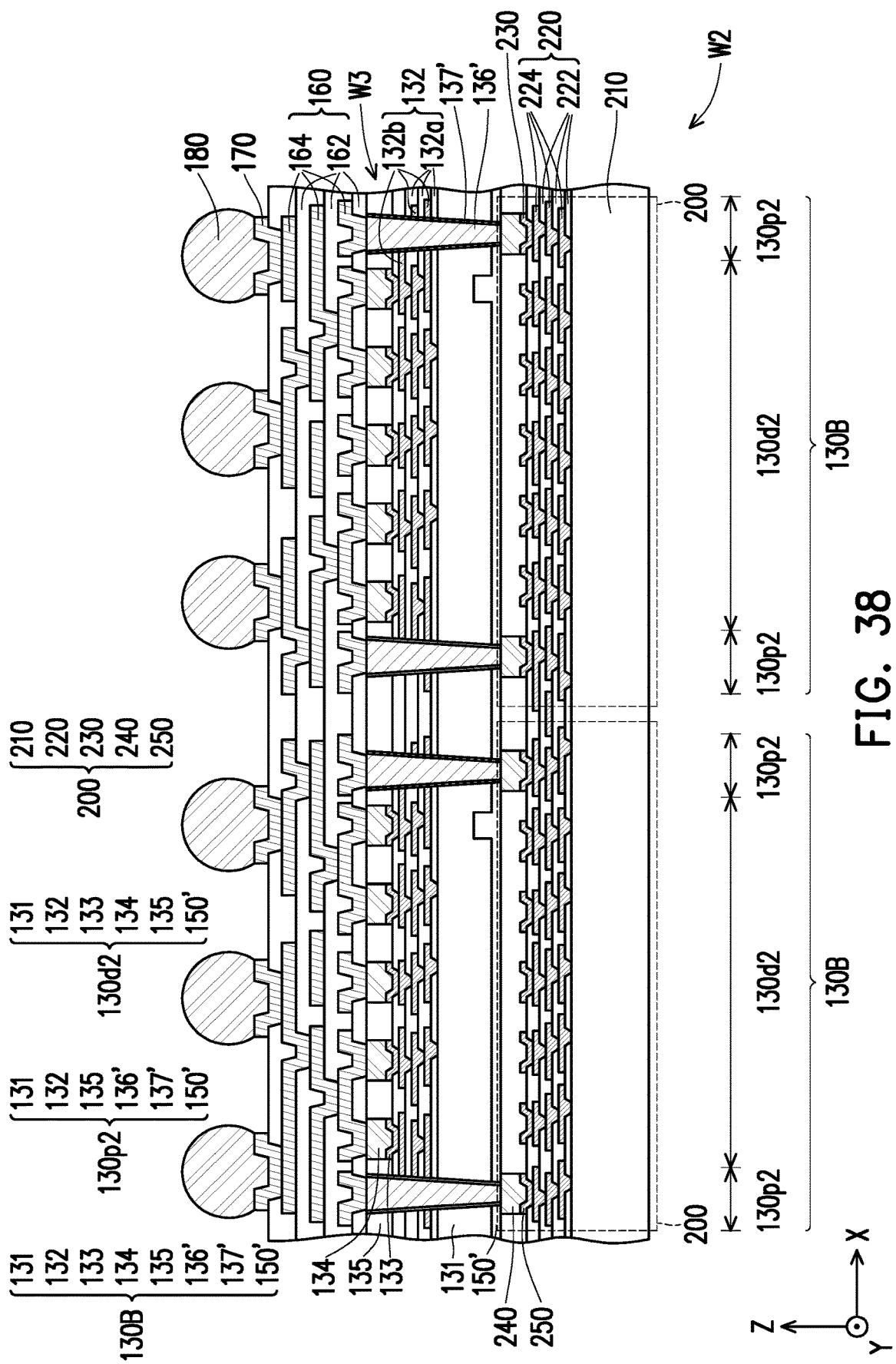
Figure 39:
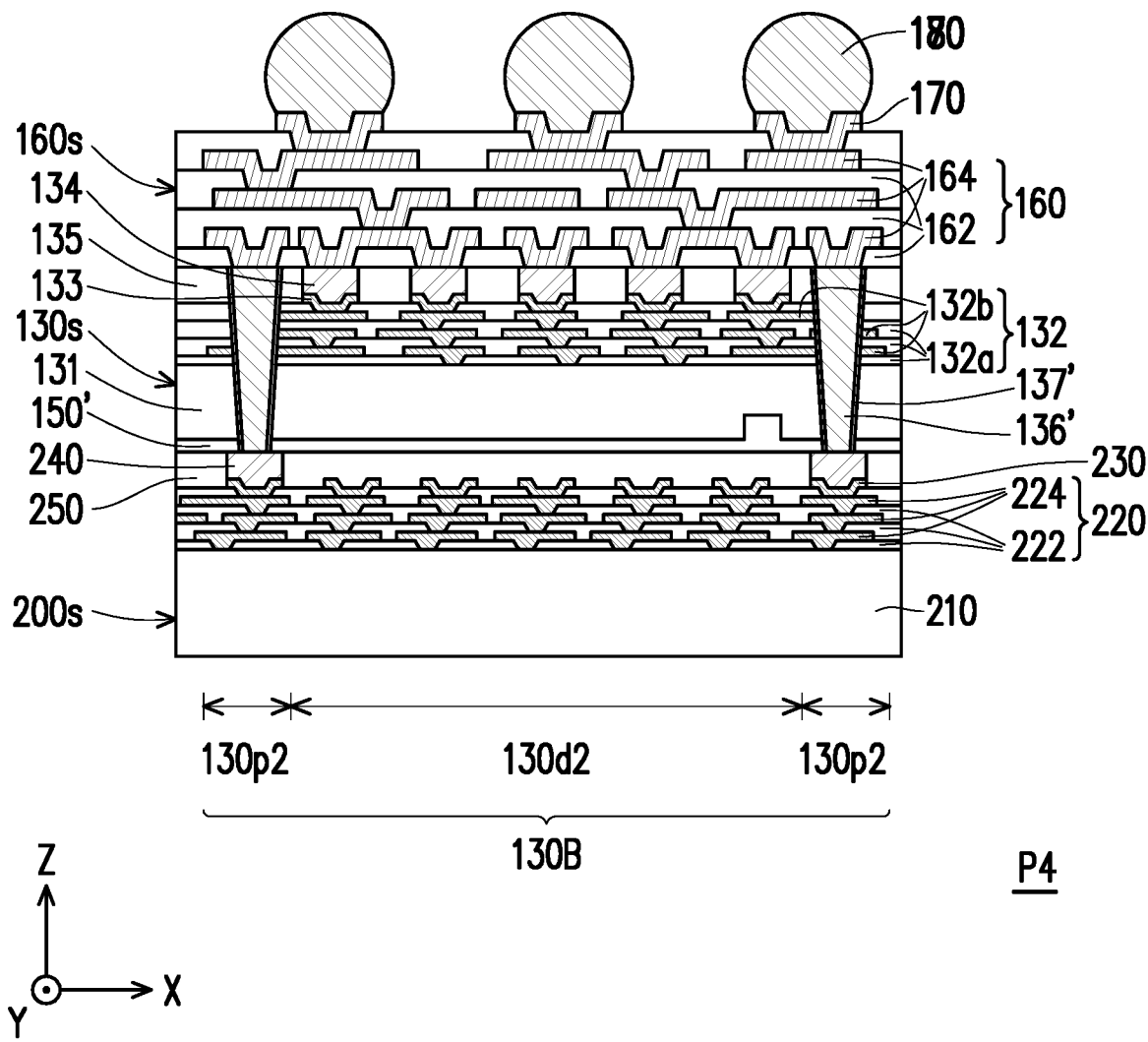

FIG. 34 through FIG. 39 are schematic cross-sectional views showing various stages in a manufacturing method of a semiconductor structure in accordance with some embodiments of the disclosure. A semiconductor structure P4 depicted in FIG. 39 is similar to the semiconductor structure P2 depicted in FIG. 28, the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 34, in some embodiments, a passivation layer 150' is formed by performing a planarizing process to form a plurality of integrated circuit components 130B' in the wafer W3, following the process as described in FIG. 20. The details of the wafer W3 and the integrated circuit components 130B' and the planarizing process have been described in FIG. 21, and thus are not repeated herein. Referring to FIG. 35, in some embodiments, the structure depicted in FIG. 34 is flipped upside down and placed onto a holding device TP4, and another planarizing process is performed to form a thinned semiconductor substrate 420a by removing a portion the semiconductor substrate 420. The planarizing processes may be the same or similar to the planarizing process as described in FIG. 22, and thus are omitted for brevity. The holding device TP4 may be the same or similar to the holding device TP1, and thus is not repeated herein.

Figure 36:
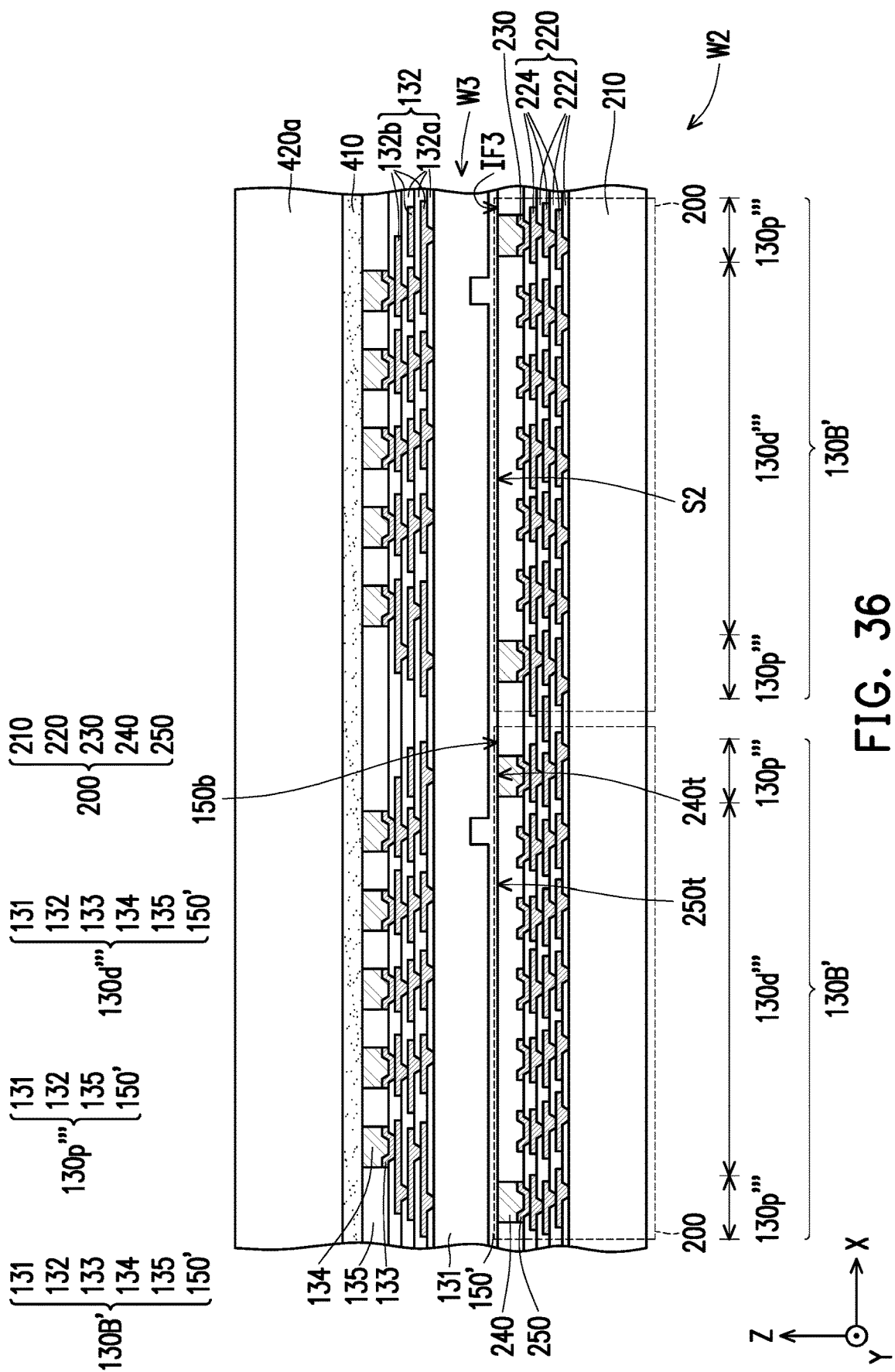

Referring to FIG. 36, in some embodiments, the wafer W3 is placed over a wafer W2, and a hybrid bonding process is performed to bond the wafer W3 to the wafer W2. The details of the wafer W2 and the integrated circuit components 200 have been described in FIG. 9, and thus are not repeated herein. In some embodiments, the wafer W3 (e.g. the integrated circuit components 130B') is hybrid bonded to the wafer W2 (e.g., the integrated circuit components 200) with the bonding interface IF3 (e.g. a hybrid bonding interface). For example, the protection layer 250 and the passivation layer 150' are bonded together through a direct dielectrics-to-dielectrics bonding, and the connecting vias 240 and the passivation layer 150' are bonded together through a directly dielectric-to-metal bonding.

Referring to FIG. 37, in some embodiments, a planarizing process is performed on the wafer W3 to remove the bonding layer 410 and the thinned semiconductor substrate 420a disposed thereon and expose the integrated circuit components 130B'. Thereafter, as shown in FIG. 35 and FIG. 36, for example, the conductive vias 136' and the liners 137' are formed in each of through holes formed in the periphery portions 130p'" to form integrated circuit components 130B. The details of the conductive vias 136', the liners 137' and the integrated circuit components 130B and the forming processes thereof have been described in FIG. 26, and thus are not repeated herein. For example, the TSVs 136' of the wafer W3 is connected to the connecting vias 240 of the wafer W2.

Referring to FIG. 38, in some embodiments, a redistribution circuit structure 160, a plurality of under-ball metallurgy (UBM) patterns 170 and a plurality of conductive elements 180 are sequentially formed on the wafer W3 and over the wafer W2. The formations and materials of the redistribution circuit structure 160, the UBM patterns 170 and the conductive balls 180 have been described in FIG. 27, and thus are not repeated herein. For example, the redistribution circuit structure 160 is electrically connected to the device portions 130d2 of the integrated circuit components 130B through the connecting vias 134, is electrically connected to the periphery portions 130p2 of the integrated circuit components 130B through the TSVs 136', and is electrically connected to the integrated circuit components 200 through the TSVs 136' of the periphery portions 130p2. Due to the integrated circuit component 130B and the redistribution circuit structure 160 are, for example, electrically connected to the integrated circuit component 200 through at least the periphery portion 130p2, the periphery portion 130p2 of the integrated circuit component 130B is a bridge for providing vertically electrical communications between the redistribution circuit structure 160 and the integrated circuit component 200 and between the integrated circuit component 130B and the integrated circuit component 200, and the semiconductor structure P4 is free of through-insulator-vias or through-interlayer-vias (TIVs), thereby reducing the manufacturing cost. Furthermore, the number of I/O counts of the semiconductor structure P4 is increased by increasing the size of the periphery portion 130p2, without reducing the size of the device portion 130d2.

Referring to FIG. 39, in some embodiments, a singulation (dicing) process is performed to cut the structure depicted in FIG. 38 into individual and separate semiconductor structures P4. In one embodiment, the singulation (dicing) process is a wafer dicing process or a wafer singulation process including mechanical sawing or laser cutting. Up to here, the semiconductor structure P4 is manufactured. The semiconductor structure P4 depicted in FIG. 39 is similar to the semiconductor structure P2 depicted in FIG. 28, the difference is that, the semiconductor structure P4 includes no insulating encapsulation 140 laterally encapsulating the integrated circuit component 130B and over the integrated circuit component 200. That is, in the semiconductor structure P4 as shown in FIG. 39, for example, a sidewall 130s of the integrated circuit component 130B is substantially aligned with and substantially coplanar to the sidewall 160s of the redistribution circuit structure 160 and the sidewall 200s of the integrated circuit component 200. Due to the integrated circuit component 130B (e.g., the sidewall of the semiconductor substrate 131) and the integrated circuit component 200 exposed to the external environment, the semiconductor structure P4 is capable of having further better heat dissipating performance.

In the above embodiments, the device portion 130d1 of each integrated circuit component 130A or the device portion 130d2 of each integrated circuit component 130B are connected to the periphery portion 130p1 of each integrated circuit component 130A or the periphery portion 130p2 of each integrated circuit component 130B, however the disclosure is not limited thereto. In some alternative embodiments, the device portion 130d1 of each integrated circuit component 130A or the device portion 130d2 of each integrated circuit component 130B are separated from the periphery portion 130p1 of each integrated circuit component 130A or the periphery portion 130p2 of each integrated circuit component 130B.

FIG. 40 through FIG. 43 are schematic cross-sectional views showing various stages in a manufacturing method of a semiconductor structure in accordance with some embodiments of the disclosure. FIG. 44 is a schematic top view illustrating a relative position between a semiconductor die and through silicon vias of a semiconductor structure in accordance with some embodiments of the disclosure, where FIG. 40 through FIG. 43 are the schematic cross-sectional views taken along a cross-sectional line II-II depicted in FIG. 44. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 40:
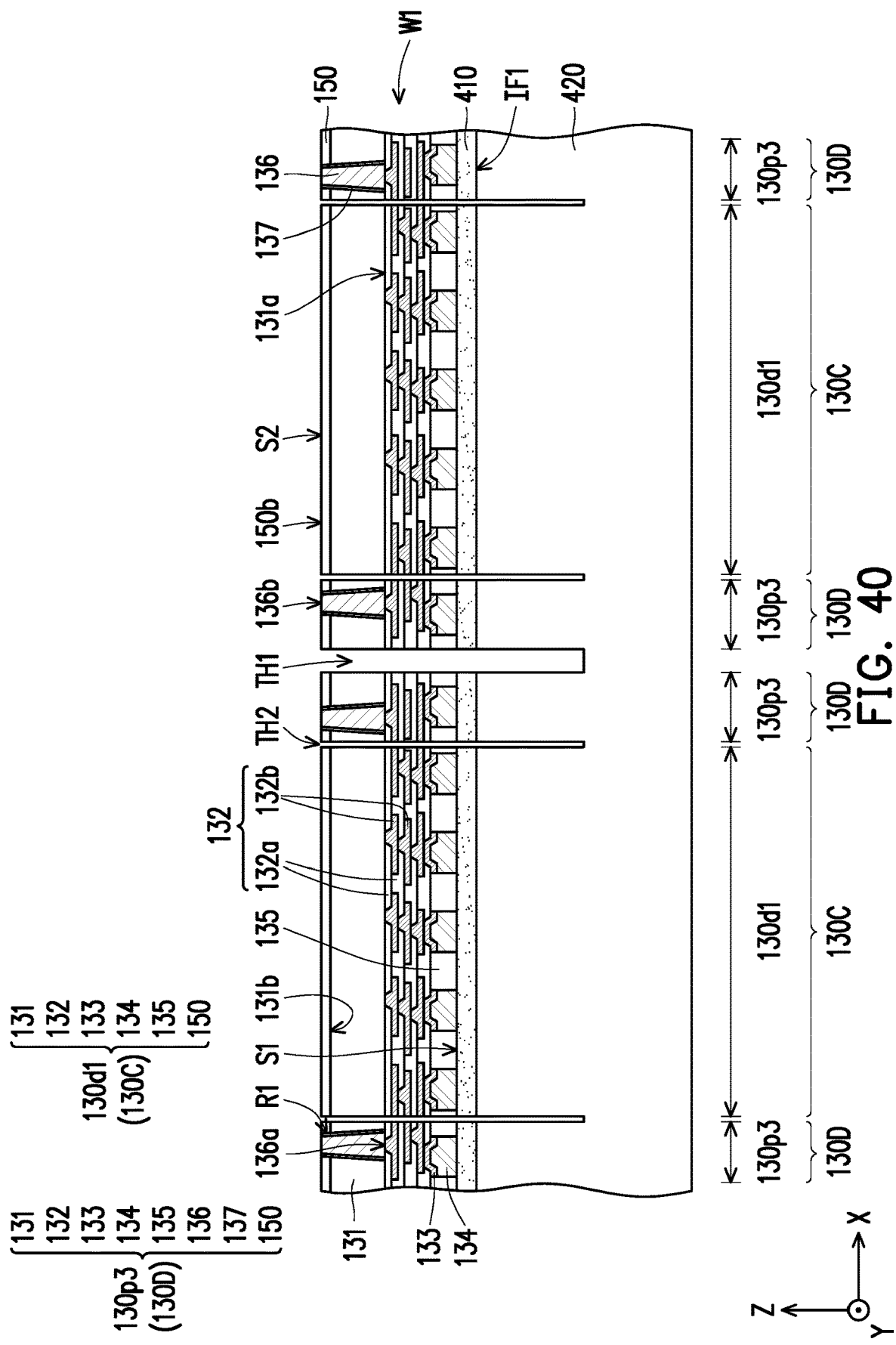
FIG. 40 through FIG. 43 are schematic cross-sectional views showing various stages in a manufacturing method of a semiconductor structure in accordance with some embodiments of the disclosure.

Referring to FIG. 40, in some embodiments, a pre-dicing (or pre-singulation) process is performed, following the process as described in FIG. 6. For example, the pre-dicing process is performed to cut through the wafer W1, the bonding layer 410 and a portion of the semiconductor substrate 420 and form trenches TH1 and through trenches TH2. The pre-dicing process may be a wafer dicing process, which may include mechanical blade sawing or laser cutting, the disclosure is not limited thereto. As shown in FIG. 40, the trenches TH1 each separate two adjacent integrated circuit components 130D, and the trenches TH2 each separate two adjacent integrated circuit components 130C and 130D, for example. The size and depth of the trenches TH1 may be the same as the size and depth of the trenches TH2. Alternative, the size and depth of the trenches TH1 may be different from the size and depth of the trenches TH2. The integrated circuit components 130C may be referred to as a semiconductor device, such as a semiconductor chip or die; and the integrated circuit components 130D may be referred to as a connection device providing routing function, such as a bridge.

In some embodiments, each of the integrated circuit components 130C is the device portion 130d1 of the integrated circuit components 130A, where the integrated circuit components 130C each include the semiconductor substrate 131, the interconnect structure 132, the connecting pads 133, the connecting vias 134, the protection layer 135 and the passivation layer 150, and provides functions including memory structures (e.g., a memory cell), processing structures (e.g., a logic cell), or the like. In some embodiments, each of the integrated circuit components 130D is a periphery portion 130p3, where the integrated circuit components 130D each include the semiconductor substrate 131, the interconnect structure 132, the connecting pads 133, the connecting vias 134, the protection layer 135, the TSVs 136, the liners 137 and the passivation layer 150, and provides functions including input/output (I/O) circuitry (e.g. an I/O cell) or the like. The periphery portions 130p3 may be referred to as a connecting bridge providing routing function.

Figure 41:
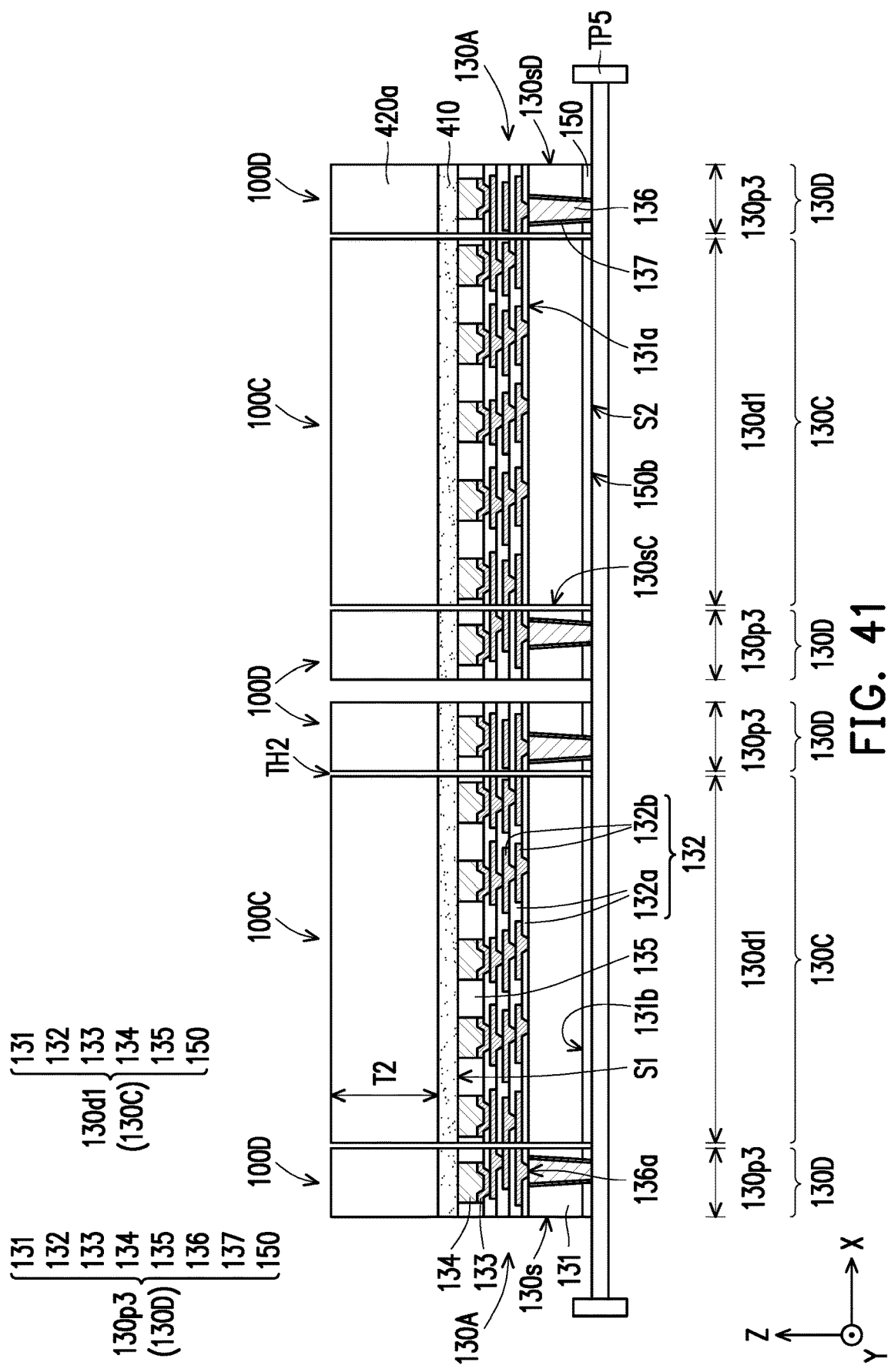

Referring to FIG. 41, in some embodiments, a planarizing process is performed on the structure depicted in FIG. 40 to remove an un-cut portion of the semiconductor substrate 420, thereby forming a plurality of semiconductor components 100C and semiconductor components 100D separated from one another. For example, each semiconductor component 100C includes one integrated circuit component 130C with the bonding layer 410 and a thinned semiconductor substrate 420a overlying thereto. For example, each semiconductor component 100D includes one integrated circuit component 130D with the bonding layer 410 and a thinned semiconductor substrate 420a overlying thereto. The thickness T2 of the thinned semiconductor substrate 420a is less than the thinness T1 of the semiconductor substrate 420, in some embodiments. The planarizing process has been described in FIG. 8, and thus is omitted for brevity. In some embodiments, prior to the planarizing process, the holding device TP5 is adopted to secure the structure depicted in FIG. 41 for preventing any damages to the integrated circuit components 130C and 130D by planarizing or any other subsequent process(es). The holding device TP5 may be the same as the holding device TP1 as described in FIG. 8, and thus is not repeated herein. In some embodiments, prior to the planarizing process, the integrated circuit components 130C and 130D being interconnected are tested for functionality and performance by probing, and only known good dies (KGDs) from the tested integrated circuit components 130C and 130D are selected and used for subsequently processing.

Figure 42:
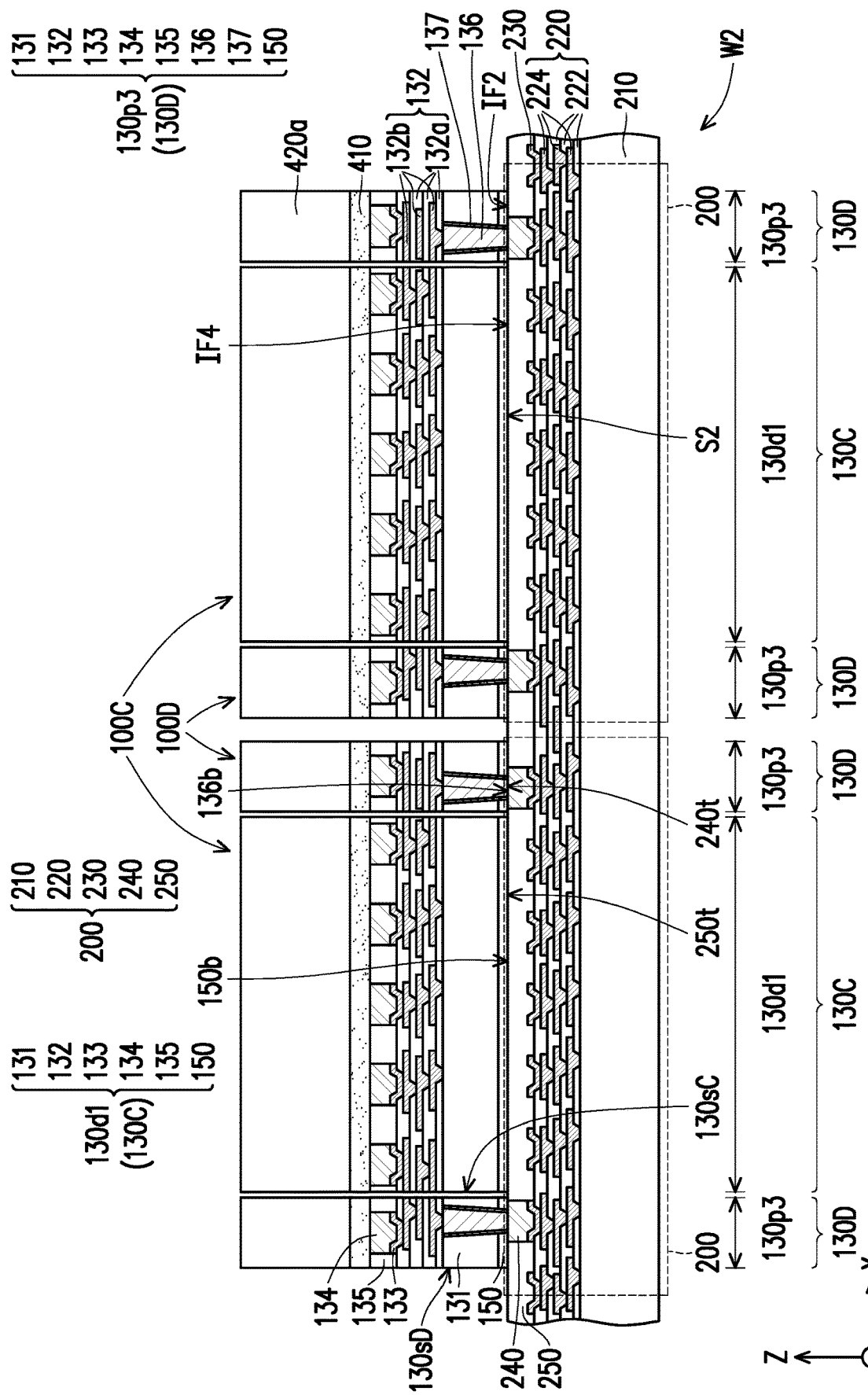

Referring to FIG. 42, in some embodiments, one or more than one semiconductor components 100C and one or more than one semiconductor components 100D are provided and bonded to a wafer W2 including integrated circuit components 200. For illustration purpose, only two semiconductor components 100C and four semiconductor components 100D are shown in FIG. 42, for example. However, the number of the semiconductor components 100C and 100D may be selected and designated based on the demand and/or design layout, the disclosure is not limited thereto. For example, the semiconductor components 100C and 100D are provided to be placed on the integrated circuit components 200 included in the wafer W2 for bonding by pick-and-place process. The details of the wafer W2 and the integrated circuit components 200 are described in FIG. 9, and thus are omitted for brevity.

It is appreciated that, each integrated circuit component 200 is bonded to one or more than one integrated circuit component 130B and one or more than one integrated circuit component 130D. For example, as shown in FIG. 42 and FIG. 44, each integrated circuit component 200 is boned to one integrated circuit component 130C and four integrated circuit components 130D, where the integrated circuit components 130D are respectively arranged in a manner of being parallel with and distant from edges of the integrated circuit component 130C. In some embodiments, the integrated circuit component 130C is separated from the integrated circuit components 130D with a spacing distance SP4 approximately ranging from 20 μm to 200 μm. In some embodiments, the integrated circuit components 130D are separated from one another with a spacing distance SP3 approximately ranging from 20 μm to 200 μm. Alternatively, the edges of the integrated circuit components 130D may be in contact with each other. Further alternatively, the edges of the integrated circuit component 130C may be in contact with the edges of the integrated circuit components 130D, in part or all.

In some embodiments, there is a bonding interface IF2 between the integrated circuit components 130D and the integrated circuit components 200 underlying thereto, and there is a bonding interface IF4 between the integrated circuit components 130C and the integrated circuit components underlying. For example, the TSVs 136 of the integrated circuit components 130D are bonded to the connecting vias 240 of the integrated circuit component 200 through a direct metal-to-metal bonding (e.g., a copper-to-copper bonding), and the passivation layers 150 of the integrated circuit components 130D are boned to the protection layer 250 of the integrated circuit component 200 through a direct dielectric-to-dielectric bonding (e.g., an oxide-to-nitride bonding). The bonding interface IF2 may be referred to as a hybrid bonding interface. It is appreciated that, the integrated circuit components 130D are electrically connected to the integrated circuit component 200 underlying thereto through the TSVs 136. For example, the passivation layers 150 of the integrated circuit components 130C are boned to the protection layer 250 of the integrated circuit component 200 through a direct dielectric-to-dielectric bonding (e.g., an oxide-to-nitride bonding). The bonding interface IF4 may be referred to as a fusion bonding interface.

In some embodiments, after bonding the integrated circuit components 130C and 130D to each of the integrated circuit components 200 included in the wafer W2, an insulating encapsulation 140, a redistribution circuit structure 160, a plurality of under-ball metallurgy (UBM) patterns 170 and a plurality of conductive elements 180 are sequentially formed on the integrated circuit components 130C, 130D and over the integrated circuit components 200 included in the wafer W2. The formations and materials of the insulating encapsulation 140, the redistribution circuit structure 160, the UBM patterns 170 and the conductive balls 180 have been described in FIG. 11 through FIG. 13, and thus are not repeated herein. In some embodiments, the periphery portions 130p3 are electrically connected to the device portions 130d1 through the redistribution circuit structure 160. Due to the integrated circuit components 130C (e.g. the device portions 130p1) and the redistribution circuit structure 160 are, for example, electrically connected to the integrated circuit components 200 through at least the integrated circuit components 130D (e.g. the periphery portions 130p3), the integrated circuit components 130D are bridges for providing vertically electrical communications between the redistribution circuit structure 160 and the integrated circuit component 200 and between the integrated circuit components 130C and the integrated circuit component 200, and the semiconductor structure P5 is free of through-insulator-vias or through-interlayer-vias (TIVs), thereby reducing the manufacturing cost. Furthermore, the number of I/O counts of the semiconductor structure P5 is increased by increasing the size and/or the number of the periphery portion 130p3 (e.g., the integrated circuit components 130D), without reducing the size of the device portion 130d1 (e.g., the integrated circuit components 130C). That is, due to the presence of the integrated circuit components 130D, more I/O counts is provided for the integrated circuit component 130C, without reducing an area of the integrated circuit component 130C.

Referring to FIG. 43, in some embodiments, a singulation (dicing) process is performed to cut through the redistribution circuit structure 160, the insulating encapsulation 140, the wafer W2 to form individual and separate semiconductor structures P5. In one embodiment, the singulation (dicing) process is a wafer dicing process or a wafer singulation process including mechanical sawing or laser cutting. Up to here, the semiconductor structure P5 is manufactured. The semiconductor structure P5 depicted in FIG. 43 is similar to the semiconductor structure P1 depicted in FIG. 14, the difference is that, the semiconductor structure P5 includes multiple periphery portions 130p3, instead of the periphery portion 130p1. For example, the periphery portions 130p3 each independently include the connecting pads 133 and the connecting vias 134 to electrically connected to the redistribution circuit structure 160. In some embodiments, the periphery portions 130p3 are electrically independent from each other and independently provides routing functions for the device portion 130d1. Owing the periphery portions 130p3, the reliability of the semiconductor structure P5 in electrical performance is further ensured.

In some embodiments, through the conductive elements 180 and/or other additional connectors, the semiconductor structures P1 to P5 may be further mounted with a (semi-conductor) circuit substrate (e.g. an organic substrate with circuitry structure embedded therein, such as printed circuit board (PCB)), an interposer, an additional package, chips/dies or other electronic devices, to form a stacked semiconductor package structure, the disclosure is not limited thereto. For illustration, examples are provided as follows, but the disclosure is not limited thereto.

FIG. 45 is a schematic cross-sectional view of a semi-conductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 45, in some embodiments, a substrate 500 is provided, where the semiconductor structure P1 depicted in FIG. 14 is bonded on the substrate 500 to form a semiconductor package structure having a stacked structure.

In some embodiments, the substrate 500 includes contact pads 510, contact pads 520, metallization layers 530, and vias (not shown). In some embodiments, the contact pads 510 and the contact pads 520 are respectively distributed on two opposite sides of the substrate 500 and are exposed for electrically connecting with later-formed elements/features. In some embodiments, the metallization layers 530 and the vias are embedded in the substrate 500 and together provide routing function for the substrate 500, where the metallization layers 530 and the vias are electrically connected to the contact pads 510 and the contact pads 520. That is, for example, at least some of the contact pads 510 are electrically connected to some of the contact pads 520 through the metallization layers 530 and the vias. The contact pads 510 and the contact pads 520 may include metal pads or metal alloy pads. For example, the materials of the metallization layers 530 and the vias are substantially the same or similar to the material of the patterned conductive layer 164, and thus are not repeated herein for simplicity.

In some embodiments, as shown in FIG. 45, the semi-conductor structure P1 depicted in FIG. 14 is mounted onto the substrate 500 through physically connecting the conductive element 180 and the contact pads 510 to form the semiconductor package structure having a stacked structure, where the semiconductor structure P1 is bonded to and electrically connected to the substrate 500. The detail of the semiconductor structure P1 is described in FIG. 1 through FIG. 14, and thus are not omitted herein. In some embodiments, the substrate 500 is referred to as a circuit substrate, such as an organic flexible substrate or a printed circuit board. In such embodiments, the conductive elements 180 are, for example, chip connectors or BGA balls.

In some embodiments, an underfill (not shown) may be applied to fill the gap between the semiconductor structure P1 and the substrate 500, which enhances the bonding strength between the semiconductor structure P1 and the substrate 500; thereby improving the reliability of the semi-conductor package structure depicted in FIG. 45.

In some embodiments, a plurality of conductive terminals 600 are respectively formed on the substrate 500. As shown in FIG. 45, for example, the conductive terminals 600 are connected to the contact pads 520 of the substrate 500. In other words, the conductive terminals 600 are electrically connected to the substrate 500 through the contact pads 520. Through the contact pads 510 and the contact pads 520, some of the conductive terminals 600 are electrically connected to the semiconductor structure P1 (e.g. the integrated circuit components 130A and 200 included therein). In some embodiments, the conductive terminals 600 are, for example, solder balls or BGA balls. In some embodiments, the semiconductor structure P1 is bonded to the substrate 500 through connecting the conductive terminals 180 and the contact pads 510 of the substrate 500 by flip chip bonding. However, the disclosure is not limited thereto; in an alternative embodiment, the conductive terminals 600 may be omitted.

Figure 46:
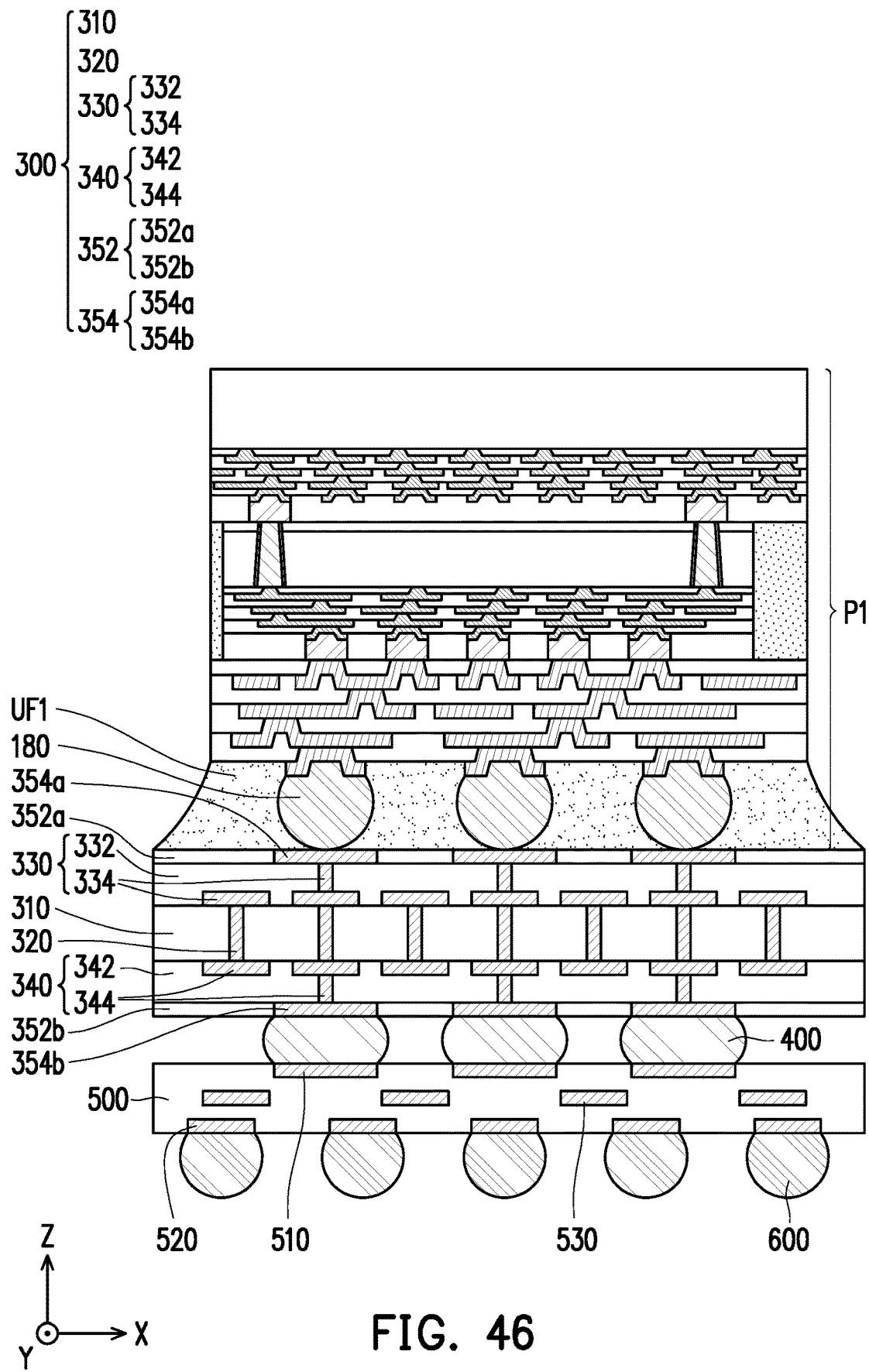
FIG. 46 is a schematic cross-sectional view of a semiconductor structure in accordance with some embodiments of the disclosure.

FIG. 46 is a schematic cross-sectional view of a semi-conductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 46, in some embodiments, a circuit element 300 is provided, where the semiconductor structure P1 depicted in FIG. 14 is bonded on the circuit element 300 mounted to the substrate 500 to form a semiconductor package structure having a stacked structure. The detail of the semiconductor structure P1 is described in FIG. 14, and the detail of the substrate 500 is described in FIG. 45, and thus are not repeated herein. In some embodiments, the circuit element 300 includes a core portion 310, a plurality of vias 320, redistribution circuit structures 330 and 340, a plurality of bonding pads 352 (e.g., 352a and 352b) and solder mask layers 354 (e.g., 354a and 354b).

In some embodiments, the core portion 310 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 320 is through silicon vias (TSVs) penetrating the core portions 310. The circuit element 300 is referred to as an interposer (see FIG. 46), in the disclosure.

In some embodiments, the redistribution circuit structure 330 and the redistribution circuit structure 340 respectively disposed on two opposite sides of the core portion 310, as shown in FIG. 46. In some embodiments, the redistribution circuit structure 330 and/or the redistribution circuit structure 340 are electrically connected to the vias 320 penetrating the core portion 310. As shown in FIG. 46, the core portion 310 with the vias 320 embedded therein is located between the redistribution circuit structure 330 and the redistribution circuit structure 340, in some embodiments. Through the vias 320, the redistribution circuit structure 330 and the redistribution circuit structure 340 are electrically connected to each other.

In some embodiments, the redistribution circuit structure 330 includes sequentially forming one or more dielectric layers 332 and one or more metallization layers 334 in alternation, where one metallization layer 334 is sandwiched between two dielectric layers 332. As shown in FIG. 46, portions of a top surface of a topmost layer of the metallization layers 334 are respectively exposed by openings formed in a topmost layer of the dielectric layers 332 for connecting with other conductive features, and portions of a bottom surface of a bottommost layer of the metallization layers 334 are respectively exposed by openings formed in a bottommost layer of the dielectric layers 332 for connecting with the vias 320. The numbers of the metallization layers and the dielectric layers included in the redistribution circuit structure 330 are not limited thereto, and may be designated and selected based on the demand.

In some embodiments, the redistribution circuit structure 340 includes sequentially forming one or more dielectric layers 342 and one or more metallization layers 344 in alternation, where one metallization layer 344 is sandwiched between two dielectric layers 342. As shown in FIG. 46, portions of a top surface of a topmost layer of the metallization layers 344 are respectively exposed by openings formed in a topmost layer of the dielectric layers 342 for connecting with the vias 320, and portions of a bottom surface of a bottommost layer of the metallization layers 344 are respectively exposed by openings formed in a bottommost layer of the dielectric layers 342 for connecting with other conductive features. The numbers of the metallization layers and the dielectric layers included in the redistribution circuit structure 340 are not limited thereto, and may be designated and selected based on the demand.

In certain embodiments, the materials of the dielectric layers 332 and the dielectric layers 342 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 332 and the dielectric layers 342 formed by suitable fabrication techniques such as spin-on coating, CVD, PECVD, or the like. The disclosure is not limited thereto. In one embodiment, the materials of the dielectric layers 332 and the dielectric layers 342 may be the same. In an alternative embodiment, the materials of the dielectric layers 332 and the dielectric layers 342 may be different.

In certain embodiments, the material of the metallization layers 334 and the metallization layers 344 may be made of conductive materials formed by electroplating or deposition, such as aluminum, titanium, copper, nickel, tungsten, and/or alloys thereof, which may be patterned using a photolithography and etching process. In some embodiments, the metallization layers 334 and the metallization layers 344 may be patterned copper layers or other suitable patterned metal layers. In one embodiment, the materials of the metallization layers 334 and the metallization layers 344 may be the same. In an alternative embodiment, the materials of the metallization layers 334 and the metallization layers 344 may be different.

In some embodiments, the bonding pads 354*a* are disposed on a surface of the redistribution circuit structure 330 and connected to the portions of the top surface of the topmost layer of the metallization layers 334 exposed by the openings formed in the topmost layer of the dielectric layers 332, where the bonding pads 354*a* are physically separated from each other through the solder mask layer 352*a* formed on the surface of the redistribution circuit structure 330 with the bonding pads 354*a* disposed thereon. Through the redistribution circuit structure 330, the bonding pads 354*a* are electrically connected to the vias 320 embedded in the core portion 310.

In some embodiments, the bonding pads 354*b* are disposed on a surface of the redistribution circuit structure 340 and connected to the portions of the bottom surface of the bottommost layer of the metallization layers 344 exposed by the openings formed in the bottommost layer of the dielectric layers 342, where the bonding pads 354*b* are physically separated from each other through the solder mask layer 352*b* formed on the surface of the redistribution circuit structure 340 with the bonding pads 354*b* disposed thereon. Through the redistribution circuit structure 340, the bonding pads 354*b* are electrically connected to the vias 320 embedded in the core portion 310.

As shown in FIG. 46, for example, the bonding pads 354*a* are electrically connected to the redistribution circuit structure 330 and the bonding pads 354*b* are electrically connected to the redistribution circuit structure 340. The bonding pads 354*a* and the bonding pads 354*b* may include UBM patterns, however the disclosure is not limited thereto. As shown in FIG. 46, the bonding pads 354*a* and the bonding pads 354*b* are electrically connected to each other though the vias 320, the redistribution circuit structure 330, and redistribution circuit structure 340, for example.

Alternatively, the redistribution circuit structure 330 and the redistribution circuit structure 340, one or both, may be omitted from the circuit element 300, the disclosure is not limited thereto. That is, the circuit element 300 may include the core portion 310, the plurality of vias 320, the plurality of bonding pads 352*a* and 352*b* and the solder mask layers 354*a* and 354*b*, where the bonding pads 354*a* and the bonding pads 354*b* are electrically connected to each other though the vias 320.

In some embodiments, a plurality of conductive terminals 400 are respectively formed on the bonding pads 354*b*. As shown in FIG. 46, for example, the conductive terminals 400 are electrically connected to the bonding pads 354*b*. In other words, the conductive terminals 400 are electrically connected to the circuit element 300 through the bonding pads 354*b*. Through the bonding pads 354*b*, some of the conductive terminals 400 are electrically connected to some of the bonding pads 354*a*. In some embodiments, the conductive terminals 400 are, for example, chip connectors or BGA balls.

Continued on FIG. 46, in some embodiments, the semiconductor structure P1 is connected to the circuit element 300 through connecting the conductive elements 180 and the bonding pads 354*a* of the circuit element 300, and the circuit element 300 is connected to the substrate 500 through connecting the conductive terminals 400 and the contact pads 510 of the substrate 500. In other words, the semiconductor structure P1 is electrically connected to the circuit element 300 through the conductive elements 180 and the bonding pads 354*a*, and the circuit element 300 is electrically connected to the substrate 500 through the conductive terminals 400 and the contact pads 510, so that the semiconductor structure P1 is electrically connected to the substrate 500 through the conductive elements 180, the bonding pads 354*a*, the conductive terminals 400 and the contact pads 510. In such embodiments, the conductive elements 180 are micro-bumps while the conductive terminals 400 are chip connectors, and the conductive terminals 600 are solder balls or BGA balls. In certain embodiments, the semiconductor package structure depicted in FIG. 46 may be formed by chip on wafer on substrate (CoWoS) packaging processes.

In some embodiments, an underfill UF1 is optimally formed on the circuit element 300. As shown in FIG. 46, for example, the underfill UF1 at least fills the gaps between the semiconductor structure P1 and the circuit element 300, and wraps sidewalls of the conductive elements 180. Alternatively, a sidewall of the semiconductor structure P1 may further covered by the underfill UF1, the disclosure is not limited thereto. The underfill UF1 may be any acceptable material, such as a polymer, epoxy, molding underfill, or the like, for example. The underfill UF1 may be formed by underfill dispensing or any other suitable method. Owing to the underfill UF1, the bonding strength between the semiconductor structure P1 and the circuit element 300 are enhanced, thereby improving the reliability of the package structure depicted FIG. 46.

Figure 47:
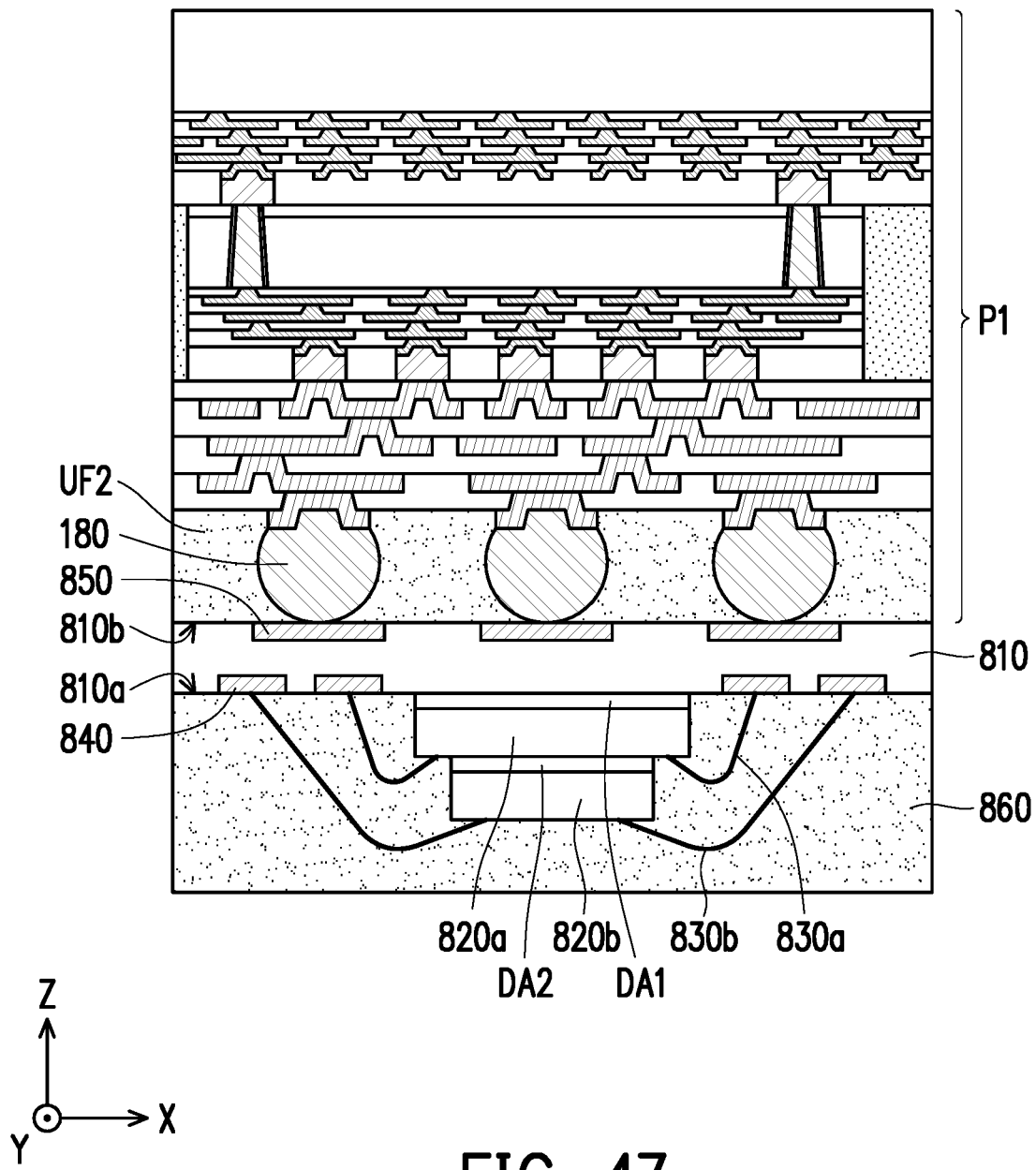
FIG. 47 is a schematic cross-sectional view of a semiconductor structure in accordance with some embodiments of the disclosure.

FIG. 47 is a schematic cross-sectional view of a semiconductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 47, in some embodiments, a package 800 is provided and bonded to the semiconductor structure P1 depicted in FIG. 14 to form the semiconductor package structure having a stacked structure. The detail of the semiconductor structure P1 is described in FIG. 14, and thus is not repeated herein. In some embodiments, the package 800 has a substrate 810, semiconductor dies 820a and 820b, bonding wires 830a and 830b, conductive pads 840, conductive pads 850, an insulating encapsulation 860, and the joining solder balls (not shown).

As shown in FIG. 47, for example, the semiconductor die 820a with a connecting film DA1 disposed thereon and the semiconductor die 820b with a connecting film DA2 are provided and are disposed on the substrate 810. In some embodiments, the connecting film DA1 is located between the semiconductor die 820a and the substrate 810, and the connecting film DA2 is located between the semiconductor die 820a and the semiconductor die 820b. In some embodiments, due to the connecting films DA1 and DA2 respectively provided between the semiconductor die 820a and the substrate 810 and between the semiconductor dies 820a and 820b, the semiconductor dies 820a, 820b are stably adhered to the substrate 810. The connecting films DA1, DA2 may be a die attach film, a layer made of adhesives or epoxy resin, or the like.

For example, the semiconductor dies 820a and 820b are mounted on one surface (e.g. a surface 810a) of the substrate 810. The semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820a and 820b are DRAM chips, as shown in FIG. 47, for example. In one embodiment, the semiconductor dies 820a and 820b may be the same. However, the disclosure is not limited thereto; in an alternative embodiment, the semiconductor dies 820a and 820b may be different from each other.

In some embodiments, the bonding wires 830a and 830b are respectively used to provide electrical connections between the semiconductor dies 820a, 820b and some of the conductive pads 840 (such as bonding pads) located on the surface 810a of the substrate 810. Owing to the bonding wires 830a and 830b, the semiconductor dies 820a and 820b are electrically connected to the substrate 810.

In some embodiments, the insulating encapsulation 860 is formed on the surface 810a of the substrate 810 to encapsulate the semiconductor dies 820a, 820b, the bonding wires 830a, 830b, and the conductive pads 840 to protect these components. In some embodiments, the materials of the insulating encapsulation 860 is the same as the insulating encapsulation 140, and thus is not repeated herein. In one embodiment, the materials of the insulating encapsulation 860 is different from the insulating encapsulation 140, the disclosure is not limited thereto.

In some embodiments, interconnects (not shown) or through vias (not shown) embedded in the substrate 810 may be used to provide electrical connection between the conductive pads 840 and the conductive pads 850 (such as bonding pads) that are located on another surface (e.g. a surface 810b opposite to the surface 810a) of the substrate 810. In certain embodiments, some of the conductive pads 850 are electrically connected to the semiconductor dies 820a and 820b through these through vias and/or interconnects (not shown) in addition to some of the conductive pads 840 and the bonding wires 830a, 830b.

In some embodiments, the conductive pads 850 of the package 800 are connected to the conductive elements 180 of the semiconductor structure P1, and the package 800 is electrically coupled to the semiconductor structure P1. In some embodiments, the redistribution circuit structure 160 is electrically connected to the substrate 810 of the package 800 through the conductive elements 180 and the conductive pads 850. In some embodiments, the semiconductor dies 820a, 820b are electrically communicated to the integrated circuit components 130A and 200 of the semiconductor structure P1.

In addition, as shown in FIG. 47, an underfill UF2 fills the gaps between the conductive elements 180 and the substrate 810, for example. In one embodiment, the formation and material of the underfill UF2 may be the same or similar to the formation of the material of the underfill UF1 described in FIG. 46, the disclosure is not limited thereto. Owing to the underfill UF2, a bonding strength between the semiconductor structure P1 and the package 800 are enhanced, thereby improving the reliability of the semiconductor structure depicted FIG. 47.

Additionally, the semiconductor structure P1 may be replaced with the semiconductor structure P2 depicted in FIG. 28, the semiconductor structure P3 depicted in FIG. 33, the semiconductor structure P4 depicted in FIG. 39 and the semiconductor structure P5 depicted in FIG. 43, the disclose is not limited thereto.

In accordance with some embodiments, a semiconductor structure includes a first semiconductor device, a second semiconductor device, a connection device and a redistribution circuit structure. The first semiconductor device is bonded on the second semiconductor device. The connection device is bonded on the second semiconductor device and arranged aside of the first semiconductor device, wherein the connection device includes a first substrate and conductive vias penetrating through the first substrate and electrically connected to the second semiconductor device. The redistribution circuit structure is located over the second semiconductor device, wherein the first semiconductor device and the connection device are located between the redistribution circuit structure and the second semiconductor device. The redistribution circuit structure and the first semiconductor device are electrically connected to the second semiconductor device through the conductive vias of the connection device.

In accordance with some embodiments, semiconductor structure includes a first integrated circuit component, a second integrated circuit component, a redistribution circuit structure and conductive terminals. The first integrated circuit component includes a device portion and at least one bridge portion having a plurality of through silicon vias, wherein the device portion is aside of the at least one bridge portion. The second integrated circuit component is boned to the first integrated circuit component, wherein the device portion is electrically connected to the second integrated circuit component through the at least one bridge portion. The redistribution circuit structure is located on and connected to the first integrated circuit component, wherein the redistribution circuit structure is electrically connected to the second integrated circuit component through the first integrated circuit component. The conductive terminals are located on and connecting to the redistribution circuit structure, wherein the redistribution circuit structure is located between the first integrated circuit component and the conductive terminals.

In accordance with some embodiments, a method of manufacturing a semiconductor structure includes the following steps, providing a first integrated circuit component comprising a device portion and a bridge portion aside of the device portion, the bridge portion having through silicon vias; providing a wafer including a plurality of second integrated circuit components interconnected to each other; hybrid bonding the first integrated circuit component to one of the plurality of second integrated circuit components to electrically connect the bridge portion and the one of the plurality of second integrated circuit components via the through silicon vias, the device portion being electrically connected to the one of the plurality of second integrated circuit components through the bridge portion; forming a redistribution circuit structure on the first integrated circuit component to electrically connect the redistribution circuit structure and the first integrated circuit component, and the redistribution circuit structure being electrically connected to the one of the plurality of second integrated circuit components through at least the bridge portion; disposing conductive terminals on the redistribution circuit component, the redistribution circuit structure being located between the first integrated circuit structure and the conductive terminals; and dicing the wafer to form the semiconductor structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
    a first semiconductor device and a second semiconductor device, wherein the first semiconductor device is bonded on the second semiconductor device, and a backside of the first semiconductor device is in contact with a frontside of the second semiconductor device;
    a connection device, bonded on the second semiconductor device and arranged aside of the first semiconductor device, wherein the connection device comprises a first substrate, a first interconnect structure disposed on the first substrate and conductive vias penetrating through the first substrate and electrically connected to the second semiconductor device; and
    a redistribution circuit structure, located over the second semiconductor device, wherein the first semiconductor device and the connection device are located between the redistribution circuit structure and the second semiconductor device, wherein the first interconnect structure of the connection device is disposed between the redistribution circuit structure and the conductive vias of the connection device,
    wherein the redistribution circuit structure and the first semiconductor device are electrically connected to the second semiconductor device through the conductive vias of the connection device.

2. The semiconductor structure of claim 1, wherein the connection device and the first semiconductor device are an integral piece, and the connection device is joined to the first semiconductor device.

3. The semiconductor structure of claim 2, wherein a shape of the connection device is a closed, continuous frame shape laterally surrounding the first semiconductor device.

4. The semiconductor structure of claim 2, further comprising an insulating encapsulation laterally encapsulating the first semiconductor device and the connection device, wherein the insulating encapsulation is located between the second semiconductor device and the redistribution circuit structure, and
    wherein the first semiconductor device is separated from the insulating encapsulation by the connection device, and the conductive vias are separated from the insulating encapsulation by the first substrate.

5. The semiconductor structure of claim 2, wherein:
    the connection device further comprises:
        the first interconnect structure, located on a first surface of the first substrate and electrically connected to the conductive vias, wherein the conductive vias penetrate through the first substrate by extending from the first surface toward a second surface of the first substrate, and the first surface is opposite to the second surface, wherein a first end surface of each of the conductive vias is substantially coplanar to the first surface of the first substrate, and a second end surface of each of the conductive vias is protruded out of the second surface, and
    the first semiconductor device comprises:
        a second substrate;
        a second interconnect structure, located on the second substrate and electrically connected to the first interconnect structure; and
        connecting vias, located on and electrically connected to the second interconnect structure, wherein the first interconnect structure is electrically connected to the redistribution circuit structure through the second interconnect structure and the connecting vias,
    wherein the connection device is electrically connected to the first semiconductor device through the first interconnect structure and the second interconnect structure, and is electrically connected to the redistribution circuit structure through the first semiconductor device.

6. The semiconductor structure of claim 2, wherein:
    the connection device further comprises:
        the first interconnect structure, located on the first substrate, wherein the conductive vias penetrate through the first substrate and the first interconnect structure by extending from first interconnect structure toward the first substrate, wherein a first end surface of each of the conductive vias is substantially coplanar to a surface of the first interconnect structure away from the first substrate, and a second end surface of each of the conductive vias is protruded out of a surface of the first substrate away from the first interconnect structure, wherein the connection device is electrically connected to the redistribution circuit structure through the conductive vias, and the first semiconductor device comprises:
- a second substrate, having semiconductor devices formed therein;
- a second interconnect structure, located on the second substrate and electrically connected to the semiconductor devices and the first interconnect structure; and
- connecting vias, located on and electrically connected to the second interconnect structure, wherein the first interconnect structure is electrically connected to the redistribution circuit structure through the second interconnect structure and the connecting vias,
- wherein the connection device is electrically connected to the first semiconductor device through the redistribution circuit structure.

7. The semiconductor structure of claim 1, wherein the connection device comprises a plurality of connection devices distant from the first semiconductor device.

8. The semiconductor structure of claim 7, wherein the plurality of connection devices are arranged into a pattern laterally surrounding a perimeter of the first semiconductor device.

9. The semiconductor structure of claim 7, further comprising an insulating encapsulation laterally encapsulating the first semiconductor device and the plurality of connection devices, wherein the insulating encapsulation is located between the second semiconductor device and the redistribution circuit structure, and
- wherein the first semiconductor device is separated from the plurality of connection devices by the insulating encapsulation, and the conductive vias are separated from the insulating encapsulation by the first substrate.

10. The semiconductor structure of claim 7, wherein:
each of the plurality of connection devices further comprises:
- the first interconnect structure, located on a first surface of the first substrate and electrically connected to the conductive vias, wherein the conductive vias penetrate through the first substrate by extending from the first surface toward a second surface of the first substrate, and the first surface is opposite to the second surface, wherein a first end surface of each of the conductive vias is substantially coplanar to the first surface of the first substrate, and a second end surface of each of the conductive vias is protruded out of the second surface; and
- a plurality of first connecting vias, located on and electrically connected to the first interconnect structure, wherein the connection device is electrically connected to the redistribution circuit structure through the first interconnect structure and the plurality of first connecting vias, and the first semiconductor device comprises:
- a second substrate, having semiconductor devices formed therein;
- a second interconnect structure, located on the second substrate and electrically connected to the semiconductor devices; and
- a plurality of second connecting vias, located on and electrically connected to the second interconnect structure, wherein the first semiconductor device is electrically connected to the redistribution circuit structure through the second interconnect structure and the plurality of second connecting vias, and
- wherein the connection device is electrically connected to the first semiconductor device through the redistribution circuit structure.

11. The semiconductor structure of claim 7, wherein:
each of the plurality of connection devices further comprises:
- the first interconnect structure, located on the first substrate, wherein the conductive vias penetrate through the first substrate and the first interconnect structure by extending from first interconnect structure toward the first substrate, wherein a first end surface of each of the conductive vias is substantially coplanar to a surface of the first interconnect structure away from the first substrate, and a second end surface of each of the conductive vias is protruded out of a surface of the first substrate away from the first interconnect structure, wherein the connection device is electrically connected to the redistribution circuit structure through the conductive vias, and the first semiconductor device comprises:
- a second substrate, having semiconductor devices formed therein;
- a second interconnect structure, located on the second substrate and electrically connected to the semiconductor devices; and
- connecting vias, located on and electrically connected to the second interconnect structure, wherein the first interconnect structure is electrically connected to the redistribution circuit structure through the second interconnect structure and the connecting vias,
- wherein the connection device is electrically connected to the first semiconductor device through the redistribution circuit structure.

12. A semiconductor structure, comprising:
- a first integrated circuit component comprising:
  - a device portion; and
  - at least one bridge portion having a plurality of through silicon vias, wherein the device portion is aside of the at least one bridge portion;
- a second integrated circuit component, bonded to the first integrated circuit component by directly connecting a backside of the first integrated circuit component and a frontside of the second integrated circuit component, wherein the device portion is electrically connected to the second integrated circuit component through the at least one bridge portion;
- a redistribution circuit structure, located on and connected to the first integrated circuit component, wherein the redistribution circuit structure is electrically connected to the second integrated circuit component through the first integrated circuit component; and
- conductive terminals, located on and connecting to the redistribution circuit structure, wherein the redistribution circuit structure is located between the first integrated circuit component and the conductive terminals.

13. The semiconductor structure of claim 12, wherein a sidewall of the first integrated circuit component, a sidewall of the second integrated circuit component and a sidewall of the redistribution circuit structure are substantially aligned to each other.

14. The semiconductor structure of claim 12, further comprising an insulating encapsulation laterally encapsulating the first integrated circuit component, wherein a sidewall of the insulating encapsulation, a sidewall of the second integrated circuit component and a sidewall of the redistribution circuit structure are substantially aligned to each other.

15. The semiconductor structure of claim 12, wherein the at least one bridge portion is joined to the device portion.

16. The semiconductor structure of claim 12, wherein the at least one bridge portion is separated from the device portion.

17. The semiconductor structure of claim 12, further comprising:
a circuit substrate, located over the redistribution circuit structure and being electrically connected to the redistribution circuit structure through the conductive terminals,
wherein the circuit substrate is electrically connected to the first integrated circuit component through the redistribution circuit structure and is electrically connected to the second integrated circuit component through the redistribution circuit structure and the first integrated circuit component.

18. A method of manufacturing semiconductor structure, comprising:
a providing a first integrated circuit component comprising a device portion and at least one bridge portion aside of the device portion, the at least one bridge portion having through silicon vias;
providing a wafer including a plurality of second integrated circuit components interconnected to each other;
bonding the first integrated circuit component to one of the plurality of second integrated circuit components by directly connecting a backside of the first integrated circuit component and a frontside of the one of the second integrated circuit component to electrically connect the at least one bridge portion and the one of the plurality of second integrated circuit components via the through silicon vias, the device portion being electrically connected to the one of the plurality of second integrated circuit components through the at least one bridge portion;
forming a redistribution circuit structure on the first integrated circuit component to electrically connect the redistribution circuit structure and the first integrated circuit component, and the redistribution circuit structure being electrically connected to the one of the plurality of second integrated circuit components through at least the first integrated circuit component;
disposing conductive terminals on the redistribution circuit structure, the conductive terminals being connected to the redistribution circuit structure, and the redistribution circuit structure being located between the first integrated circuit component and the conductive terminals; and
dicing the wafer to form the semiconductor structure.

19. The method of claim 18, wherein:
providing the first integrated circuit component comprises providing a wafer including a plurality of first integrated circuit components, wherein the device portions and the at least one bridge portions of the plurality of first integrated circuit components are interconnected to each other,
wherein in the semiconductor structure, a sidewall of the first integrated circuit component, a sidewall of the second integrated circuit component and a sidewall of the redistribution circuit structure are substantially aligned to each other.

20. The method of claim 18, after bonding the first integrated circuit component to the second integrated circuit component and prior to forming the redistribution circuit structure, further comprising:
laterally encapsulating the device portion and the at least one bridge portion of the first integrated circuit component in an insulating encapsulation,
wherein in the semiconductor structure, a sidewall of the insulating encapsulation, a sidewall of the second integrated circuit component and a sidewall of the redistribution circuit structure are substantially aligned to each other.

* * * * *